(12) United States Patent
Kobayashi

(10) Patent No.: US 11,064,139 B2
(45) Date of Patent: Jul. 13, 2021

(54) IMAGING DEVICE

(71) Applicant: Panasonic Intellectual Property Management Co., Ltd., Osaka (JP)

(72) Inventor: Tsutomu Kobayashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 115 days.

(21) Appl. No.: 16/663,342

(22) Filed: Oct. 25, 2019

(65) Prior Publication Data

US 2020/0213541 A1    Jul. 2, 2020

(30) Foreign Application Priority Data

Dec. 26, 2018  (JP) .............................. JP2018-243344

(51) Int. Cl.
  *H04N 5/357* (2011.01)
  *H04N 5/369* (2011.01)
  *H01L 27/146* (2006.01)

(52) U.S. Cl.
  CPC ....... *H04N 5/357* (2013.01); *H01L 27/14612* (2013.01); *H01L 27/14636* (2013.01); *H04N 5/379* (2018.08)

(58) Field of Classification Search
  CPC .. H04N 5/357; H04N 5/379; H01L 27/14612; H01L 27/14636; H01L 27/14665
  See application file for complete search history.

(56) References Cited

U.S. PATENT DOCUMENTS

| | | | |
|---|---|---|---|
| 2009/0179293 A1 | 7/2009 | Shim et al. | |
| 2013/0162622 A1* | 6/2013 | Ebisuno | G09G 3/3208 345/212 |
| 2015/0062396 A1 | 3/2015 | Yamaoka | |
| 2016/0233287 A1* | 8/2016 | Jang | H01L 27/3276 |

FOREIGN PATENT DOCUMENTS

| | | |
|---|---|---|
| JP | 2009-164604 | 7/2009 |
| JP | 2012-004689 | 1/2012 |
| JP | 2015-050478 | 3/2015 |
| JP | 2016-127265 | 7/2016 |
| JP | 2017-027078 | 2/2017 |

* cited by examiner

*Primary Examiner* — Lin Ye
*Assistant Examiner* — John H Morehead, III
(74) *Attorney, Agent, or Firm* — McDermott Will and Emery LLP

(57) ABSTRACT

An imaging device includes a plurality of pixels arranged in a matrix, a first signal line connected to the first pixel; a second signal line connected to the second pixel; and a power-supply line connected to at least one of the plurality of pixels. The plurality of pixels includes a first pixel and a second pixel that are located in a same column. Two or more voltages that differ from each other are applied to the power-supply line. When a distance between the power-supply line and the first signal line is denoted by d1, and a distance between the power-supply line and the second signal line is denoted by d2, d1<d2 is satisfied in a first cross-section that is orthogonal to a column direction, and d1>d2 is satisfied in a second cross-section that is orthogonal to the column direction and that is different from the first cross-section.

15 Claims, 45 Drawing Sheets

IMAGING DEVICE

BACKGROUND

1. Technical Field

The present disclosure relates to imaging devices.

2. Description of the Related Art

Heretofore, the so-called stacked-type imaging devices are known in which a photoelectric conversion layer is arranged on or above a semiconductor substrate. In the stacked-type imaging devices, charge generated by photoelectric conversion is temporarily accumulated, for example, in a diffusion region or the like, formed in a semiconductor substrate, as signal charge. Signals corresponding to the amount of the accumulated charge are read via a reading circuit formed on the semiconductor substrate.

For example, Japanese Unexamined Patent Application Publication No. 2016-127265 discloses a stacked-type imaging device in which a plurality of pixels is arranged in a matrix. The imaging device disclosed in Japanese Unexamined Patent Application Publication No. 2016-127265 includes signal lines and power-supply lines arranged in a column direction and a row direction of the of pixels.

SUMMARY

One non-limiting and exemplary embodiment provides an imaging device in which noise is reduced.

In one general aspect, the techniques disclosed here feature an imaging device including: a plurality of pixels arranged in a matrix, the plurality of pixels including a first pixel and a second pixel that are located in a same column; a first signal line connected to the first pixel; a second signal line connected to the second pixel; and a power-supply line connected to at least one of the plurality of pixels, two or more voltages that differ from each other being applied to the power-supply line. When a distance between the power-supply line and the first signal line is denoted by d1, and a distance between the power-supply line and the second signal line is denoted by d2, d1<d2 is satisfied in a first cross-section that is orthogonal to a column direction, and d1>d2 is satisfied in a second cross-section that is orthogonal to the column direction and that is different from the first cross-section.

According to the present disclosure, it is possible to provide an imaging device in which noise is reduced.

It should be noted that general or specific embodiments may be implemented as an element, a device, a module, a system, or a method. It should also be noted that general or specific embodiments may be implemented as any selective combination of an element, a device, an apparatus, a module, a system, and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
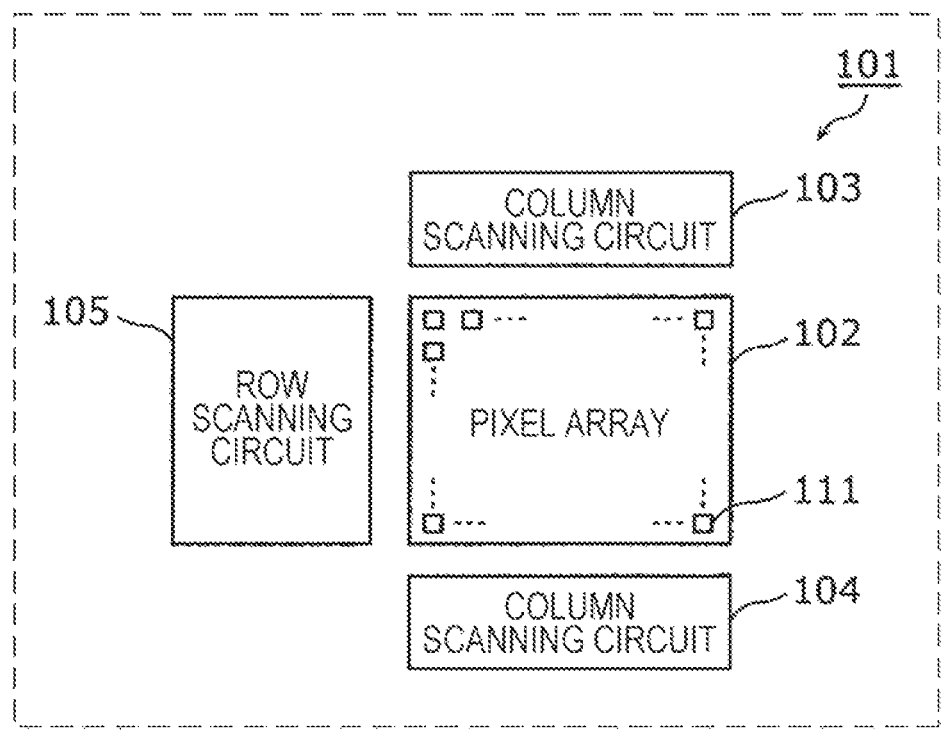
FIG. 1 is a block diagram illustrating an overview of an imaging device according to a first embodiment.

In this disclosure, the phrase "at least one of" means "at least one selected from the group consisting of". For example, a phrase in the form "at least one of A and B" means "A", "B", or "A and B".

(Findings that Led to the Present Disclosure)

The present inventors have found that the imaging device of the related art has the following problems.

In the imaging device of the related art, a plurality of signal lines and a power-supply line extend in a column direction. There are cases in which two voltages that differ from each other are applied to the power-supply line in order to enhance the response speed of pixels. For example, a first voltage is applied to the power-supply line when signal charge is read from a charge accumulation region. Also, for example, a second voltage, which is different from the first voltage, is applied to the power-supply line when the charge accumulation region is reset. In this manner, there are cases in which different voltages are applied to the power-supply line in accordance with an operation timing.

In such cases, there is a problem with noise due to parasitic capacitance between the power-supply line and the plurality of signal lines. Specifically, of the plurality of signal lines, a signal line located at a position close to the power-supply line has a larger parasitic capacitance with the power-supply line than a signal line that is far from the power-supply line. Thus, the signal line located at the position close to the power-supply line is more susceptible to variations in the voltage applied to the power-supply line. Therefore, noise due to variations in the voltage of the power-supply line is more likely to be generated in electrical signals transmitted through the signal line located at the position close to the power-supply line.

A possible scheme for reducing noise is, for example, a scheme in which a shield line is provided between the power-supply line and the plurality of signal lines. However, provision of the shield line for only shielding causes a problem in that the size of the imaging device increases.

One non-limiting and exemplary embodiment provides an imaging device in which noise is reduced.

For example, an imaging device includes: a plurality of pixels arranged in a matrix, the plurality of pixels including a first pixel and a second pixel that are located in a same column; a first signal line connected to the first pixel; a second signal line connected to the second pixel; and a power-supply line connected to at least one of the plurality of pixels, two or more voltages that differ from each other being applied to the power-supply line. Each of the plurality of pixels may include a photoelectric converter. When a distance between the power-supply line and the first signal line is denoted by d1, and a distance between the power-supply line and the second signal line is denoted by d2, d1<d2 is satisfied in a first cross-section that is orthogonal to a column direction, and d1>d2 is satisfied in a second cross-section that is orthogonal to the column direction and that is different from the first cross-section.

Thus, the power-supply line, the first signal line, and the second signal line have a portion where d1<d2 is satisfied and a portion where d2>d1 is satisfied in the column direction. That is, the distance between the first signal line and the power-supply line, and the distance between the second signal line and the power-supply line can be varied for each portion of the signal lines. For example, the power-supply line, the first signal line, and the second signal line can be arranged so that the power-supply line alternately approaches or recedes from the first signal line and the second signal line. This makes it possible to substantially equalize capacitive coupling due to parasitic capacitances between the power-supply line and the first signal line and capacitive coupling due to parasitic capacitance between the power-supply line and the second signal line. Accordingly, it is possible to suppress generation of a large amount of noise in a particular signal line. Thus, only adjusting the arrangement of the power-supply line, the first signal line, and the second signal line can suppress generation of noise. Thereby, an increase in the size of the imaging device can be reduced without requiring a shield line.

The voltage applied to the power-supply line is not limited to two values and may be three or more values. Also, the imaging device may further include a power supply circuit that applies the two or more voltages to the power-supply line, a power-source switching circuit that switches between the two or more voltages, and a plurality of input terminals to which the two or more voltages are input.

For example, each of the power-supply line, the first signal line, and the second signal line may have a first portion that extends along the column direction, and at least one of the power-supply line, the first signal line, and the second signal line may have a second portion that extends along the column direction and a third portion that extends in a direction different from the column direction, the third portion having one end connected to the first portion and another end connected to the second portion.

As described above, at least one of the power-supply line, the first signal line, and the second signal line may have the third portion. Accordingly, the distance between each of the first signal line and the second signal line and the power-supply line can be varied for each portion of the signal lines. This makes it possible to substantially equalize capacitive coupling due to parasitic capacitances between the power-supply line and the first signal line and capacitive coupling due to parasitic capacitance between the power-supply line and the second signal line, as described above. It is possible to suppress generation of a large amount of noise in a particular signal line.

Also, for example, the power-supply line may overlap the first signal line and the second signal line in plan view. With this arrangement, the power-supply line and each of the first signal line and the second signal line overlap each other in plan view. That is, it is possible to avoid a situation in which only one of the first signal line and the second signal line overlaps the power-supply line in plan view. This makes it possible to substantially equalize capacitive coupling due to parasitic capacitances between the power-supply line and the first signal line and capacitive coupling due to parasitic capacitance between the power-supply line and the second signal line. Accordingly, it is possible to suppress generation of a large amount of noise in a particular signal line.

For example, the power-supply line may extend linearly in the column direction, and each of the first signal line and the second signal line may have the second portion and the third portion.

With this arrangement, since each of the first signal line and the second signal line has the third portion, the power-supply line, which extends linearly, can be easily made to overlap both the first signal line and the second signal line in plan view.

For example, each of the power-supply line, the first signal line, and the second signal line may have the second portion and the third portion.

With this arrangement, since each of the power-supply line, the first signal line, and the second signal line has the third portion, the area where the power-supply line and the first signal line overlap each other and the area where the power-supply line and the second signal line overlap each other can be easily equalized. Since the overlapping areas become equal to each other, it is possible to suppress generation of a large amount of noise in a particular signal line.

For example, the first signal line and the second signal line may intersect each other in plan view.

This makes it possible to provide the first signal line and the second signal line in a small range. Accordingly, since an increase in the wiring area can be suppressed, an increase in the size of the imaging device can be suppressed.

Also, for example, the first signal line may include a first overlapping portion that overlaps the power-supply line in plan view and a first non-overlapping portion that does not overlap the power-supply line in plan view, each of the first overlapping portion and the first non-overlapping portion may be included in at least one of the first portion and the second portion of the first signal line, the second signal line may include a second overlapping portion that overlaps the power-supply line in plan view and a second non-overlapping portion that does not overlap the power-supply line in plan view, each of the second overlapping portion and the second non-overlapping portion may be included in at least one of the first portion and the second portion of the second signal line.

Also, for example, the imaging device according to one aspect of the present disclosure may include a substrate, and the heights of the first overlapping portion, the first non-overlapping portion, the second overlapping portion, and the second non-overlapping portion from the substrate may be different from each other.

With this arrangement, since the signal lines are arranged in the same layer, two signal lines can be manufactured in the same process in manufacturing processes of the imaging device. Accordingly, it is possible to reduce performance variations between the signal lines.

Also, for example, the imaging device according to one aspect of the present disclosure may include a substrate, and the first overlapping portion may be different from the first non-overlapping portion in height from the substrate and may be farther from the power-supply line in a height direction of the substrate than the first non-overlapping portion, and the second overlapping portion may be different from the second non-overlapping portion in height from the substrate and may be farther from the power-supply line in the height direction than the second non-overlapping portion, With this arrangement, since the power-supply line and the first overlapping portion can be placed away from each other, and the power-supply line and the second overlapping portion can be placed away from each other, it is possible to reduce parasitic capacitance between the power-supply line and each signal line. Thus, it is possible to further reduce noise that occurs in each signal line.

Also, for example, the plurality of pixels may include a third pixel and a fourth pixel that are different from the first pixel and the second pixel and that are located in the same column; the imaging device may include a third signal line connected to the third pixel and a fourth signal line connected to the fourth pixel; the third signal line and the fourth signal line may have portions that extend along the column direction; and arbitrary two signal lines selected from the first signal line, the second signal line, the third signal line, and the fourth signal line may intersect each other in plan view.

With this arrangement, even when four signal lines are provided, the amounts of noise that occurs in the four signal lines can be equalized.

For example, the power-supply line may have a portion that overlaps two signal lines of the first signal line, the second signal line, the third signal line, and the fourth signal line in plan view.

With this arrangement, since the four signal lines can be provided in a small range, an increase in the wiring area can be suppressed. Accordingly, it is possible to suppress an increase in the size of the imaging device.

For example, the power-supply line may have the second portion and the third portion, and the first signal line and the second signal line may extend linearly along the column direction in plan view.

With this arrangement, since the power-supply line has the third portion, the power-supply line and both the first signal line and the second signal line, which extend linearly, can be easily made to overlap each other in plan view. Accordingly, the distance between the power-supply line and the first signal line and the distance between the power-supply line and the second signal line can be easily equalized.

Also, for example, the imaging device according to one aspect of the present disclosure may include a substrate, and the first signal line and the second signal line may be different from each other in height from the substrate.

With this arrangement, when the signal lines are arranged in one layer, two signal lines can be manufactured in the same process in manufacturing processes of the imaging device. Accordingly, it is possible to reduce variations in the performance of the signal lines.

Also, for example, the imaging device according to one aspect of the present disclosure may include a substrate, the first signal line may have a first overlapping portion that overlaps the power-supply line in plan view and a first non-overlapping portion that does not overlap the power-supply line in plan view; each of the first overlapping portion and the first non-overlapping portion may be included in at least one of the first portion and the second portion of the first signal line; the second signal line may include a second overlapping portion that overlaps the power-supply line in plan view and a second non-overlapping portion that does not overlap the power-supply line in plan view; each of the second overlapping portion and the second non-overlapping portion may be included in at least one of the first portion and the second portion of the second signal line; the first overlapping portion may be different from the first non-overlapping portion in height from the substrate and is farther from the power-supply line in a height direction of the substrate than the first non-overlapping portion; and the second overlapping portion may be different from the second non-overlapping portion in height from the substrate and is farther from the power-supply line in the height direction of the substrate than the second non-overlapping portion.

With this arrangement, since the power-supply line and the first overlapping portion can be placed away from each other, and the power-supply line and the second overlapping portion can be placed away from each other, it is possible to reduce parasitic capacitance between the power-supply line and each signal line. Thus, it is possible to further reduce noise that occurs in each signal line.

For example, at least one of the power-supply line, the first signal line, and the second signal line may have a plurality of first portions, a plurality of second portions, and a plurality of third portions.

For example, the angle formed by the third portion and each of the first portion and the second portion may be a right angle or an obtuse angle.

Also, for example, the first pixel may include a first transistor having a gate connected to a photoelectric converter included in the first pixel, the second pixel may include a second transistor having a gate connected to a photoelectric converter included in the second pixel, the first signal line may be a signal line connected to a source or a drain of the first transistor, and the second signal line may be a signal line connected to a drain or a source of the second transistor.

This makes it possible to suppress or reduce the amount of noise that occurs in the signal lines through which signal charge is transferred, and thus, for example, an image with high image quality can be generated.

This makes it possible to easily form a power-supply line or a signal line having a desired shape, It should be noted that general or specific embodiments may be implemented as a system, a method, an integrated circuit, a computer program, or a computer-readable recording medium, such as a compact disk read-only memory (CD-ROM), or may be implemented as any selective combination of a system, a method, an integrated circuit, a computer program, and a recording medium.

Embodiments of the present disclosure will be described below with reference to the accompanying drawings.

The embodiments described below each represent a general or specific example. Numerical values, shapes, materials, constituent elements, the arrangement positions and the connections of constituent elements, steps, the order of steps, and so on described in the embodiments below are examples and are not intended to limit the present disclosure. Also, of the constituent elements in the embodiments below, constituent elements not set forth in the independent claims will be described as optional constituent elements.

Also, an overly detailed description may be omitted herein. For example, a detailed description of already well-known things and a redundant description of substantially the same configuration may be omitted herein. This is to avoid the following description becoming overly redundant and to facilitate understanding of those skilled in the art. The accompanying drawings and the following description are provided so as to allow those skilled in the art to fully understand the present disclosure and are not intended to limit the subject matters recited in the claims.

In addition, in the drawings, elements that represent substantially the same configurations, operations, and advantages are denoted by the same reference numerals. Also, numerical values described below are exemplary for specifically describing the present disclosure and are not limited to the numerical values exemplified in the present disclosure. Additionally, connection relationships between constituent elements are exemplary for specifically describing the present disclosure, and connection relationships for realizing the features in the present disclosure are not limited thereto.

Also, the drawings are schematic diagrams and are not necessarily strictly illustrated. Accordingly, for example, scales and so on do not necessarily match in each drawing.

Herein, the terms "parallel" and "orthogonal", and so on representing relationships between elements, terms representing element shapes, and the ranges of numerical values are not only expressions representing exact meanings but also expressions representing substantially equivalent terms and ranges, for example, expressions meaning that the terms include, for example, differences of about several percent.

Herein, the terms "upper side" and "lower side" do not refer to an upper direction (vertically upper side) and a lower direction (vertically lower side) in absolute spatial recognition and are used as terms defined by relative positional relationships based on the order of stacked layers in a stacked configuration. The terms "upper side" and "lower side" apply to not only cases in which two constituent elements are arranged with a gap therebetween and a constituent element exists between the two constituent elements and but also cases in which two constituent elements are arranged to adhere to each other and contact each other, Embodiments Next, a description will be given of a first embodiment. FIG. 1 is a block diagram illustrating an overview of the configuration of an imaging device 101 according to the first embodiment. First, the structure of the imaging device 101 will be described with reference to FIG. 1.

The imaging device 101 is, for example, a stacked-type imaging device and has a photoelectric conversion film stacked on a semiconductor substrate. As illustrated in FIG. 1, the imaging device 101 includes a pixel array 102, a column scanning circuit 103, a column scanning circuit 104, and a row scanning circuit 105. The row scanning circuit 105 is also called a vertical scanning circuit.

The pixel array 102 includes a plurality of pixels 111 arranged in a matrix. As illustrated in FIG. 1, the plurality of pixels 111 is arrayed in a row direction and a column direction. In the present embodiment, the row direction and the column direction are directions in which rows and columns extend in corresponding planes having the same height from a substrate. That is, the column direction is a vertical direction, and the row direction is a horizontal direction, The plurality of pixels 111 may also be one-dimensionally arrayed to form the pixel array 102. In other words, either the number of rows or the number of columns of the plurality of pixels 111 arranged in a matrix may be one. In such a case, the imaging device 101 is a line sensor.

The row scanning circuit 105 controls, for each row, operations of the individual pixels 111 in the pixel array 102 through a plurality of signal lines (not illustrated) that are provided for the respective rows. Specifically, the row scanning circuit 105 is connected to the pixels 111, arranged in the row direction, through the corresponding signal lines that extend along the row direction.

The column scanning circuits 103 and 104 supply voltages and currents to the pixels 111 in the pixel array 102 through power-supply lines that are provided for the respective columns. The column scanning circuits 103 and 104 operate in synchronization with the row scanning circuit 105 to read, for each row controlled by the row scanning circuit 105, charges accumulated in the pixels 111 in the row through the signal lines (not illustrated) provided for the respective rows.

Figure 2:
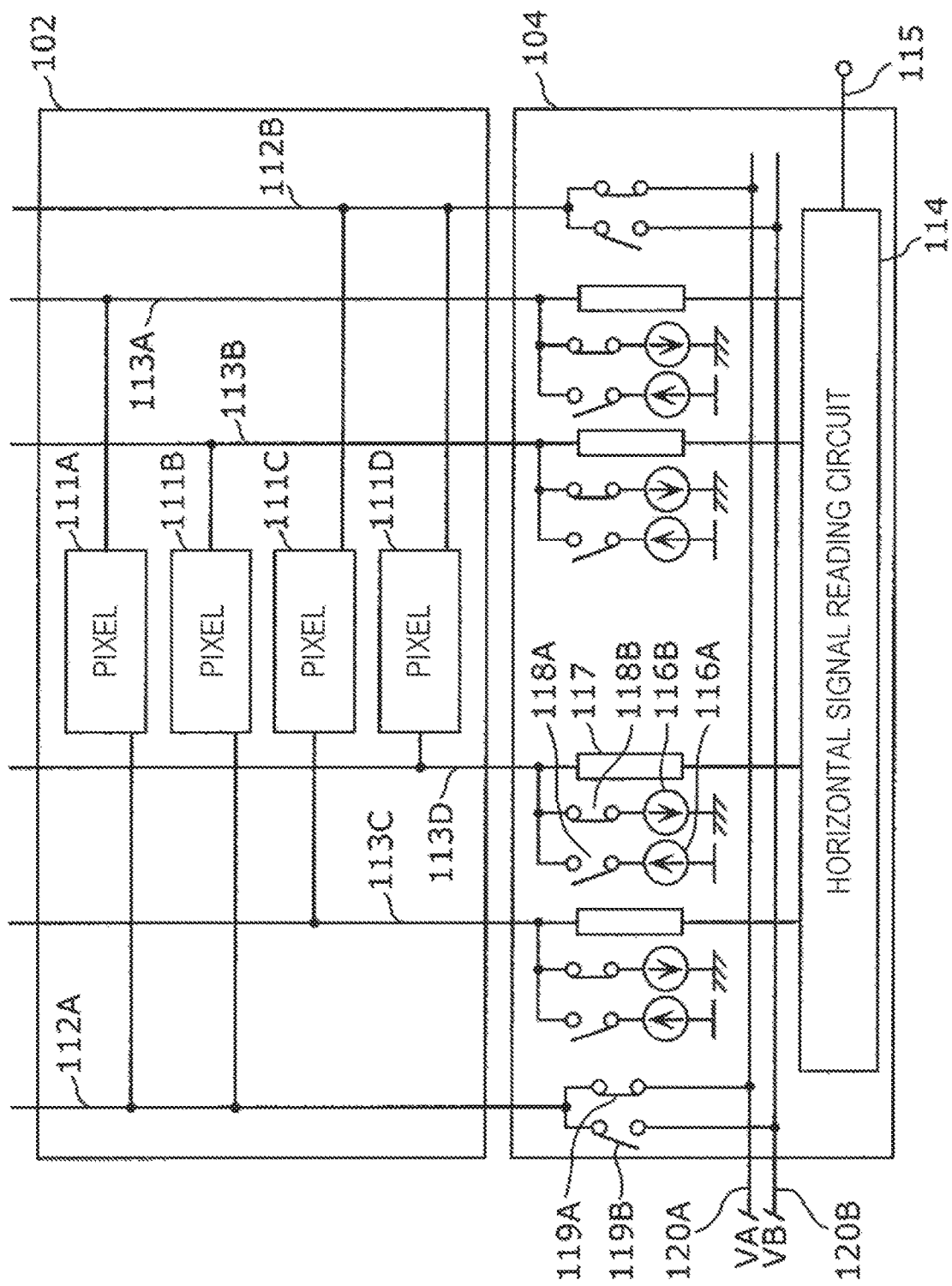
FIG. 2 is a block diagram illustrating major constituent elements that constitute the imaging device according to the first embodiment.

FIG. 2 is a block diagram illustrating major constituent elements that constitute the imaging device 101 according to the present embodiment. Specifically, FIG. 2 illustrates the structure of the pixel array 102 and the column scanning circuit 104. The structure of the pixel array 102 and the column scanning circuit 104 will now be described with reference to FIG. 2.

FIG. 2 illustrates four pixels 111A, 111B, 111C, and 111D of the plurality of pixels 111 arranged in a matrix. The pixels 111A, 111B, 111C, and 111D are arranged in the column direction. The pixels 111A, 111B, 111C, and 111D are examples of a first pixel, a second pixel, a third pixel, and a fourth pixel, respectively. A detailed description of a specific configuration of the pixels 111A, 111B, 111C, and 111D is given later.

As illustrated in FIG. 2, a predetermined power-supply voltage is supplied to the pixels 111A and 111B through a power-supply line 112A. A predetermined power-supply voltage is supplied to the pixels 111C and 111D through a power-supply line 112B. The pixel 111A is connected to an output signal line 113A. The pixel 111B is connected to an output signal line 113B. The pixel 111C is connected to an output signal line 113C. The pixel 111D is connected to an output signal line 113D.

As illustrated in FIG. 2, the column scanning circuit 104 includes a horizontal signal reading circuit 114, a horizontal signal common line 115, constant current sources 116A and 116B, column signal processing circuits 117, and switches 118A, 118B, 119A, and 119B. In the example illustrated in FIG. 2, the constant current sources 116A and 116B, the column signal processing circuit 117, and the switches 118A and 118E are provided, for example, for each output signal line. The switches 119A and 119E are also provided for each power-supply line.

The horizontal signal reading circuit 114 is electrically connected to the column signal processing circuits 117, which are provided for the respective output signal lines. The horizontal signal reading circuit 114 sequentially reads out signals output from the column signal processing circuits 117 to the horizontal signal common line 115.

The pixel 111A is connected to the constant current source 116A via the output signal line 113A and the corresponding switch 118A and is connected to the constant current source 116B through the output signal line 113A and the corresponding switch 118B. The constant current sources 116A and 116B differ from each other in the direction in which current flows. When a reset operation on a charge accumulation region in the pixel 111A is performed, the switch 118A is turned on to thereby allow the constant current source 116A to pass a certain current to the pixel 111A. During an operation for reading signal charge from the charge accumulation region in the pixel 111A, the switch 118B is turned on to allow the constant current source 116B to pass a certain amount of current from the pixel 111A to ground. The switches 118A and 118B are exclusively on-and-off controlled such that when one of the switches 118A and 118B is turned on, the other switch is turned off.

The pixel 111A is electrically connected to the corresponding column signal processing circuit 117 through the output signal line 113A. The column signal processing circuit 117 performs, for example, noise suppression signal processing, typified by correlated double sampling, and analog-to-digital conversion (AD conversion), Although the description above has been given of the pixel 111A, the constant current sources 116A and 116B, the column signal processing circuit 117, and the switches 118A and 118B are connected to each of the pixels 111B, 111C, and 111D through the corresponding output signal line.

A voltage line 120A is connected to the power-supply lines 112A and 112B via the corresponding switches 119A. A voltage line 120B is connected to the power-supply lines 112A and 112B via the corresponding switches 119B. When the switches 119A are turned on, a voltage VA is applied to the power-supply lines 112A and 112B. When the switches 119B are turned on, a voltage VB having a value different from that of the voltage VA is applied to the power-supply lines 112A and 112B. A voltage source for supplying the voltages VA and VB may be provided inside the imaging device 101. Alternatively, the voltage source for supplying the voltages VA and VB may be provided outside the imaging device 101, and the imaging device 101 may have two input terminals to which the voltages VA and VB are input. A voltage source for supplying the voltage VA and a voltage source for supplying the voltage VB may differ from each other. The voltages applied to the power-supply lines 112A and 112B are not limited to two values and may be three or more values.

The voltage VA is a power-supply voltage. The voltage VA is, for example, 3.3 V. During operation for reading signal charge, the switches 119A are turned on, so that the voltage VA is supplied to the power-supply lines 112A and 112B through the voltage line 120A. The voltage VB is a reset voltage. For example, the voltage VB may have a value smaller than that of the voltage VA and may be 0 V. During reset operation, the switches 119B are turned on, so that the voltage VB is supplied to the power-supply line 112A and 112B through the voltage line 120B. The switches 119A and 119B are exclusively on-and-off controlled such that when one of the switches 119A and 119B is turned on, the other is turned off.

That is, the voltages VA and VB are exclusively applied to the power-supply lines 112A and 112B. Specifically, the voltage VA is applied to the power-supply lines 112A and 112B in a first period, and the voltage VB is applied thereto in a second period, which is different from the first period. The voltage VB is not applied to the power-supply lines 112A and 112B in the first period in which the voltage VA is applied thereto, and the voltage VA is not applied to the power-supply lines 112A and 112B in the second period in which the voltage VB is applied thereto, Next, a specific configuration of one pixel 111 will be described with reference to FIG. 3. In the present embodiment, the pixels 111A, 111B, 111C, and 111D have substantially the same configuration. Herein, when the pixels 111A, 111B, 111C, and 111D are described without discrimination thereof, they are referred to as "pixels 111". Similarly, when the power-supply lines 112A and 112B are described without discrimination therebetween, they are referred to as "power-supply lines 112". When the output signal lines 113A, 113B, 1130, and 113D are described without discrimination therebetween, they are referred to as "output signal lines 113".

Figure 3:
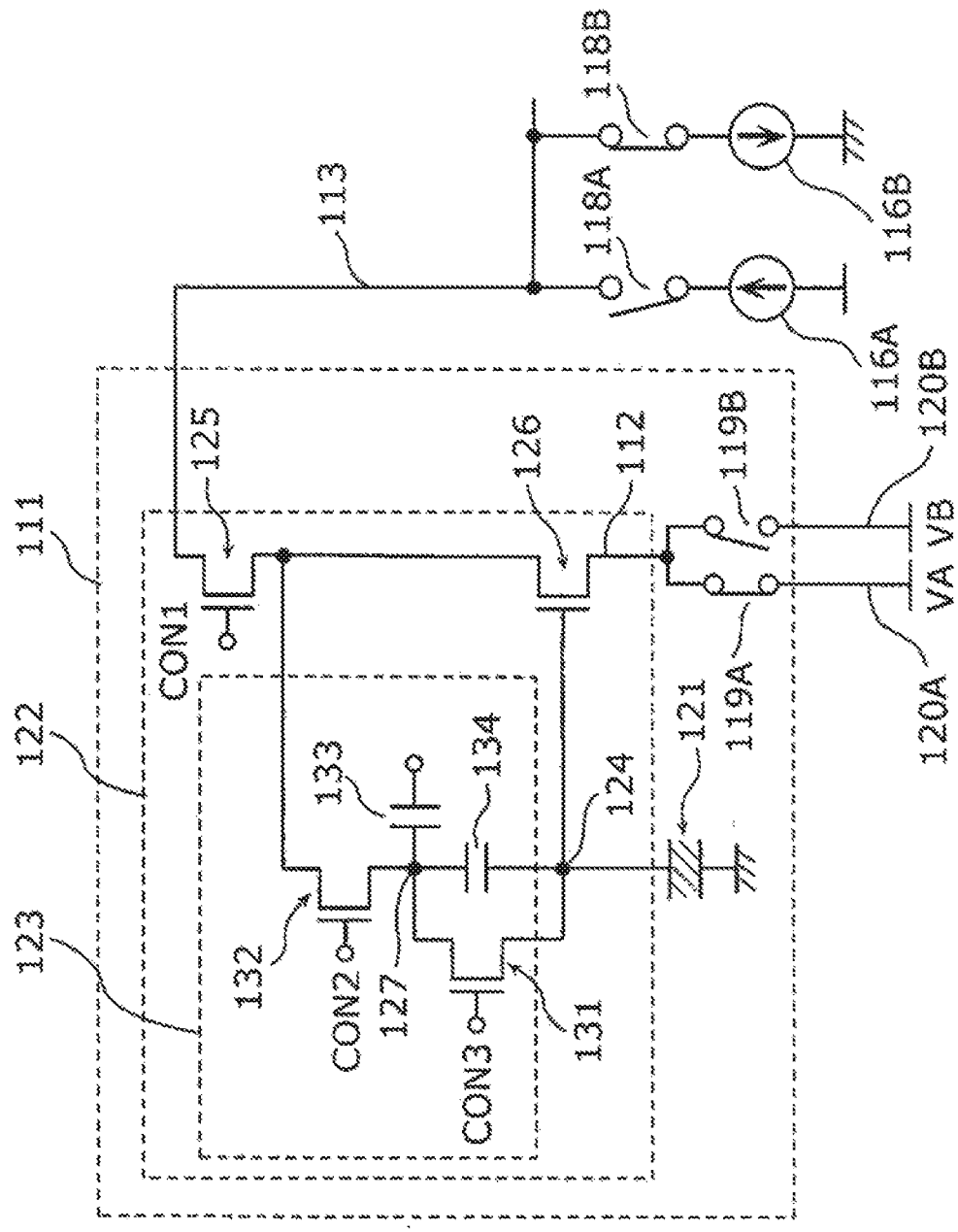
FIG. 3 is a circuit diagram illustrating an exemplary circuit configuration of one pixel according to the first embodiment.

FIG. 3 is a circuit diagram illustrating an exemplary circuit configuration of one pixel 111 according to the present embodiment. As illustrated in FIG. 3, the pixel 111 includes a photoelectric converter 121 and a reading circuit 122.

The photoelectric converter 121 is a photodetector and converts incident light, which serves as an optical signal, into signal charge, which serves as an electrical signal. The reading circuit 122 reads the electrical signal converted by the photoelectric converter 121. The photoelectric converter 121 has, for example, a structure in which a photoelectric conversion film is sandwiched between two electrodes. A specific configuration of the photoelectric converter 121 is described later.

The reading circuit 122 includes a band control portion 123, a charge accumulation region 124, a selecting transistor 125, and an amplifying transistor 126. The charge accumulation region 124 is a portion of a node where signal charge detected by the photoelectric converter 121 is accumulated. The charge accumulation region 124 is also called a floating diffusion (FD).

Figure 4:
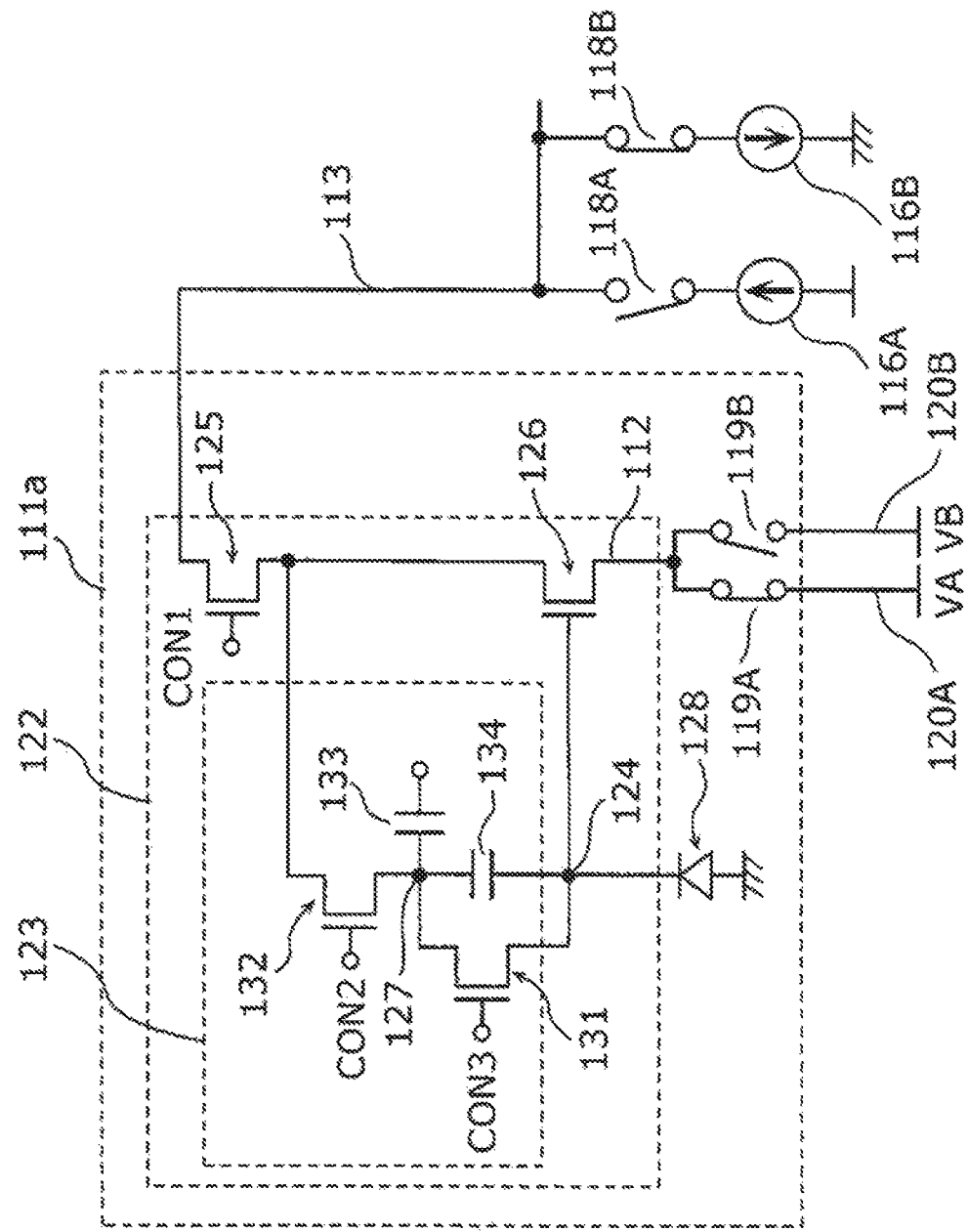
FIG. 4 is a circuit diagram illustrating another example of an exemplary circuit configuration of one pixel according to the first embodiment.

Alternatively, as another example, a photodiode 128, which is one example of a photoelectric converter, may be provided in place of the photoelectric converter 121, as in a pixel 111a illustrated in FIG. 4. FIG. 4 is a circuit diagram illustrating an exemplary circuit configuration of the pixel 111a according to the present embodiment.

A ground potential or a reference voltage Vp is applied to one end of the photodiode 128. One end of the node included in the charge accumulation region 124 is connected to another end of the photodiode 128. Thus, signal charge generated by the photodiode 128 is accumulated in the charge accumulation region 124. An element having a photoelectric conversion function can be widely used as the photoelectric converter.

As illustrated in FIG. 3 or 4, the charge accumulation region 124 is connected to the photoelectric converter 121 or the photodiode 128. The charge accumulation region 124 is connected to a gate of the amplifying transistor 126. One of a source and a drain of the amplifying transistor 126 is connected to the output signal line 113 via the selecting transistor 125. The other of the source and the drain of the amplifying transistor 126 is connected to the power-supply line 112. The amplifying transistor 126 outputs a signal corresponding to the amount of signal charge accumulated in the charge accumulation region 124 to the band control portion 123 and outputs the signal to the output signal line 113 via the selecting transistor 125.

The band control portion 123 includes a reset transistor 131 for resetting the charge accumulation region 124, a band control transistor 132 for limiting the band of a feedback signal that is fed back from the charge accumulation region 124 through the amplifying transistor 126, and capacitors 133 and 134. The capacitor 133 has a capacitance value that is, for example, larger than that of the capacitor 134.

One of a source and a drain of the reset transistor 131 is connected to the charge accumulation region 124, the gate of the amplifying transistor 126, and one electrode of the capacitor 134. The other of the source and the drain of the reset transistor 131 is connected to a node 127, one of a source and a drain of the band control transistor 132, and another electrode of the capacitor 134, and one electrode of the capacitor 133. The other of the source and the drain of the band control transistor 132 is connected to the source or the drain of the amplifying transistor 126, the source or the drain being connected to the output signal line 113. Another electrode of the capacitor 133 is connected to a signal line, which is not illustrated.

As illustrated in FIGS. 3 and 4, a control signal line CON1, a control signal line CON2, and a control signal line CON3 are connected to a gate of the selecting transistor 125, a gate of the band control transistor 132, and a gate of the reset transistor 131, respectively. The row scanning circuit 105 illustrated in FIG. 1 controls voltages applied to the control signal lines CON1, CON2, and CON3, to control on-and-off states of the transistors 125, 132, and 131.

The reset transistor 131 resets the charge in the charge accumulation region 124. In a noise suppression period, a signal read from the charge accumulation region 124 is amplified by the amplifying transistor 126, the amplified signal is subjected to band limitation by the band control transistor 132, and the resulting signal is then fed back to the charge accumulation region 124.

That is, the reading circuit 122 has a feedback path through which a signal corresponding to the amount of signal charge, the signal being output from the amplifying transistor 126, is negatively fed back to the charge accumulation region 124. This feedback path includes the charge accumulation region 124, the amplifying transistor 126, the band control transistor 132, and the capacitor 134.

The selecting transistor 125 is connected to the output signal line 113 shared by at least two pixels 111. The pixels 111 that share one output signal line 113 belong to, for example, the same column. The output signal lines 113 do not necessarily have to be arranged in all columns. For example, one output signal line 113 may be arranged for a plurality of columns, and two or more pixels 111 arranged in the plurality of columns may share one output signal line 113. Alternatively, as illustrated in FIG. 2, two or more output signal lines 113 may be arranged in one column. For example, one column may have the output signal lines 113A and 113B, and signals of the pixels 111 located in an odd-numbered row may be output to the output signal line 113A, and signals of the pixels 111 located in an even-numbered row may be output to the output signal line 113B.

As can be seen from FIGS. 2 and 3, the output signal line 113A is connected to the source or the drain of the amplifying transistor 126 whose gate is connected to the photoelectric converter 121 included in the pixel 111A. Specifically, the output signal line 113A is connected to the source or the drain of the amplifying transistor 126 in the pixel 111A via the selecting transistor 125 in the pixel 111A.

As can be seen from FIGS. 2 and 3, the output signal line 113B is connected to the source or the drain of the amplifying transistor 126 whose gate is connected to the photoelectric converter 121 included in the pixel 111B. Specifically, the output signal line 113B is connected to the source or the drain of the amplifying transistor 126 in the pixel 111B via the selecting transistor 125 in the pixel 111B.

In a reading period and a reset reading period, a signal amplified by the amplifying transistor 126 is output to the output signal line 113 via the selecting transistor 125. The reading period is a period in which the switches 118B and 119A are in an on state. The reset reading period is a period in which the switches 118A and 119B are in the on state. In the reading period and the reset reading period, the band control transistor 132 enters an off state, and the feedback path is not formed.

The term "capacitor" as used herein refers to a structure in which a dielectric, such as an insulating film, is sandwiched between electrodes. The "electrodes" are not limited to electrodes formed of metal and are construed as widely including a polysilicon layer or the like. The "electrodes" as used herein may be portions of a semiconductor substrate.

The circuit configurations of the pixel 111 illustrated in FIG. 3 and the pixel 111a illustrated in FIG. 4 are merely examples. For example, the pixel 111 does not necessarily have to include the band control transistor 132 and the capacitors 133 and 134.

Now, a specific configuration of the photoelectric converter 121 and a specific scheme for connecting the charge accumulation region 124 and the amplifying transistor 126 will be described with reference to FIG. 5.

Figure 5:
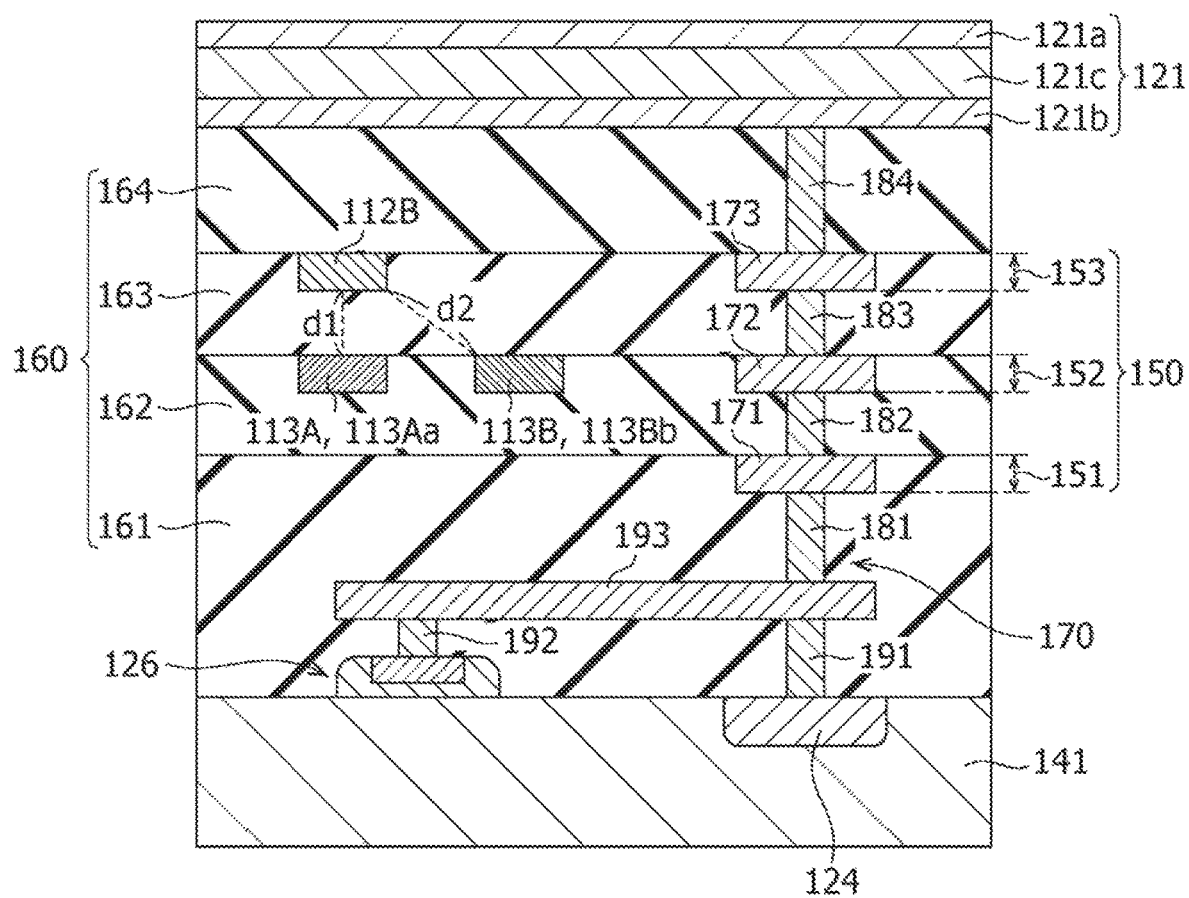
FIG. 5 is a sectional view illustrating an exemplary cross-sectional structure of the pixel according to the first embodiment.

FIG. 5 is a sectional view illustrating an exemplary cross-sectional structure of the pixel 111 in the imaging device 101 according to the present embodiment. FIG. 5 schematically illustrates the configuration of some elements, such as the photoelectric converter 121, the charge accumulation region 124, FD wires, and the amplifying transistor 126, included in the pixel 111.

As illustrated in FIG. 5, the imaging device 101 includes a semiconductor substrate 141, a plurality of wiring layers 150, a plurality of interlayer insulating layers 160, and FD wires 170.

The semiconductor substrate 141 is, for example, a p-type silicon substrate. The charge accumulation region 124 is provided at a surface of the semiconductor substrate 141. The charge accumulation region 124 is, for example, an impurity region formed by doping an n-type impurity.

The plurality of wiring layers 150 is provided on or above the semiconductor substrate 141. The plurality of wiring layers 150 includes the power-supply line 112 and the output signal lines 113 connected to the pixel 111. In the example illustrated in FIG. 5, the plurality of wiring layers 150 includes wiring layers 151, 152, and 153.

The wiring layer 151 is located between interlayer insulating layers 161 and 162. The wiring layer 151 is included in the wiring layers 150 and is the closest thereof to the semiconductor substrate 141.

The wiring layer 152 is located between the interlayer insulating layer 162 and an interlayer insulating layer 163. The wiring layer 152 is located in the middle of the wiring layers 151, 152, and 153 included in the wiring layers 150. Although details are described later, the wiring layer 152 includes the output signal lines 113A and 113B, as illustrated in FIG. 5.

The wiring layer 153 is located between the interlayer insulating layer 163 and an interlayer insulating layer 164. The wiring layer 153 is the farthest of the wiring layers 151, 152, and 153 included in the wiring layers 150 from the semiconductor substrate 141. The wiring layer 153 includes the power-supply line 112B.

In the example illustrated in FIG. 5, the plurality of interlayer insulating layers 160 includes the interlayer insulating layers 161, 162, 163, and 164. The interlayer insulating layers 161, 162, 163, and 164 are stacked on the surface of the semiconductor substrate 141 in that order. The interlayer insulating layers 161, 162, 163, and 164 are, for example, insulating films. Examples of the insulating films include silicon oxide films and silicon nitride films.

The photoelectric converter 121 is provided on the interlayer insulating layer 164. As illustrated in FIG. 5, the photoelectric converter 121 has a first electrode 121a, a second electrode 121b, and a photoelectric conversion film 121c. The photoelectric conversion film 121c is located between the first electrode 121a and the second electrode 121b. The first electrode 121a and the photoelectric conversion film 121c are provided through the plurality of pixels 111. The second electrode 121b is separately provided for each pixel 111. At least one of the first electrode 121a and the photoelectric conversion film 121c may be provided separately for each pixel 111.

The first electrode 121a is, for example, a transparent electrode that has electrical conductivity and that transmits light in a wavelength band which is absorbed by the photoelectric conversion film 121c. The first electrode 121a is formed using, for example, an electrically conductive transparent oxide. One example of the electrically conductive transparent oxide is an indium tin oxide (ITO). The second electrode 121b is formed using electrically conductive material. Examples of the electrically conductive material include metal and a metal nitride. Examples of the metal and metal contained in the metal nitride include aluminum and copper. The electrically conductive material may be polysilicon having electrical conductivity.

The photoelectric conversion film 121c is, for example, an organic photoelectric conversion film. The reference voltage Vp is applied to the first electrode 121a. The charge accumulation region 124 is electrically connected to the second electrode 121b. Specifically, the charge accumulation region 124 and the second electrode 121b are connected to each other through the FD wires 170. Thus, signal charge generated by the photoelectric converter 121 is accumulated in the charge accumulation region 124. The photoelectric conversion film 121c may be an inorganic photoelectric conversion film. For example, the photoelectric conversion film 121c may be an amorphous silicon film.

A method for accumulating signal charge in the charge accumulation region 124 when the photoelectric converter 121 having the photoelectric conversion film 121c is used will now be described in detail. When light is incident on the photoelectric conversion film 121c, electron-hole pairs are generated by photoelectric conversion. When there is a potential difference between the first electrode 121a and the second electrode 121b, either generated electrons or holes move to the second electrode 121b. For example, when a voltage applied to the first electrode 121a is higher than a voltage at the second electrode 121b, the holes move to the second electrode 121b. For example, when the reference voltage Vp that is higher than a reset voltage is applied to the first electrode 121a, and the second electrode 121b is at a reset voltage, the holes move to the second electrode 121b. The holes move to the charge accumulation region 124 through the FD wires 170. Thus, the holes can be used as the signal charge. When the reference voltage Vp applied to the first electrode 121a is made lower than the voltage at the second electrode 121b, the electrons can also be used as the signal charge.

As illustrated in FIG. 5, the FD wires 170 penetrate the interlayer insulating layers 160 from the photoelectric converter 121 to the semiconductor substrate 141. Specifically, the FD wires 170 include wires 171, 172, and 173, vias 181, 182, 183, and 184, plugs 191 and 192, and a wire 193.

The wires 171, 172, and 173 are included in the wiring layers 151, 152, and 153, respectively. The wire 171 provides electrical connection between the vias 181 and 182, the wire 172 provides electrical connection between the vias 182 and 183, and the wire 173 provides electrical connection between the vias 183 and 184. The wires 171, 172, and 173 are formed using electrically conductive material. Examples of the electrically conductive material include metal and a metal nitride. Examples of the metal and metal contained in the metal nitride include aluminum and copper. The electrically conductive material may be polysilicon having electrical conductivity.

The vias 181, 182, 183, and 184 are provided so as to penetrate the interlayer insulating layers 161, 162, 163, and 164, respectively, in a thickness direction. The vias 181, 182, 183, and 184 are formed, for example, by using electrically conductive material. Examples of the electrically conductive material include metal and a metal nitride. Examples of the metal and metal contained in the metal nitride include aluminum and copper. The electrically conductive material may be polysilicon having electrical conductivity.

The plug 191 is directly connected to the charge accumulation region 124. The plug 191 is connected to the via 181 through the wire 193 and is electrically connected to the second electrode 121b of the photoelectric converter 121.

The plug 192 is directly connected to the gate of the amplifying transistor 126. The plug 192 is connected to the via 181 through the wire 193 and is electrically connected to the second electrode 121b of the photoelectric converter 121.

The wire 193 provides connection between the plugs 191 and 192. The plugs 191 and 192 and the wire 193 are formed, for example, by using electrically conductive polysilicon. Alternatively, the plugs 191 and 192 and the wire 193 may be formed using metallic material. Examples of the metal include aluminum and copper.

When the pixel 111a has the photodiode 128 as a photoelectric converter, as illustrated in FIG. 4, the photodiode 128 is formed, for example, on the surface of the semiconductor substrate 141.

Next, a positional relationship between the power-supply line 112 and the output signal lines 113 according to the present embodiment will be described with reference to FIGS. 5, 6A, 6B, and 7. The power-supply line 112B and the output signal lines 113A and 113B, which are located to the right of the pixels 111 arranged in the column direction, as illustrated in FIG. 2, will be described below by way of example.

The output signal line 113A is one example of a signal line connected to the pixel 111A.

The output signal line 113B is one example of a second signal line connected to the pixel 111B.

Figure 6A:
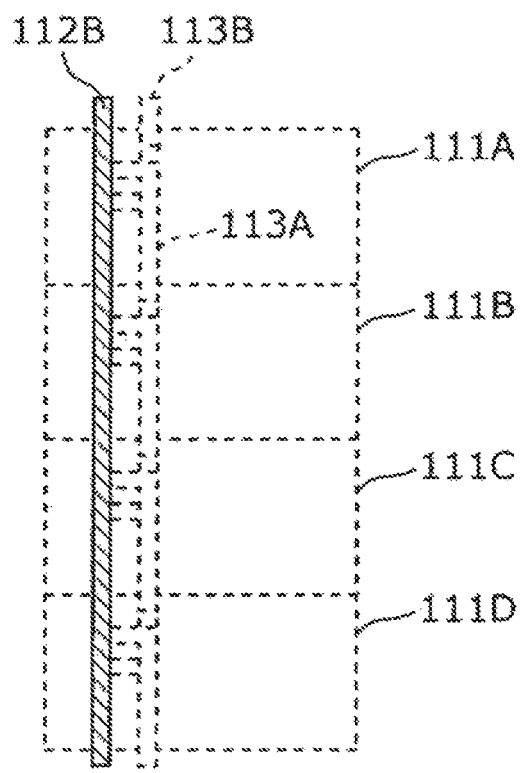
FIG. 6A is a plan view illustrating an exemplary layout structure of a power-supply line according to the first embodiment.
Figure 6B:
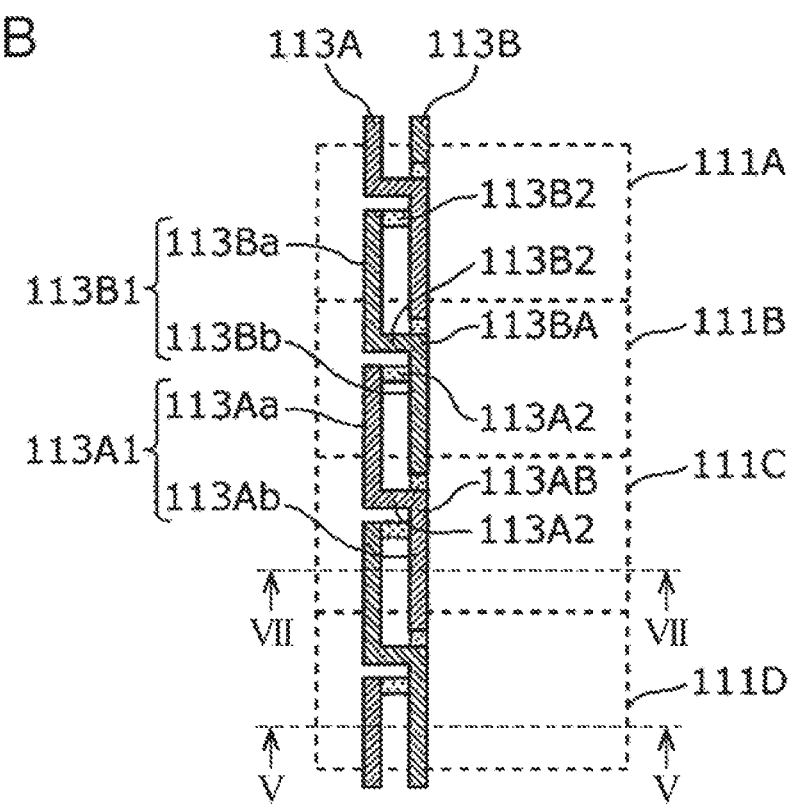
FIG. 6B is a plan view illustrating an exemplary layout structure of signal lines according to the first embodiment.
Figure 7:
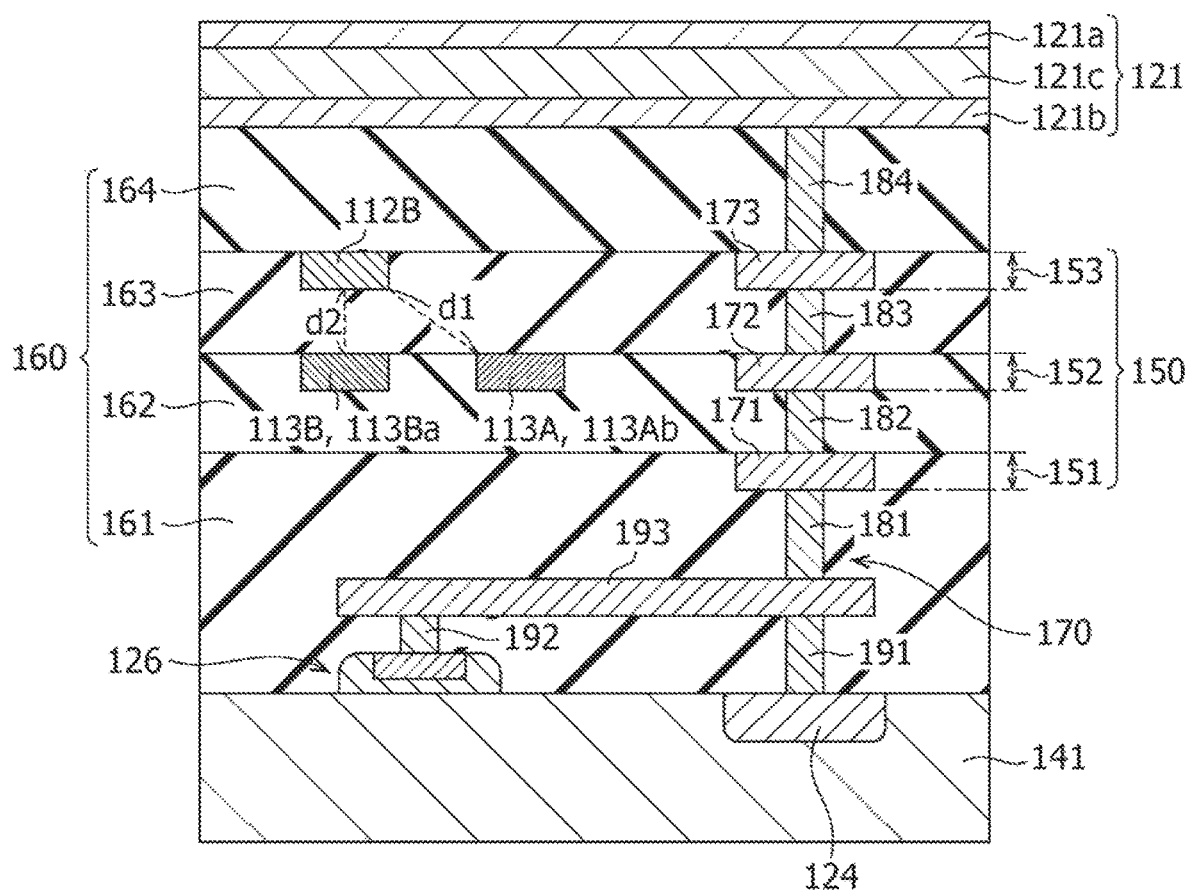
FIG. 7 is a sectional view illustrating an exemplary cross-sectional structure of signal lines, a power-supply line, and FD wires according to the first embodiment, taken along line VII-VII in FIG. 6B.

FIG. 6A is a plan view of an exemplary layout structure of the power-supply line 112B according to the present embodiment. FIG. 6B is a plan view schematically illustrating an exemplary layout structure of the output signal lines 113A and 113B according to the present embodiment. FIG. 7 is a sectional view illustrating an exemplary cross-sectional structure of the output signal lines 113A and 113B, the power-supply line 112B, and the FD wires 170 according to the present embodiment. FIG. 7 illustrates a cross-section along line VII-VII in FIG. 6B. FIG. 5 illustrates a cross-section along line V-V in FIG. 6B.

As illustrated in FIG. 6A, the power-supply line 112B extends linearly along the column direction. Specifically, the power-supply line 112B extends linearly through the pixels 111A, 111B, 111C, and 111D. The power-supply line 112B overlaps the output signal lines 113A and 113B in plan view. In FIG. 6A, contour lines of the output signal lines 113A and 113B in plan view are denoted by dashed lines.

As illustrated in FIG. 6B, each of the output signal lines 113A and 113B meanders in plan view. Specifically, each of the output signal lines 113A and 113B meanders in a polygonal chain shape, and the bending angle thereof is a right angle.

The output signal lines 113A and 113B each meander periodically by repeating the bending, and the periods of the meanders thereof are equal to each other. The period of the meander is a length along the column direction of a repetition unit having the same shape when each signal line is traced in the column direction. In the example illustrated in FIG. 6B, the period of the meander is a period corresponding to about two pixels. That is, in the plan-view shape of the output signal lines 113A and 113B, the portion where the pixels 111A and 111B overlap each other and the portion where the pixels 111C and 111D overlap each other have the same shape. The period of the meander may correspond to one pixel or may correspond to four pixels.

Specifically, the output signal line 113A has an extension portion 113A1 that extends in the column direction and a plurality of connection portions 113A2 that extends in a direction different from the column direction. Both ends of each of the connection portions 113A2 are connected to the extension portion 113A1. Specifically, the extension portion 113A1 includes a plurality of first portions and a plurality of second portions, and the connection portion 113A2 is arranged between the first portion and the second portion that are adjacent to each other when the output signal line 113A is traced in the direction in which it extends. That is, the connection portion 113A2 is one example of a third portion having one end connected to a first portion that extends in the column direction and another end connected to a second portion that extends in the column direction. As illustrated in FIG. 6B, the angle formed by the extension portion 113A1 and the connection portion 113A2 is a right angle. For example, the first portion and the second portion that constitute the extension portion 113A1 respectively correspond to line segments each having a length corresponding to about one pixel. The line segments respectively correspond to an overlapping portion 113Aa and a non-overlapping portion 113Ab, which are described below.

The output signal line 113B has an extension portion 113B1 that extends in the column direction and a connection portion 113B2 that extends in a direction different from the column direction. Both ends of each of the connection portions 113B2 are connected to the extension portion 113B1. Specifically, the extension portion 113B1 includes a plurality of first portions and a plurality of second portions, and the connection portion 113B2 is arranged between the first portion and the second portion that are adjacent to each other when the output signal line 113B is traced in the direction in which it extends. That is, the connection portion 113B2 is one example of a third portion having one end connected to a first portion that extends in the column direction and another end connected to a second portion that extends in the column direction. As illustrated in FIG. 6B, the angle formed by the extension portion 113B1 and the connection portion 113B2 is a right angle. For example, the first portion and the second portion that constitute the extension portion 113B1 respectively correspond to line segments each having a length corresponding to about one pixel. The line segments respectively correspond to an overlapping portion 113Ba and a non-overlapping portion 113Bb, which are described below.

In the present embodiment, the extension portion 113A1 of the output signal line 113A and the extension portion 113B1 of the output signal line 113B are at the same height from the semiconductor substrate 141. For example, as illustrated in FIGS. 5 and 7, the overlapping portion 113Aa and the non-overlapping portion 113Ab of the output signal line 113A and the overlapping portion 113Ba and the non-overlapping portion 113Bb of the output signal line 113B are at the same height from the semiconductor substrate 141. The height of the power-supply line 112B from the semiconductor substrate 141 and the height of the output signal lines 113A and 113B therefrom are different from each other. Specifically, the power-supply line 112B is located at a farther position from the semiconductor substrate 141 than the output signal lines 113A and 113B.

The output signal lines 113A and 113B extend while intersecting each other and alternately interchanging their positions in plan view. When the output signal lines 113A and 113B intersect each other, one of the output signal lines 113A and 113B is located in a wiring layer that is different from the wiring layer of the other output signal line at the intersection portion.

For example, at an intersection portion 113AB illustrated in FIG. 6B, the output signal line 113A is located on or above the output signal line 113B. Specifically, at the intersection portion 113AB, the output signal line 113A is located in the wiring layer 152, and the output signal line 113B is located in the wiring layer 151. Also, at an intersection portion 113BA, the output signal line 113B is located on or above the output signal line 113A. Specifically, at the intersection portion 113BA, the output signal line 113B is located in the wiring layer 152, and the output signal line 113A is located in the wiring layer 151. As described above, the output signal lines 113A and 113B are partly located in different wiring layers when they are traced in the column direction. When each signal line is provided through a plurality of wiring layers at different heights, the wiring layers are connected to each other through vias. The vias penetrate the corresponding interlayer insulating layers in the thickness direction.

As illustrated in FIG. 6A, each of the output signal lines 113A and 113B overlaps the power-supply line 112B in plan view. In the present embodiment, the extension portion of each of the output signal lines 113A and 113B, the extension portion extending in the column direction, partly overlaps the power-supply line 112B.

Specifically, as illustrated in FIG. 6B, the extension portion 113A1 of the output signal line 113A has the overlapping portion 113Aa and the non-overlapping portion 113Ab. The overlapping portion 113Aa is one example of a first overlapping portion that overlaps the power-supply line 112B in plan view. The non-overlapping portion 113Ab is one example of a first non-overlapping portion that does not overlap the power-supply line 112B in plan view. The overlapping portion 113Aa and the non-overlapping portion 113Ab are portions that extend linearly and respectively correspond to the first portion and the second portion included in the extension portion 113A1. The intersection portion 113AB is included in the non-overlapping portion 113Ab.

The connection portion 113A2 of the output signal line 113A provides connection between the overlapping portion 113Aa and the non-overlapping portion 113Ab. The connection portions 113A2 located in the wiring layer 152 and the connection portions 113A2 located in the wiring layer 151 are alternately arranged in the column direction. For example, when the output signal line 113A is traced in the column direction, the connection portion 113A2, which connects from the overlapping portion 113Aa to the non-overlapping portion 113Ab, is located in the wiring layer 152, which is an upper layer. The connection portion 113A2, which connects from the non-overlapping portion 113Ab to the overlapping portion 113Aa, is located in the wiring layer 151, which is a lower layer.

The extension portion 113B1 of the output signal line 113B has the overlapping portion 113Ba and the non-overlapping portion 113Bb. The overlapping portion 113Ba is one example of a second overlapping portion that overlaps the power-supply line 112B in plan view. The non-overlapping portion 113Bb is one example of a second non-overlapping portion that does not overlap the power-supply line 112B in plan view. The overlapping portion 113Ba and the non-overlapping portion 113Bb are portions that extend linearly and respectively correspond to the first portion and the second portion included in the extension portion 113B1. The intersection portion 113BA is included in the non-overlapping portion 113Bb.

The connection portion 113B2 of the output signal line 113B provides connection between the overlapping portion 113Ba and the non-overlapping portion 113Bb. The connection portions 113B2 located in the wiring layer 152 and the connection portion 113B2 located in the wiring layer 151 are alternately arranged along the column direction. For example, when the output signal line 113B is traced in the column direction, the connection portion 113B2, which connects from the overlapping portion 113Ba to the non-overlapping portion 113Bb, is located in the wiring layer 152, which is an upper layer. The connection portion 113B2, which connects from the non-overlapping portion 113Bb to the overlapping portion 113Ba, is located in the wiring layer 151, which is a lower layer.

In the present embodiment, the overlapping portion 113Aa of the output signal line 113A and the overlapping portion 113Ba of the output signal line 113B are alternately arranged side-by-side linearly along the column direction. The non-overlapping portion 113Ab of the output signal line 113A and the non-overlapping portion 113Bb of the output signal line 113B are alternately arranged side-by-side linearly along the column direction. For example, the overlapping portion 113Aa of the output signal line 113A and the non-overlapping portion 113Bb of the output signal line 113B are arranged side-by-side in the wiring layer 152, and the gap between the overlapping portion 113Aa and the non-overlapping portion 113Bb is constant. The non-overlapping portion 113Ab of the output signal line 113A and the overlapping portion 113Ba of the output signal line 113B are arranged side-by-side in the wiring layer 152, and the gap between the non-overlapping portion 113Ab and the overlapping portion 113Ba is constant.

In the above-described configuration, at the position denoted by line V-V in FIG. 6B, the power-supply line 112B and the output signal line 113A overlap each other in plan view, and the power-supply line 112B and the output signal line 113B do not overlap each other in plan view. Specifically, as illustrated in FIG. 5, the output signal line 113A is located at a position closer to the power-supply line 112B than the output signal line 113B. That is, in the cross-section illustrated in FIG. 5, d1<d2 is satisfied.

In this case, d1 represents the distance between the power-supply line 112B and the output signal line 113A, and d2 represents the distance between the power-supply line 112B and the output signal line 113B. The distance d1 is defined as, for example, the smallest distance between a surface of the power-supply line 112B and a surface of the output signal line 113A in the cross-section orthogonal to the column direction. Alternatively, the distance d1 may be the distance between the center of the power-supply line 112B and the center of the output signal line 113A in the cross-section orthogonal to the column direction. The same applies to the distance d2. The same also applies to second to sixth embodiments described below.

On the other hand, at the position denoted by line VII-VII in FIG. 6B, the power-supply line 112B and the output signal line 113B overlap each other in plan view, and the power-supply line 112B and the output signal line 113A do not overlap each other in plan view. Specifically, as illustrated in FIG. 7, the output signal line 113B is located at a position closer to the power-supply line 112B than the output signal line 113A. That is, in the cross-section illustrated in FIG. 7, d1>d2 is satisfied.

As described above, by alternately interchanging the positions, the output signal lines 113A and 113B repeat approaching and receding from the power-supply line 112B. This makes it possible to substantially equalize capacitive coupling due to parasitic capacitances between the power-supply line 112B and the output signal line 113A and capacitive coupling due to parasitic capacitances between the power-supply line 112B and the output signal line 113B. As a result, it is possible to substantially equalize the amounts of noise introduced into the output signal lines 113A and 113B by influences of the power-supply line 112B. Accordingly, according to the present embodiment, noise that occurs unproportionally in particular output signal lines in the related art can be distributed to a plurality of output signal lines.

If noise occurs unproportionally in particular output signal lines, correction values for correcting the noise need to be prepared for the respective output signal lines, and the capacity of a memory for holding the correction values increases. In contrast, in the present embodiment, since noise that occurs in output signal lines is equalized, it is not necessary to prepare the correction values for the respective output signal lines. Accordingly, it is possible to reduce the capacity of the memory needed for the correction.

[Modification]

The shapes of the output signal lines 113 are not limited to the example illustrated in FIG. 6B. For example, as illustrated in FIGS. 8A and 8B, the output signal lines 113A and 113B may intersect each other obliquely.

Figure 8A:
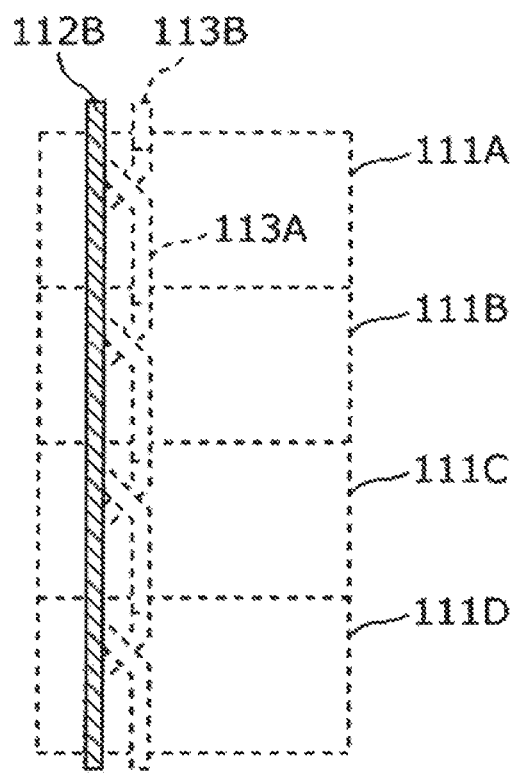
FIG. 8A is a plan view illustrating another example of the exemplary layout structure of the power-supply line according to the first embodiment.

FIG. 8A is a plan view illustrating an exemplary layout structure of the power-supply line 112B according to a modification. FIG. 8B is a plan view illustrating an exemplary layout structure of the output signal lines 113A and 113B according to this modification.

Figure 8B:
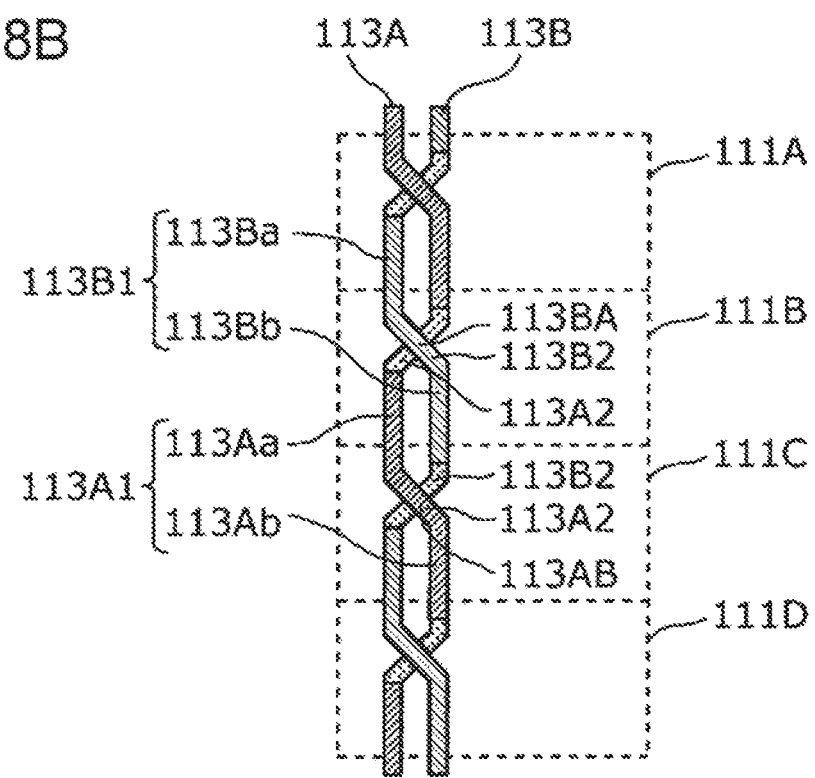
FIG. 8B is a plan view illustrating another example of the exemplary layout structure of the signal lines according to the first embodiment.

For example, as illustrated in FIG. 8B, the angle formed by the extension portion 113A1 and the connection portion 113A2 of the output signal line 113A is an obtuse angle. The angle formed by the extension portion 113B1 and the connection portion 113B2 of the output signal line 113B is an obtuse angle.

In this modification, the connection portion 113A2 of the output signal line 113A and the connection portion 113B2 of the output signal line 113B intersect each other in plan view. Specifically, the intersection portion 113AB is included in the connection portion 113A2. The intersection portion 113BA is included in the connection portion 113B2. For example, the above-described obtuse angle is 135°, and the connection portion 113A2 of the output signal line 113A and the connection portion 113B2 of the output signal line 113B intersect each other at a right angle in plan view. Thus, it is possible to reduce capacitive coupling between the output signal lines 113A and 113B. The intersection angle between the connection portion 113A2 and the connection portion 113B2 does not necessarily have to be a right angle.

Second Embodiment

Next, a description will be given of a second embodiment. In the second embodiment, the shapes of the output signal lines differ compared with the first embodiment. Hereinafter, points that differ from the first embodiment will be mainly described, and descriptions of common points will be omitted or briefly given.

Figure 9A:
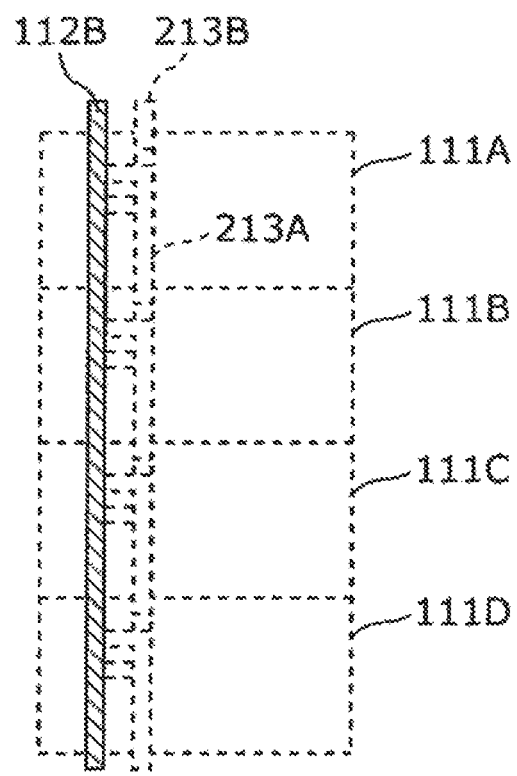
FIG. 9A is a plan view illustrating an exemplary layout structure of the power-supply line according to a second embodiment.
Figure 9B:
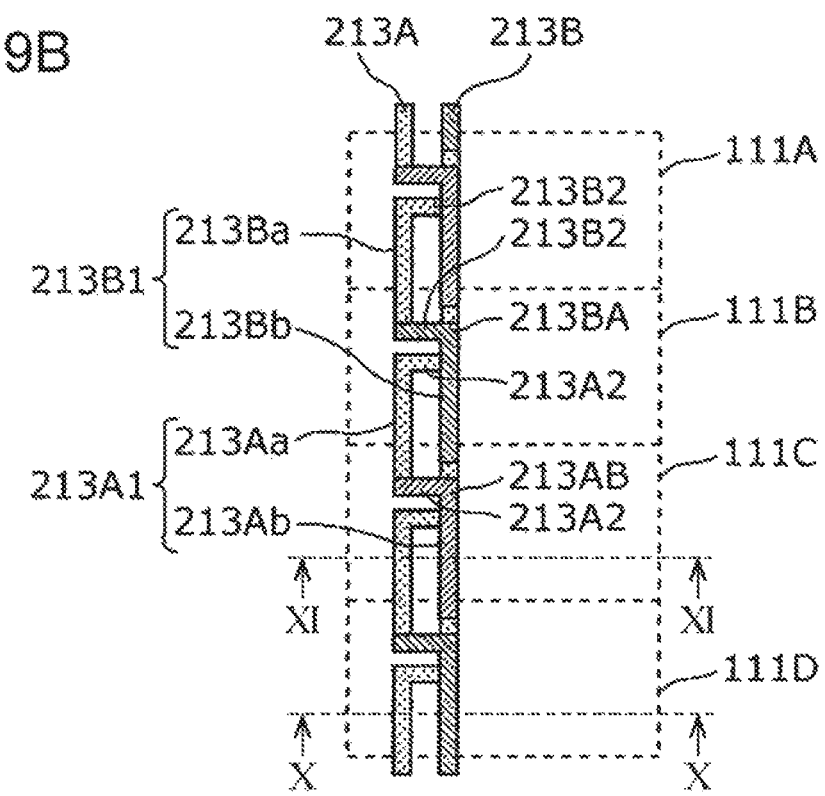
FIG. 9B is a plan view illustrating an exemplary layout structure of signal lines according to the second embodiment.
Figure 10:
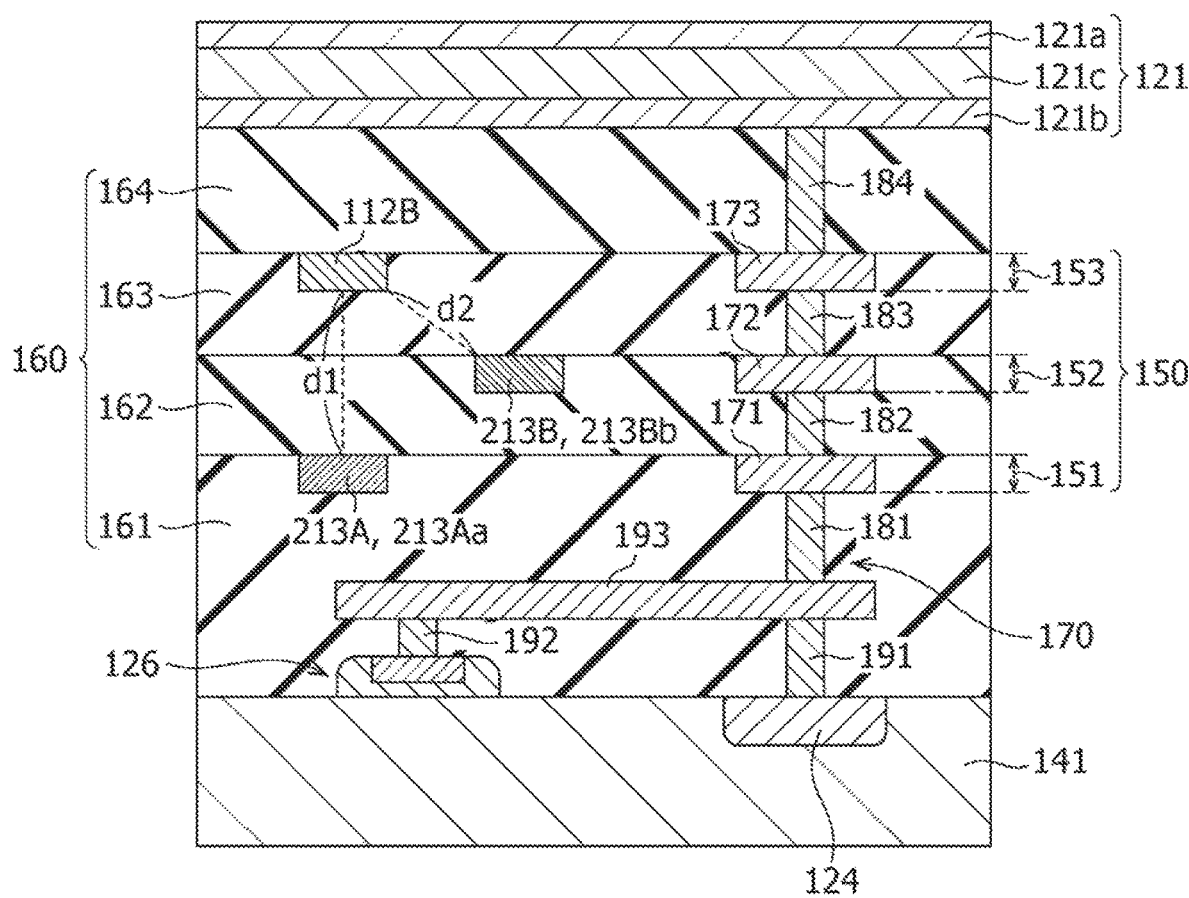
FIG. 10 is a sectional view illustrating an exemplary cross-sectional structure of signal lines, a power-supply line, and FD wires according to the second embodiment, taken along line X-X in FIG. 9B.
Figure 11:
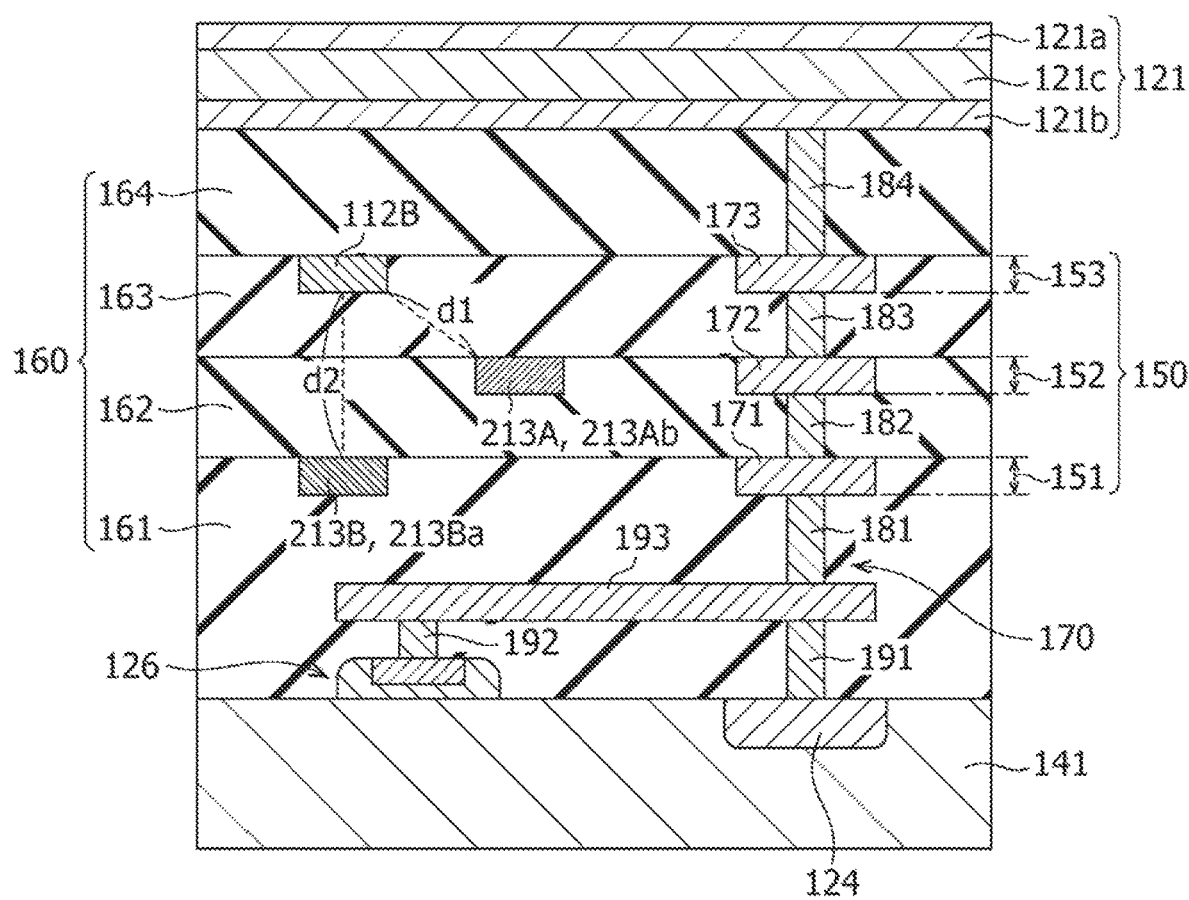
FIG. 11 is a sectional view illustrating an exemplary cross-sectional structure of signal lines, a power-supply line, and FD wires according to the second embodiment, taken along line XI-XI in FIG. 9B.

FIG. 9A is a plan view illustrating an exemplary layout structure of the power-supply line 112B according to the present embodiment. FIG. 9B is a plan view schematically illustrating an exemplary layout structure of an output signal line 213A and an output signal line 213B according to the present embodiment. FIGS. 10 and 11 are sectional views illustrating an exemplary cross-sectional structure of the output signal lines 213A and 213B, the power-supply line 112B, and the FD wires 170 according to the present embodiment. FIG. 10 illustrates a cross-section along line X-X in FIG. 9B. FIG. 11 illustrates a cross-section along line XI-XI in FIG. 9B.

The output signal lines 213A and 213B according to the present embodiment respectively correspond to the output signal lines 113A and 113B according to the first embodiment and are substantially the same in functions and so on except for different shapes. A layout of the output signal lines 213A and 213B in plan view is substantially the same as the layout of the output signal lines 113A and 113B in the first embodiment.

For example, an extension portion 213A1 and connection portions 213A2 of the output signal line 213A are substantially the same as the extension portion 113A1 and the connection portions 113A2 of the output signal line 113A according to the first embodiment. An extension portion 213B1 and connection portions 213B2 of the output signal line 213B are substantially the same as the extension portion 113B1 and the connection portions 113B2 of the output signal line 113B according to the first embodiment.

Also, an overlapping portion 213Aa, a non-overlapping portion 213Ab, and intersection portion 213AB of the output signal line 213A respectively correspond to the overlapping portion 113Aa, the non-overlapping portion 113Ab, and the intersection portions 113AB of the output signal line 113A according to the first embodiment. In the present embodiment, the overlapping portion 213Aa is located at a height different from the height of the overlapping portion 113Aa according to the first embodiment.

Specifically, as illustrated in FIG. 10, the overlapping portion 213Aa of the output signal line 213A is farther from the power-supply line 112B than a non-overlapping portion 213Bb of the output signal line 213B in a direction perpendicular to the semiconductor substrate 141. More specifically, the overlapping portion 213Aa is included in the wiring layer 151. The non-overlapping portion 213Bb is included in the wiring layer 152. Thus, the overlapping portion 213Aa is arranged in a direction directly below the power-supply line 112B, with one or more wiring layers being interposed therebetween. That is, the distance between the overlapping portion 213Aa and the power-supply line 112B is larger than the distance in the first embodiment. Specifically, a distance d1 illustrated in FIG. 10 is larger than the distance d1 illustrated in FIG. 5. Also, in the cross-section illustrated in FIG. 10, d1>d2 is satisfied.

In the cross-section illustrated in FIG. 10, d1<d2 may also be satisfied. For example, when the distance between the wires in a plan layout is larger than the film thickness of the interlayer insulating layers 162 and 163, there are cases in which d1<d2 is satisfied. This is also true for FIGS. 11, 20, 21, 34, 35, 36, and 37. In this case, in the cross-section illustrated in FIG. 11, d1>d2 is satisfied.

Similarly, an overlapping portion 213Ba, a non-overlapping portion 213Bb, and intersection portions 213BA of the output signal line 213B respectively correspond to the overlapping portion 113Ba, the non-overlapping portion 113Bb, and the intersection portions 113BA of the output signal line 113B according to the first embodiment. In the present embodiment, the height at which the overlapping portion 213Ba is provided is different from the height at which the overlapping portion 113Ba according to the first embodiment is provided.

Specifically, as illustrated in FIG. 11, the overlapping portion 213Ba of the output signal line 213B is farther from the power-supply line 112B than the non-overlapping portion 213Ab of the output signal line 213A in the direction perpendicular to the semiconductor substrate 141. More specifically, the overlapping portion 213Ba is included in the wiring layer 151. The non-overlapping portion 213Ab is included in the wiring layer 152. Thus, the overlapping portion 213Ba is arranged in a direction directly below the power-supply line 112B, with one or more wiring layers being interposed therebetween. That is, the distance between the overlapping portion 213Ba and the power-supply line 112B is larger than the corresponding distance in the first embodiment. Specifically, a distance d2 illustrated in FIG. 11 is larger than the distance d2 illustrated in FIG. 7. In the cross-section illustrated in FIG. 11, d1<d2 is satisfied.

This makes it possible to further reduce capacitive coupling due to parasitic capacitances between the power-supply line 112B and the output signal lines 213A and 213B. Accordingly, it is possible to reduce the amount of noise that is introduced from the power-supply line 112B to the output signal lines 213A and 213B.

Figure 12A:
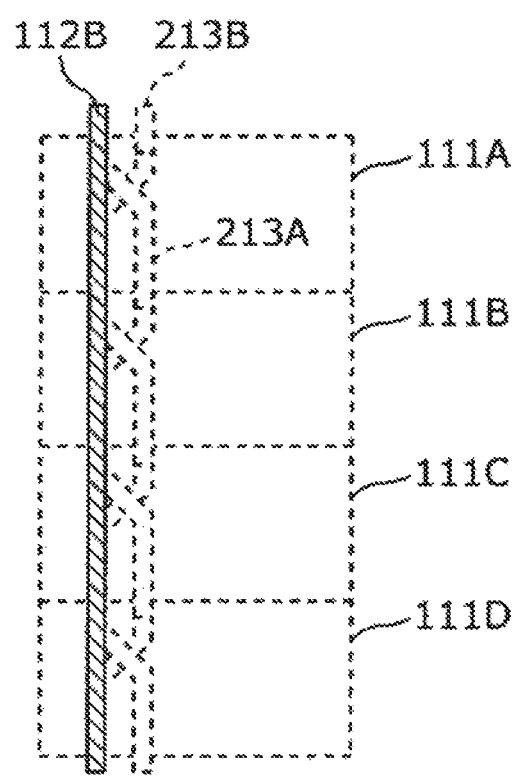
FIG. 12A is a plan view illustrating another example of the exemplary layout structure of the power-supply line according to the second embodiment.
Figure 12B:
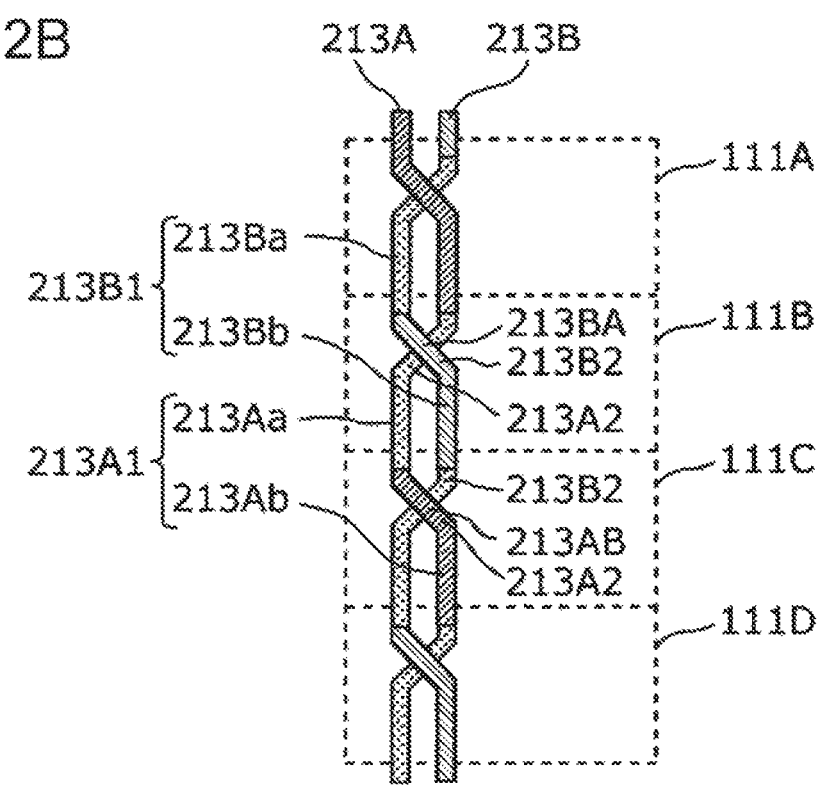
FIG. 12B is a plan view illustrating another example of the exemplary layout structure of the signal lines according to the second embodiment.

As in the modification of the first embodiment, the output signal lines 213A and 213B may intersect each other obliquely, as illustrated in FIGS. 12A and 12B. A specific cross-sectional configuration is analogous to that in the second embodiment, and a specific plan layout is analogous to that in the modification of the first embodiment.

Third Embodiment

Next, a description will be given of a third embodiment. In the third embodiment, the shapes of the power-supply line and the output signal lines differ compared with the first embodiment. Hereinafter, points that differ from the first embodiment will be mainly described, and descriptions of common points will be omitted or briefly given.

Figure 13A:
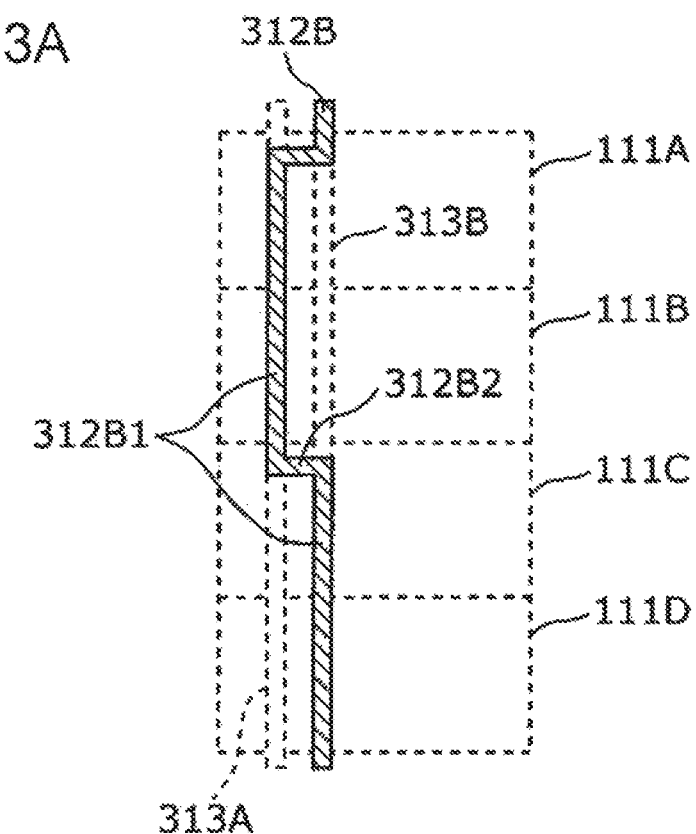
FIG. 13A is a plan view illustrating an exemplary layout structure of a power-supply line according to a third embodiment.
Figure 13B:
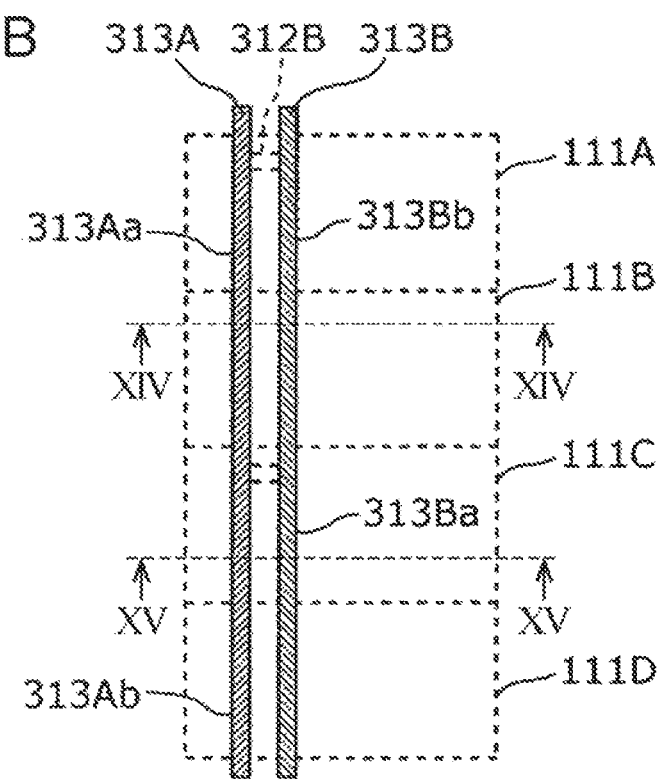
FIG. 13B is a plan view illustrating an exemplary layout structure of signal lines according to the third embodiment.
Figure 14:
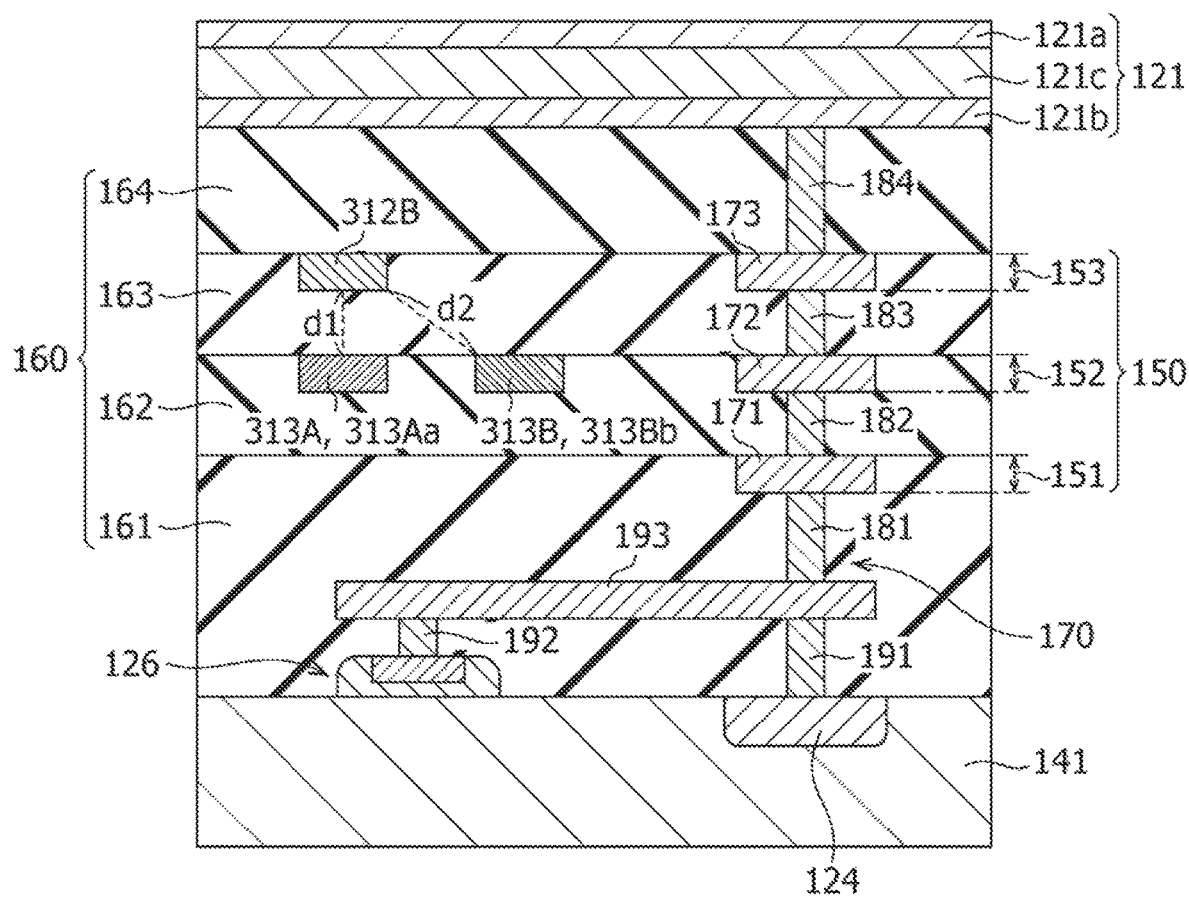
FIG. 14 is a sectional view illustrating an exemplary cross-sectional structure of signal lines, a power-supply line, and FD wires according to the third embodiment, taken along line XIV-XIV in FIG. 13B.
Figure 15:
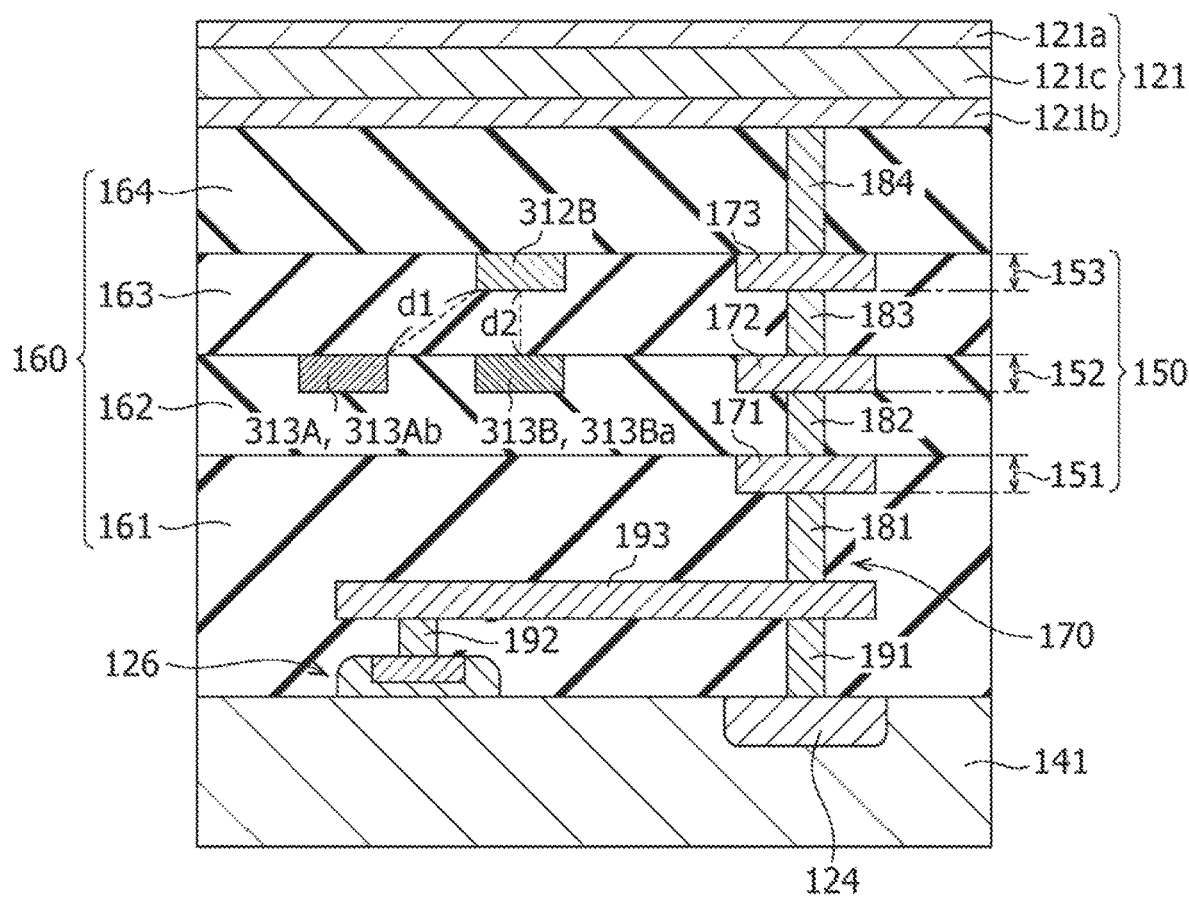
FIG. 15 is a sectional view illustrating an exemplary cross-sectional structure of signal lines, a power-supply line, and FD wires according to the third embodiment, taken along line XV-XV in FIG. 13B.

FIG. 13A is a plan view illustrating an exemplary layout structure of a power-supply line 312B according to the present embodiment. FIG. 13B is a plan view schematically illustrating a layout structure of output signal lines 313A and 313B according to the present embodiment. FIGS. 14 and 15 are sectional views illustrating an exemplary cross-sectional structure of the output signal lines 313A and 313B, the power-supply line 312B, and the FD wires 170 according to the present embodiment. FIG. 14 illustrates a cross-section along line XIV-XIV in FIG. 13B. FIG. 15 illustrates a cross-section along line XV-XV in FIG. 13B.

The power-supply line 312B and the output signal lines 313A and 313B according to the present embodiment respectively correspond to the power-supply line 112B and the output signal lines 113A and 113B according to the first embodiment and are the same in functions and so on except for different shapes.

In the present embodiment, as illustrated in FIG. 13A, the power-supply line 312B meanders in plan view. Specifically, in plan view, the power-supply line 312B meanders in a polygonal chain shape, and the bending angle thereof is a right angle. In the example illustrated in FIG. 13A, the period of the meander of the power-supply line 312B corresponds to four pixels. The period of the meander may correspond to one pixel or two pixels. The period of the meander refers to the length of a repetition unit having the same shape along the column direction when the power-supply line is traced in the column direction.

Specifically, the power-supply line 312B has an extension portion 312B1 that extends in the column direction and a plurality of connection portions 312B2 that extends in a direction different from the column direction. Both ends of each of the connection portions 312B2 are connected to the extension portion 312B1. More specifically, the extension portion 312B1 includes a plurality of first portions and a plurality of second portions, and the connection portion 312B2 is arranged between the first portion and the second portion that are adjacent to each other when the power-supply line 312B is traced in the direction in which it extends. That is, the connection portion 312B2 is one example of a third portion having one end connected to a first portion that extends in the column direction and another end connected to a second portion that extends in the column direction. As illustrated in FIG. 13A, the angle formed by the extension portion 312B1 and the connection portion 312B2 is a right angle. Also, the first portion and the second portion that constitute the extension portion 312B1 respectively correspond to line segments each having a length corresponding to about two pixels.

The power-supply line 312B overlaps the output signal lines 313A and 313B. In FIG. 13A, contour lines of the output signal lines 313A and 313B in plan view are denoted by dashed lines.

As illustrated in FIG. 13B, each of the output signal lines 313A and 313B extends linearly along the column direction. Specifically, each of the output signal lines 313A and 313B extends linearly through the plurality of pixels 111A, 111B, 111C, and 111D. The output signal lines 313A and 313B are parallel to each other. As illustrated in FIGS. 14 and 15, the output signal lines 313A and 313B are at the same height from the semiconductor substrate 141 and are included in the wiring layer 152.

The output signal line 313A has an overlapping portion 313Aa and a non-overlapping portion 313Ab. The overlapping portion 313Aa is one example of a first overlapping portion that overlaps the power-supply line 312B in plan view. The non-overlapping portion 313Ab is one example of a first non-overlapping portion that does not overlap the power-supply line 312B in plan view. In the present embodiment, the overlapping portion 313Aa and the non-overlapping portion 313Ab are alternately aligned in a line.

Similarly, the output signal line 313B has an overlapping portion 313Ba and a non-overlapping portion 313Bb. The overlapping portion 313Ba is one example of a second overlapping portion that overlaps the power-supply line 312B in plan view. The non-overlapping portion 313Bb is one example of a second non-overlapping portion that does not overlap the power-supply line 312B in plan view. In the present embodiment, the overlapping portion 313Ba and the non-overlapping portion 313Bb are alternately aligned in a line.

In the above-described configuration, at the position denoted by line XIV-XIV in FIG. 13B, the power-supply line 312B and the output signal line 313A overlap each other in plan view, and the power-supply line 312B and the output signal line 313B do not overlap each other in plan view. Specifically, as illustrated in FIG. 14, the output signal line 313A is located at a position closer to the power-supply line 312B than the output signal line 313B. That is, in the cross-section illustrated in FIG. 14, d1<d2 is satisfied.

On the other hand, at the position denoted by line XV-XV in FIG. 13B, the power-supply line 312B and the output signal line 313B overlap each other in plan view, and the power-supply line 312B and the output signal line 313A do not overlap each other in plan view. Specifically, as illustrated in FIG. 15, the output signal line 313B is located at a position closer to the power-supply line 312B than the output signal line 313A. That is, in the cross-section illustrated in FIG. 15, d1>d2 is satisfied.

As described above, the power-supply line 312B meanders on or above the output signal lines 313A and 3138 and alternately overlaps the output signal lines 313A and 313B. Thus, the output signal line 313A alternately repeats approaching and receding from the power-supply line 312B. Similarly, the output signal line 313B alternately repeats approaching and receding from the power-supply line 312B.

This makes it possible to substantially equalize capacitive coupling due to parasitic capacitances between the power-supply line 312B and the output signal line 313A and capacitive coupling due to parasitic capacitances between the power-supply line 312B and the output signal line 313B. As a result, it is possible to substantially equalize the amounts of noise introduced into the output signal lines 313A and 313B by influences of the power-supply line 312B. Accordingly, advantages that are analogous to those in the first embodiment are obtained.

[Modification]

The shape of the power-supply line 312B is not limited to the example illustrated in FIG. 13A. For example, as illustrated in FIGS. 16A and 16B, the period of the meander of the power-supply line 312B may be a period corresponding to about two pixels.

Figure 16A:
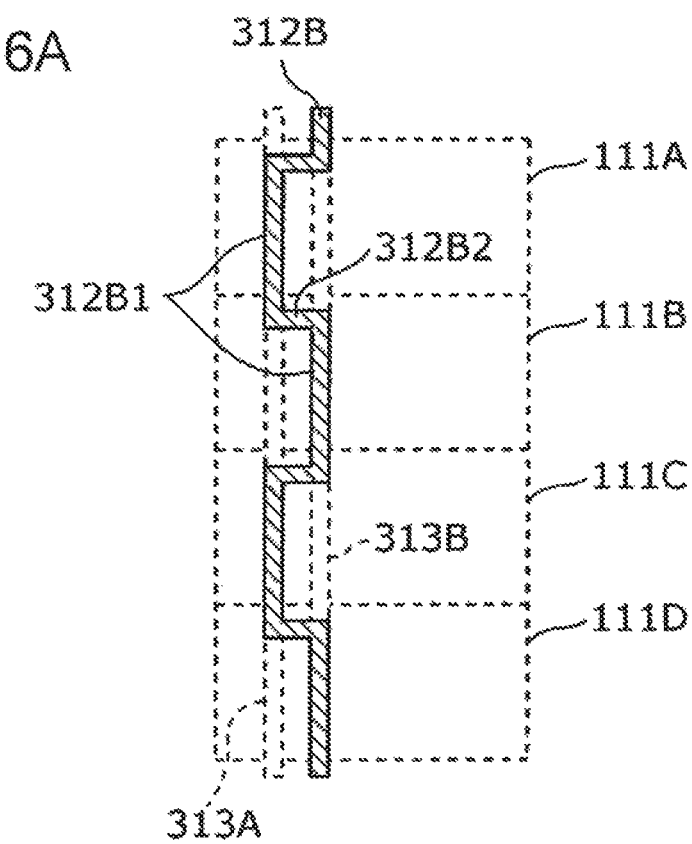
FIG. 16A is a plan view illustrating another example of the exemplary layout structure of the power-supply line according to the third embodiment.

FIG. 16A is a plan view illustrating an exemplary layout structure of the power-supply line 312B according to a modification. FIG. 16B is a plan view illustrating an exemplary layout structure of the output signal lines 313A and 313B according to this modification.

For example, as illustrated in FIG. 16A, the extension portion 312B1 of the power-supply line 312B includes a first portion and a second portion each having a length corresponding to about one pixel, and the connection portion 312B2 is arranged between the first portion and the second portion that are adjacent to each other. The connection portion 312B2 is arranged for each pixel.

Figure 16B:
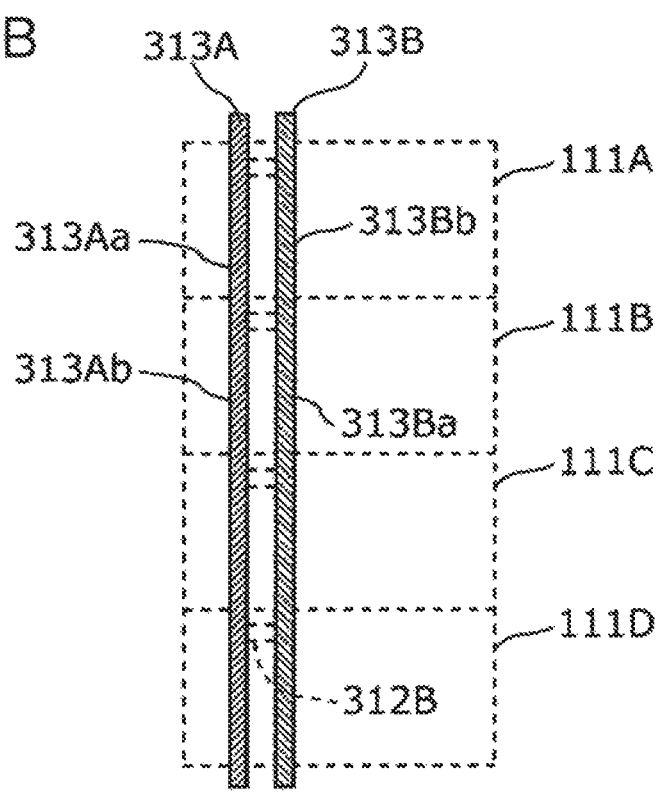
FIG. 16B is a plan view illustrating another example of the exemplary layout structure of the signal lines according to the third embodiment.

Since the period of the meander of the power-supply line 312B is a period corresponding to about two pixels, the overlapping portion 313Aa and the non-overlapping portion 313Ab of the output signal line 313A are alternately arranged every pixel, as illustrated in FIG. 16B. Similarly, the overlapping portion 313Ba and the non-overlapping portion 313Bb of the output signal line 313B are alternately arranged every pixel.

Figure 17A:
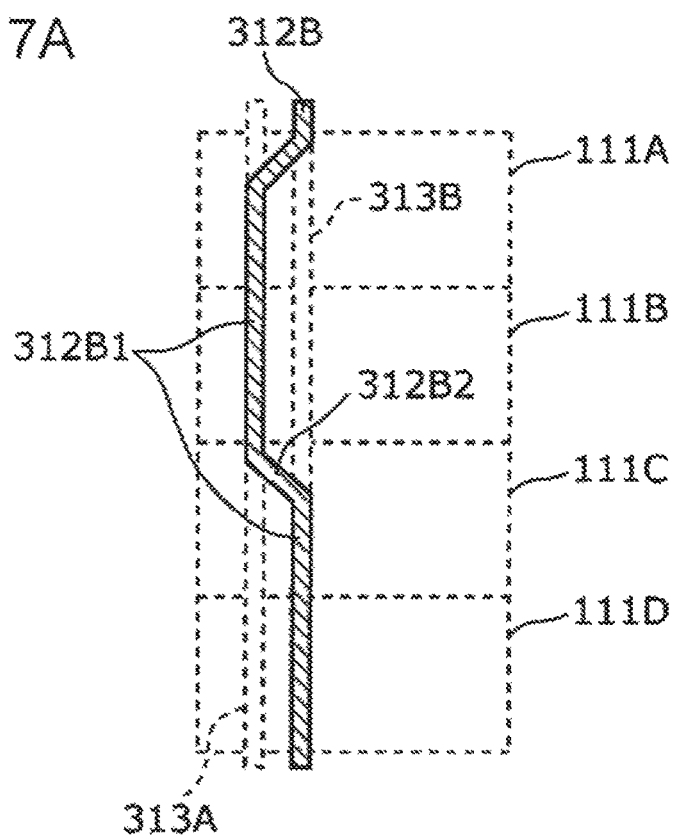
FIG. 17A is a plan view illustrating another example of the exemplary layout structure of the power-supply line according to the third embodiment.
Figure 17B:
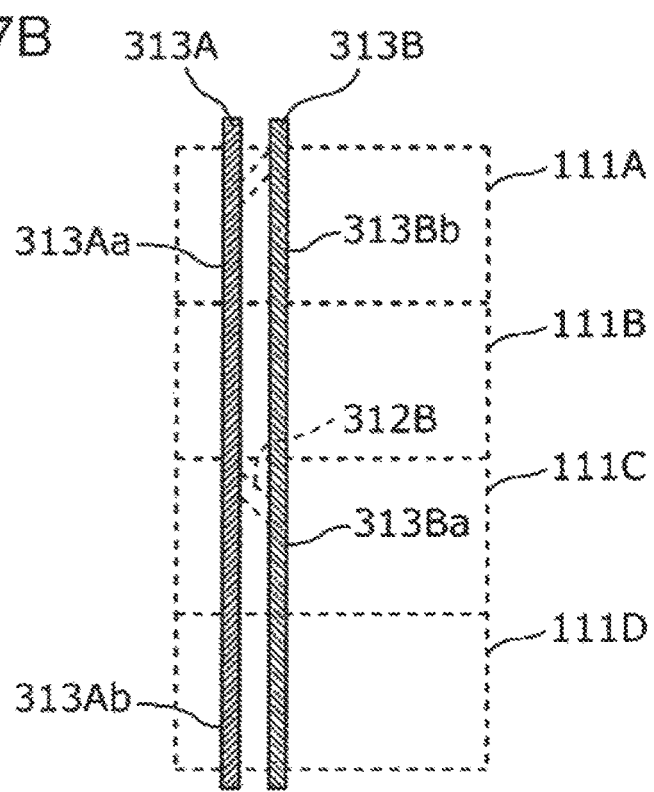
FIG. 17B is a plan view illustrating another example of the exemplary layout structure of the signal lines according to the third embodiment.
Figure 18A:
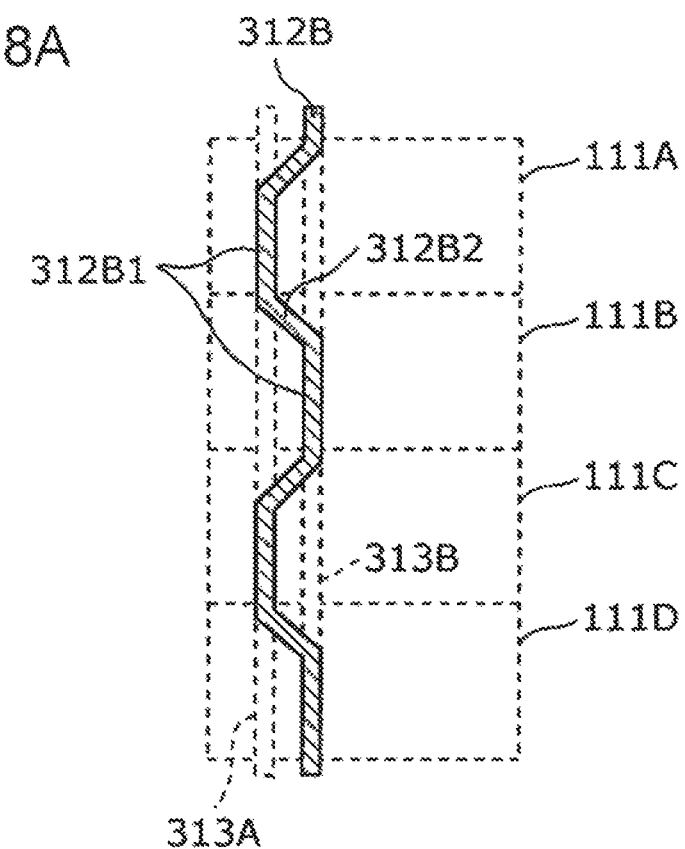
FIG. 18A is a plan view illustrating another example of the exemplary layout structure of the power-supply line according to the third embodiment.
Figure 18B:
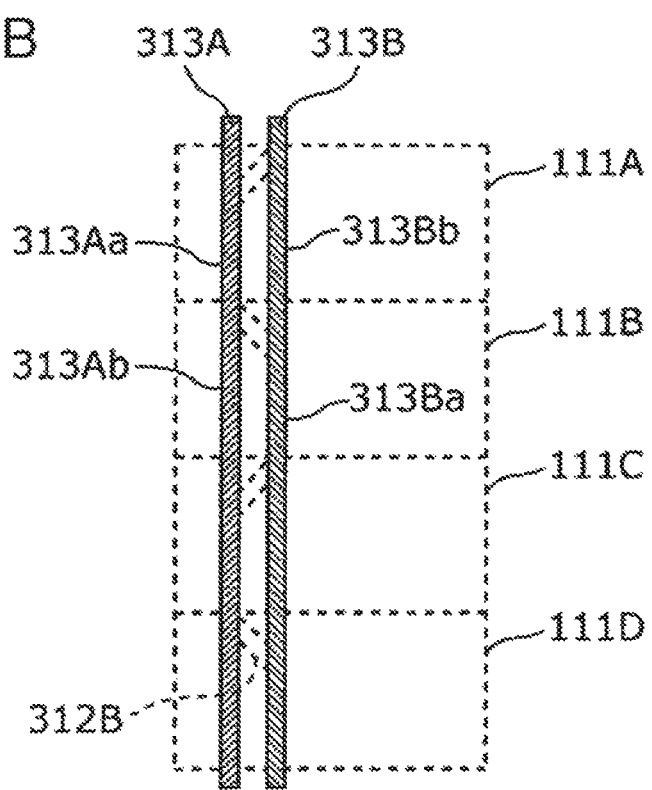
FIG. 18B is a plan view illustrating another example of the exemplary layout structure of the signal lines according to the third embodiment.

As illustrated in FIGS. 17A and 17B, the power-supply line 312B may include a diagonally wired line. Specifically, the angle formed by the connection portion 312B2 and the extension portion 312B1 may be an obtuse angle. When the power-supply line 312E includes a diagonally wired line, the period of the meander of the power-supply line 312B may be a period corresponding to about two pixels, as illustrated in FIGS. 18A and 18B. A specific cross-sectional configuration in this modification is similar to that in the second embodiment.

Fourth Embodiment

Next, a description will be given of a fourth embodiment. In the fourth embodiment, the shapes of the power-supply line and the output signal lines differ compared with the third embodiment. Hereinafter, points that differ from the third embodiment will be mainly described, and descriptions of common points will be omitted or briefly given ion.

Figure 19A:
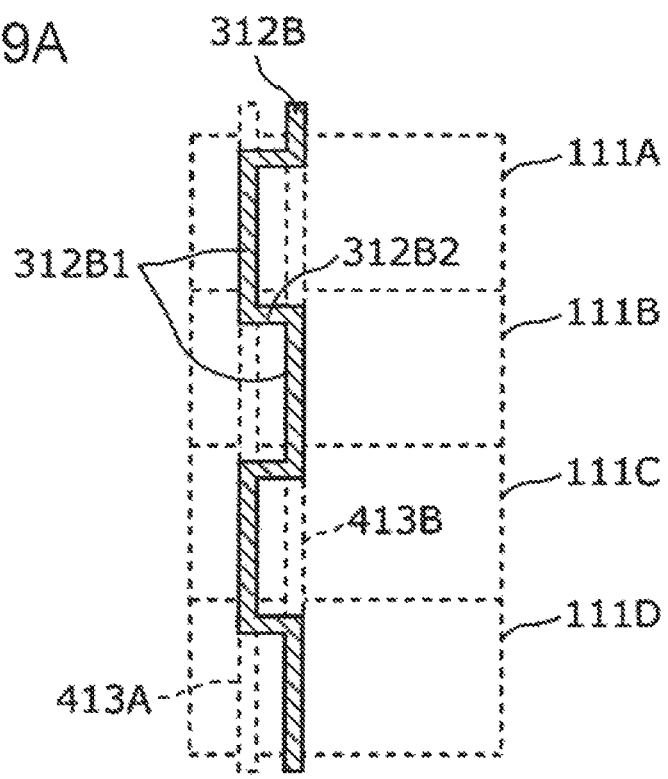
FIG. 19A is a plan view illustrating an exemplary layout structure of a power-supply line according to a fourth embodiment.
Figure 19B:
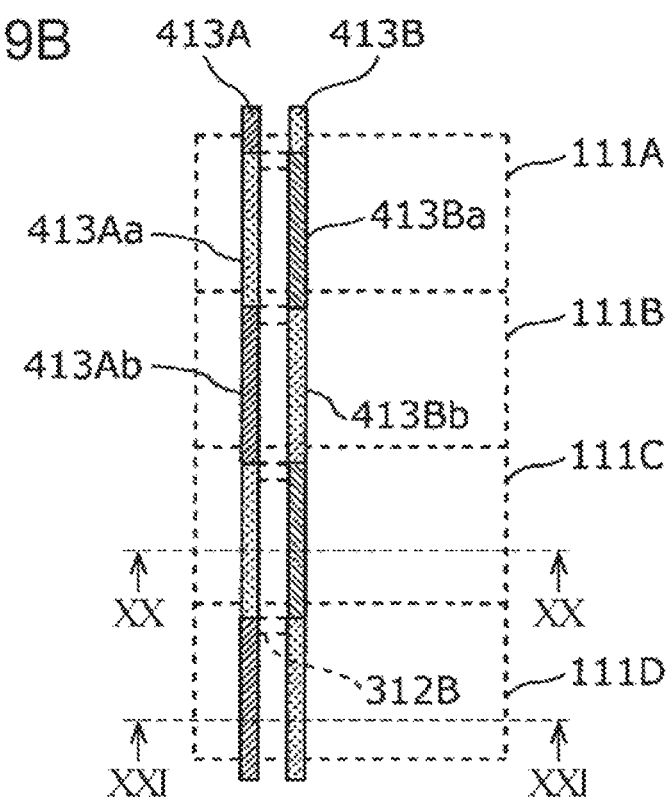
FIG. 19B is a plan view illustrating an exemplary layout structure of signal lines according to the fourth embodiment.
Figure 20:
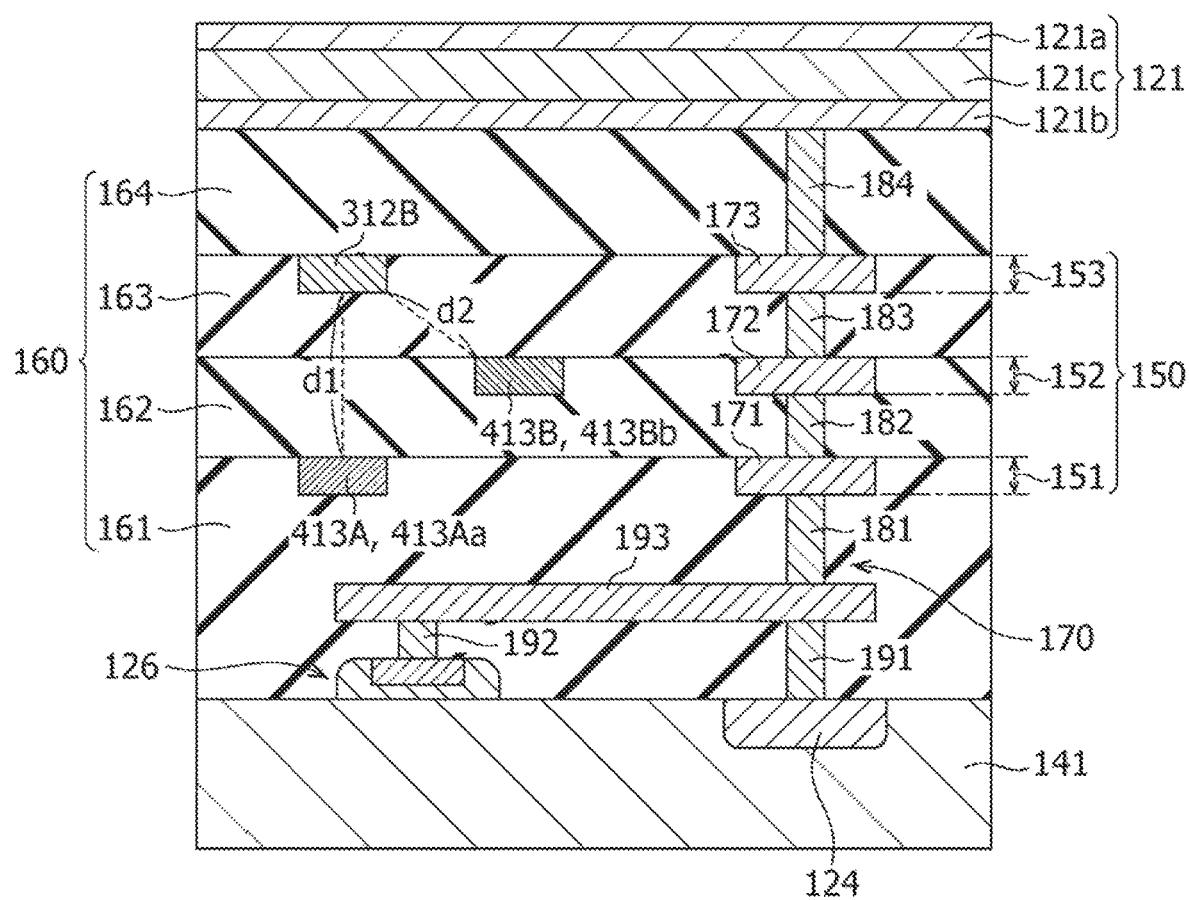
FIG. 20 is a sectional view illustrating an exemplary cross-sectional structure of signal lines, a power-supply line, and FD wires according to the fourth embodiment, taken along line XX-XX in FIG. 19B.
Figure 21:
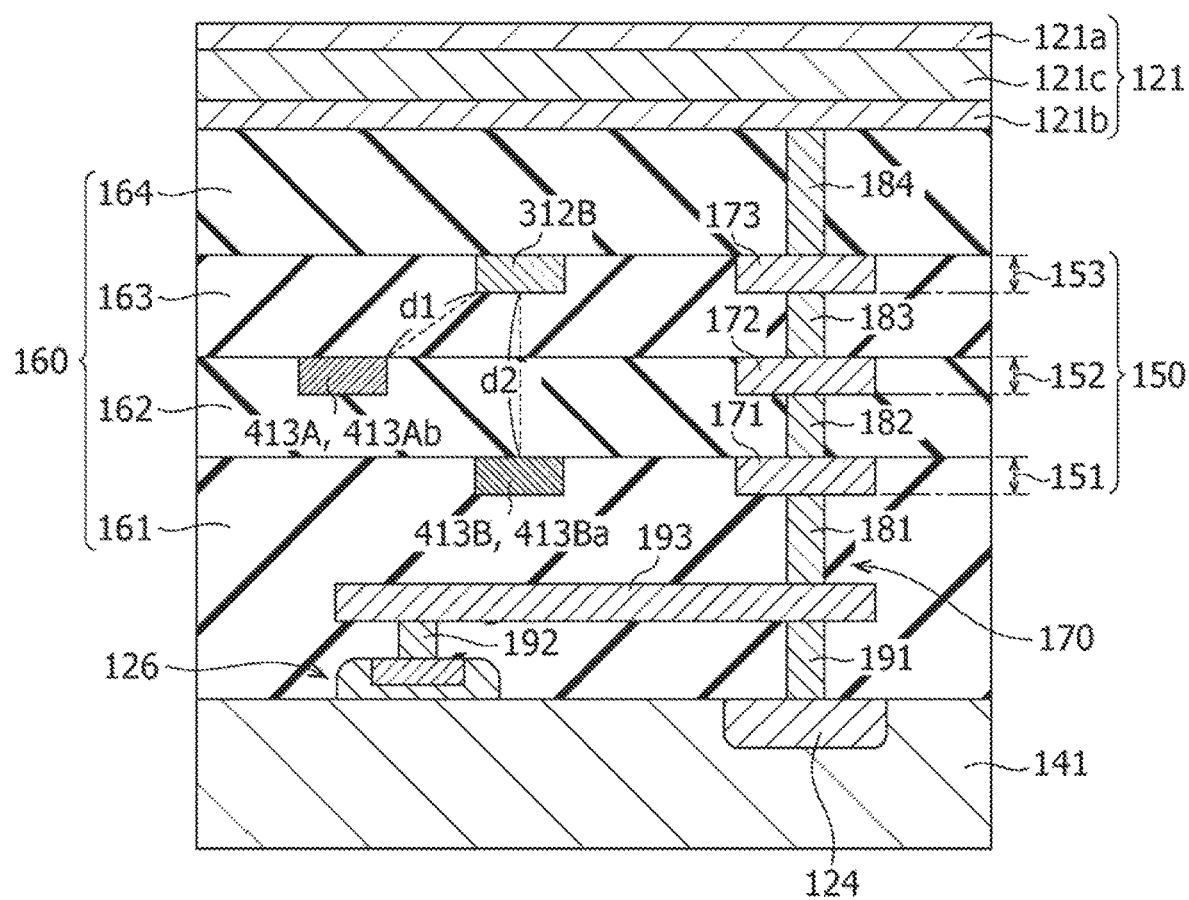
FIG. 21 is a sectional view illustrating an exemplary cross-sectional structure of signal lines, a power-supply line, and FD wires according to the fourth embodiment, taken along line XXI-XXI in FIG. 19B.

FIG. 19A is a plan view illustrating an exemplary layout structure of the power-supply line 312B according to the present embodiment. FIG. 19B is a plan view illustrating an exemplary layout structure of output signal lines 413A and 413B according to the present embodiment. FIGS. 20 and 21 are sectional views illustrating an exemplary cross-sectional structure of the output signal lines 413A and 413B, the power-supply line 312B, and the FD wires 170 according to the present embodiment. FIG. 20 illustrates a cross-section along line XX-XX in FIG. 19B. FIG. 21 illustrates a cross-section along line XXI-XXI in FIG. 19B.

In the present embodiment, as illustrated in FIG. 19A, the power-supply line 312B meanders in a polygonal chain shape, as in the modification of the third embodiment. Although an example in which the period of the meander of the power-supply line 312B is a period corresponding to about two pixels is described in this case, the period of the meander may be a period corresponding to one pixel or four pixels and is not particularly limiting.

The output signal lines 413A and 413B according to the present embodiment respectively correspond to the output signal lines 313A and 313B according to the third embodiment and are the same in functions and so on except for different shapes. A layout of the output signal lines 413A and 413B in plan view is substantially the same as the layout of the output signal lines 313A and 313B according to the third embodiment.

For example, an overlapping portion 413Aa and a non-overlapping portion 413Ab of the output signal line 413A respectively correspond to the overlapping portion 313Aa and the non-overlapping portion 313Ab of the output signal line 313A according to the modification (illustrated in FIG. 16B) of the third embodiment. In the present embodiment, the height at which the overlapping portion 413Aa is located is different from the height at which the overlapping portion 313Aa according to the third embodiment is located.

Also, for example, an overlapping portion 413Ba and a non-overlapping portion 413Bb of the output signal line 413B respectively correspond to the overlapping portion 313Ba and the non-overlapping portion 313Bb of the output signal line 313B according to the modification (illustrated in FIG. 16B) of the third embodiment. In the present embodiment, the height at which the overlapping portion 413Ba is located is different from the height at which the overlapping portion 313Ba according to the third embodiment is located.

Specifically, each of the output signal lines 413A and 413B is arranged through the plurality of wiring layers 150. Specifically, the output signal lines 413A and 413B are included in the wiring layers 151 and 152, respectively.

As illustrated in FIG. 20, the overlapping portion 413Aa of the output signal line 413A is farther from the power-supply line 312B than the non-overlapping portion 413Bb of the output signal line 413B in the direction perpendicular to the semiconductor substrate 141. Specifically, the overlapping portion 413Aa is included in the wiring layer 151. The non-overlapping portion 413Bb is included in the wiring layer 152. Thus, the overlapping portion 413Aa is arranged in a direction directly below the power-supply line 312B, with one or more wiring layers being interposed therebetween. That is, the distance between the overlapping portion 413Aa and the power-supply line 312B is larger than the distance in the third embodiment. Specifically, a distance d1 illustrated in FIG. 20 is larger than the distance d1 illustrated in FIG. 14. In the cross-section illustrated in FIG. 20, d1>d2 is satisfied.

In the present embodiment, when the output signal line 413A is traced in the column direction, the overlapping portion 413Aa included in the wiring layer 151 and the non-overlapping portion 413Ab included in the wiring layer 152 are alternately arranged. That is, the output signal line 413A meanders in up-and-down directions.

Similarly, as illustrated in FIG. 21, the overlapping portion 413Ba of the output signal line 413B is farther from the power-supply line 312B than the non-overlapping portion 413Ab of the output signal line 413B in the direction perpendicular to the semiconductor substrate 141. Specifically, the overlapping portion 413Ba is included in the wiring layer 151. The non-overlapping portion 413Ab is included in the wiring layer 152. Thus, the overlapping portion 413Ba is located in a direction directly below the power-supply line 312B, with one or more wiring layers being interposed therebetween. That is, the distance between the overlapping portion 413Ba and the power-supply line 312B is larger than the distance in the third embodiment. Specifically, a distance d2 illustrated in FIG. 21 is larger than the distance d2 illustrated in FIG. 15. In the cross-section illustrated in FIG. 21, d1<d2 is satisfied.

In the present embodiment, when the output signal line 413B is traced in the column direction, the overlapping portion 413Ba included in the wiring layer 151 and the non-overlapping portion 413Bb included in the wiring layer 152 are alternately arranged. That is, the output signal line 413B meanders in up-and-down directions.

This makes it possible to further reduce capacitive coupling due to parasitic capacitances between the power-supply line 312B and the output signal lines 413A and 413B. Accordingly, it is possible to reduce the amount of noise that is introduced from the power-supply line 312B to the output signal lines 413A and 413B.

Fifth Embodiment

Next, a description will be given of a fifth embodiment. In the fifth embodiment, the shape of the power-supply line differs compared with the first embodiment. Specifically, a description in the present embodiment will be given of a configuration obtained by combining the first and third embodiments. Hereinafter, points that differ from the first or third embodiment will be mainly described, and descriptions of common points will be omitted or briefly given.

Figure 22A:
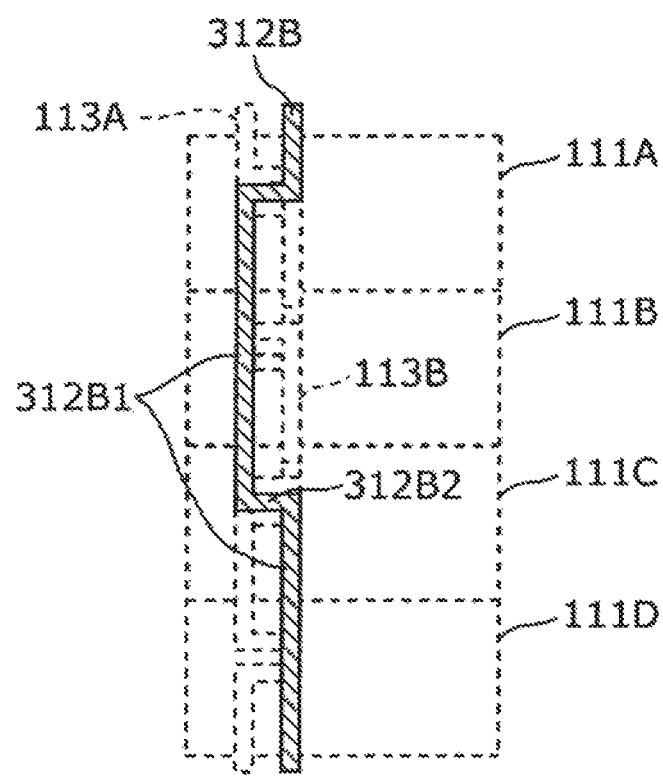
FIG. 22A is a plan view illustrating an exemplary layout structure of a power-supply line according to a fifth embodiment.
Figure 22B:
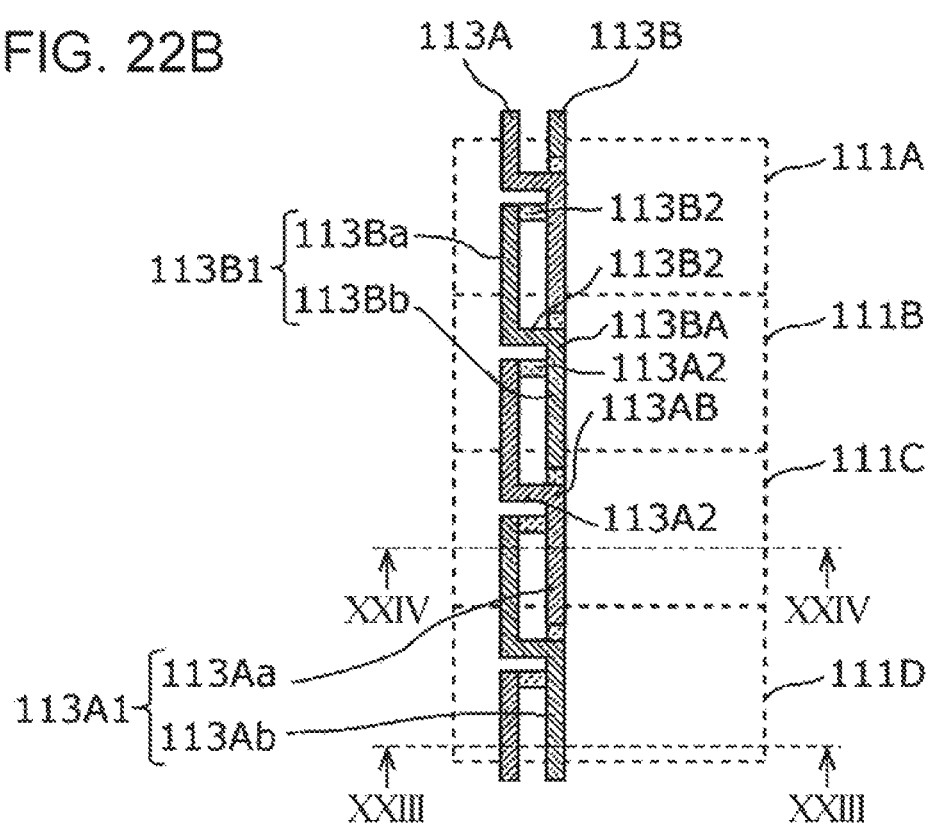
FIG. 22B is a plan view illustrating an exemplary layout structure of signal lines according to the fifth embodiment.
Figure 23:
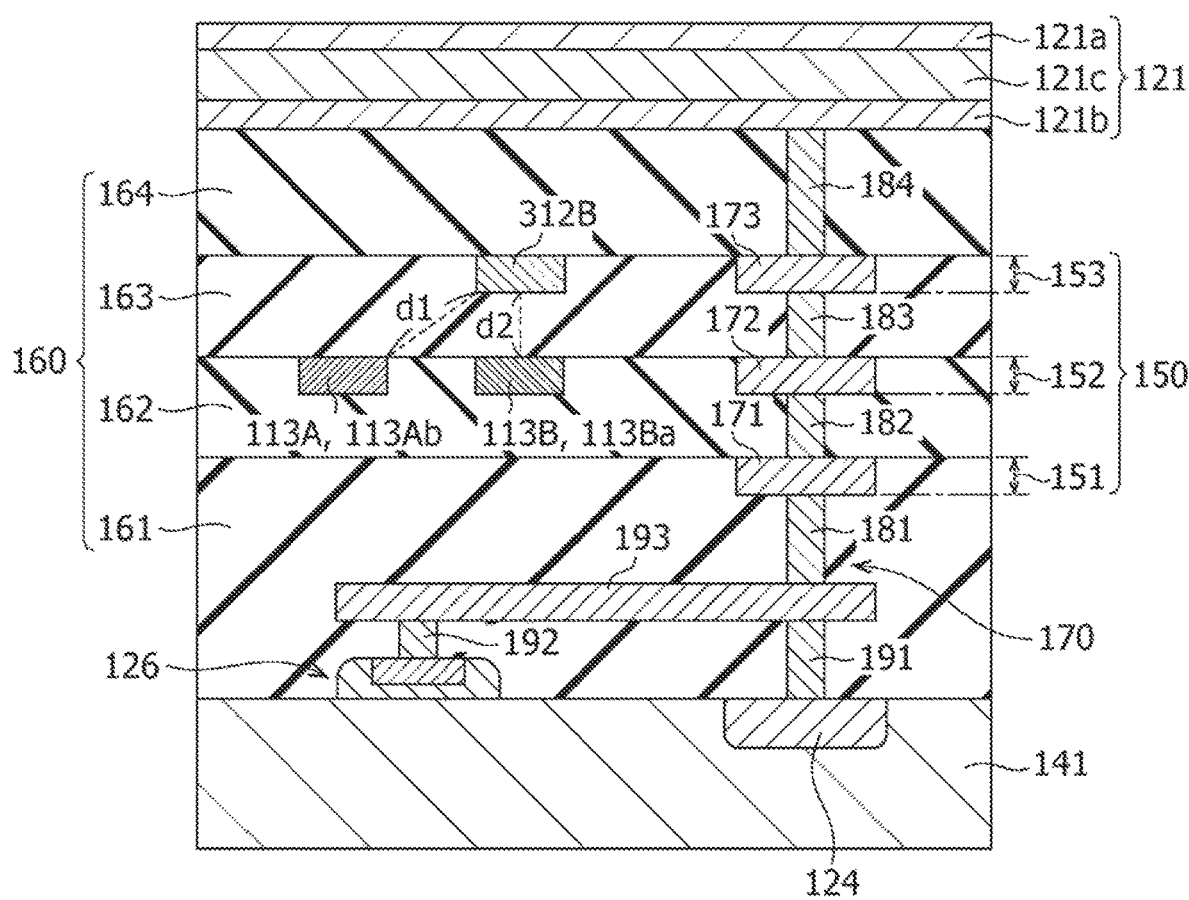
FIG. 23 is a sectional view illustrating an exemplary cross-sectional structure of signal lines, a power-supply line, and FD wires according to the fifth embodiment, taken along line XXIII-XXIII in FIG. 22B.
Figure 24:
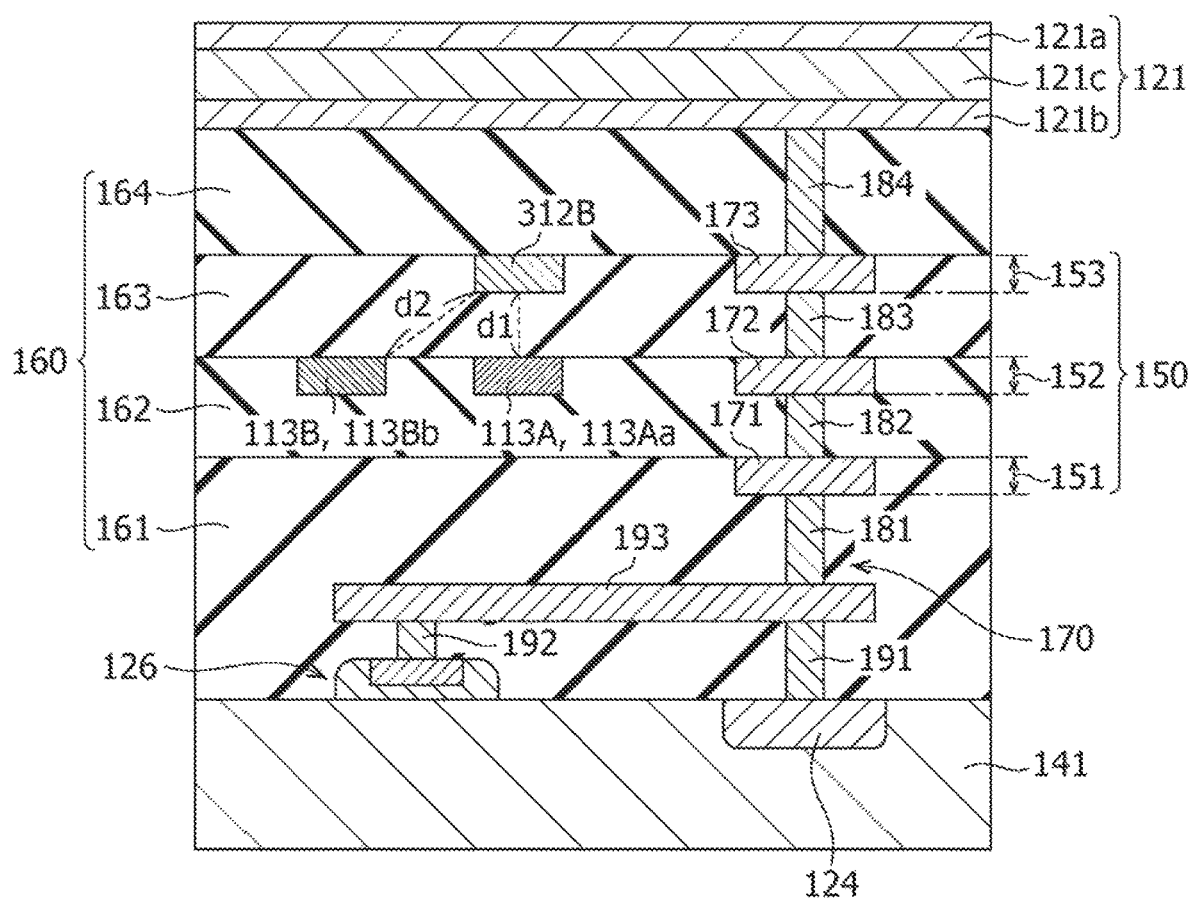
FIG. 24 is a sectional view illustrating an exemplary cross-sectional structure of the signal lines, the power-supply line, and the FD wires according to the fifth embodiment, taken along line XXIV-XXIV in FIG. 22B.

FIG. 22A is a plan view illustrating an exemplary layout structure of the power-supply line 312B according to the present embodiment. FIG. 22B is a plan view illustrating an exemplary layout structure of the output signal lines 113A and 113B according to the present embodiment. FIGS. 23 and 24 are sectional views illustrating an exemplary cross-sectional structure of the output signal lines 113A and 113B, the power-supply line 312B, and the FD wires 170 according to the present embodiment. FIG. 23 illustrates a cross-section along line XXIII-XXIII in FIG. 22B. FIG. 24 illustrates a cross-section along line XXIV-XXIV in FIG. 22B.

In the present embodiment, as illustrated in FIGS. 22A and 22B, each of the power-supply line 312B and the output signal lines 113A and 113B meanders in a polygonal chain shape in plan view. For example, the period of the meander of the power-supply line 312B is a period corresponding to about four pixels. The period of the meander of each of the output signal lines 113A and 113B is a period corresponding to about two pixels.

In the present embodiment, at the position denoted by line XXIII-XXIII in FIG. 22B, the power-supply line 312B and the output signal line 113B overlap each other in plan view, and the power-supply line 312B and the output signal line 113A do not overlap each other in plan view, as illustrated in FIG. 23. Specifically, the output signal line 113B is located at a position closer to the power-supply line 312B than the output signal line 113A. That is, in the cross-section illustrated in FIG. 23, d1>d2 is satisfied.

On the other hand, at the position denoted by line XXIV-XXIV in FIG. 22B, the power-supply line 312B and the output signal line 113A overlap each other in plan view, and the power-supply line 312B and the output signal line 113B do not overlap each other in plan view, as illustrated in FIG. 24. Specifically, the output signal line 113A is located at a position closer to the power-supply line 312B than the output signal line 113B. That is, in the cross-section illustrated in FIG. 24, d1<d2 is satisfied.

The output signal lines 113A and 113B alternately interchange their positions, as described above, to thereby repeat approaching and receding from the power-supply line 312B that is meandering. This makes it possible to substantially equalize capacitive coupling due to parasitic capacitances between the power-supply line 312B and the output signal line 113A and capacitive coupling due to parasitic capacitances between the power-supply line 312B and the output signal line 113B. As a result, it is possible to substantially equalize the amounts of noise introduced into the output signal lines 113A and 113B by influences of the power-supply line 312B. Accordingly, advantages that are analogous to those in the third embodiment are obtained.

Sixth Embodiment

Next, a description will be given of a sixth embodiment. In the sixth embodiment, the shapes of the power-supply line and the output signal lines differ compared with the fifth embodiment. Hereinafter, points that differ from the fifth embodiment will be mainly described, and descriptions of common points will be omitted or briefly given.

Figure 25A:
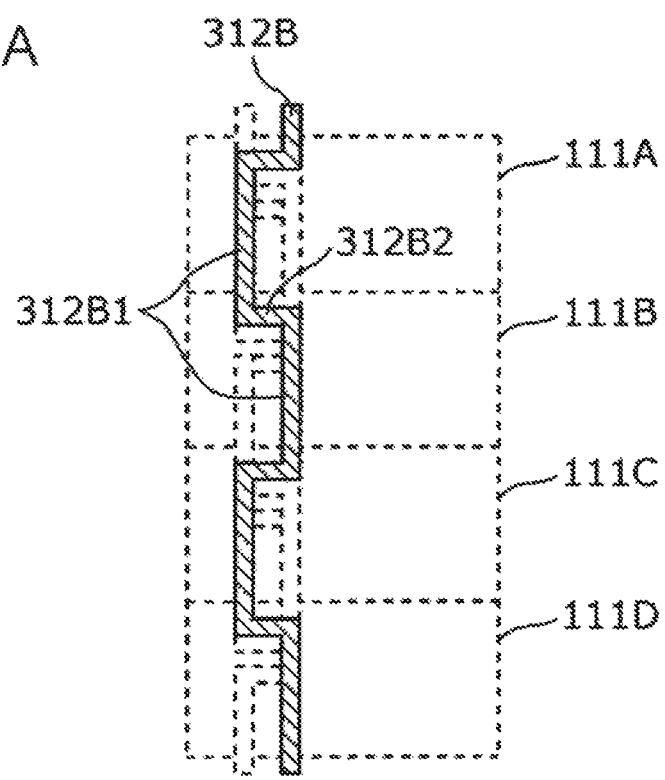
FIG. 25A is a plan view illustrating an exemplary layout structure of a power-supply line according to a sixth embodiment.
Figure 25B:
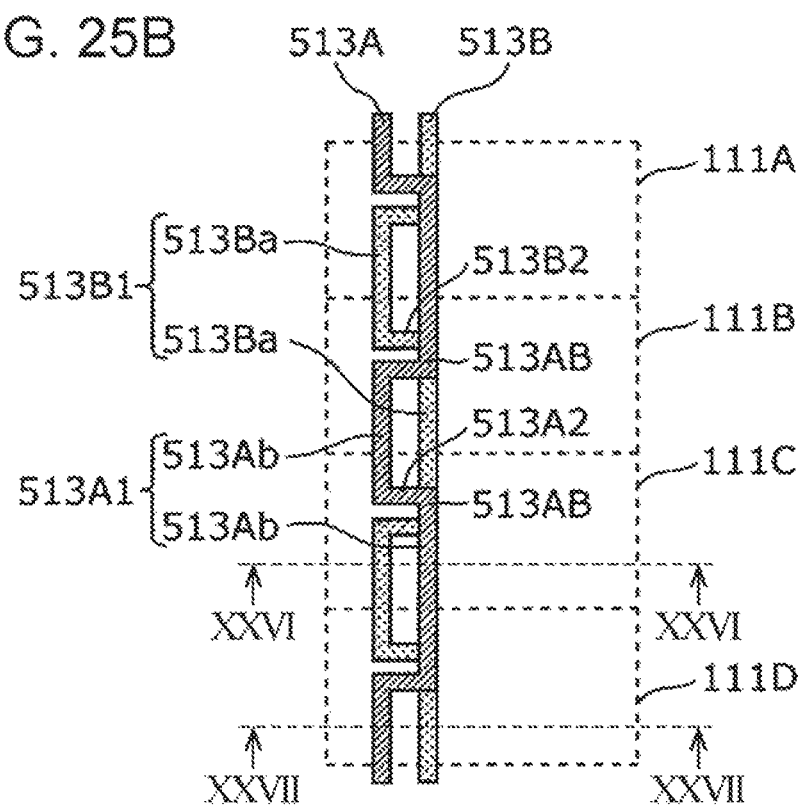
FIG. 25B is a plan view illustrating an exemplary layout structure of signal lines according to the sixth embodiment.
Figure 26:
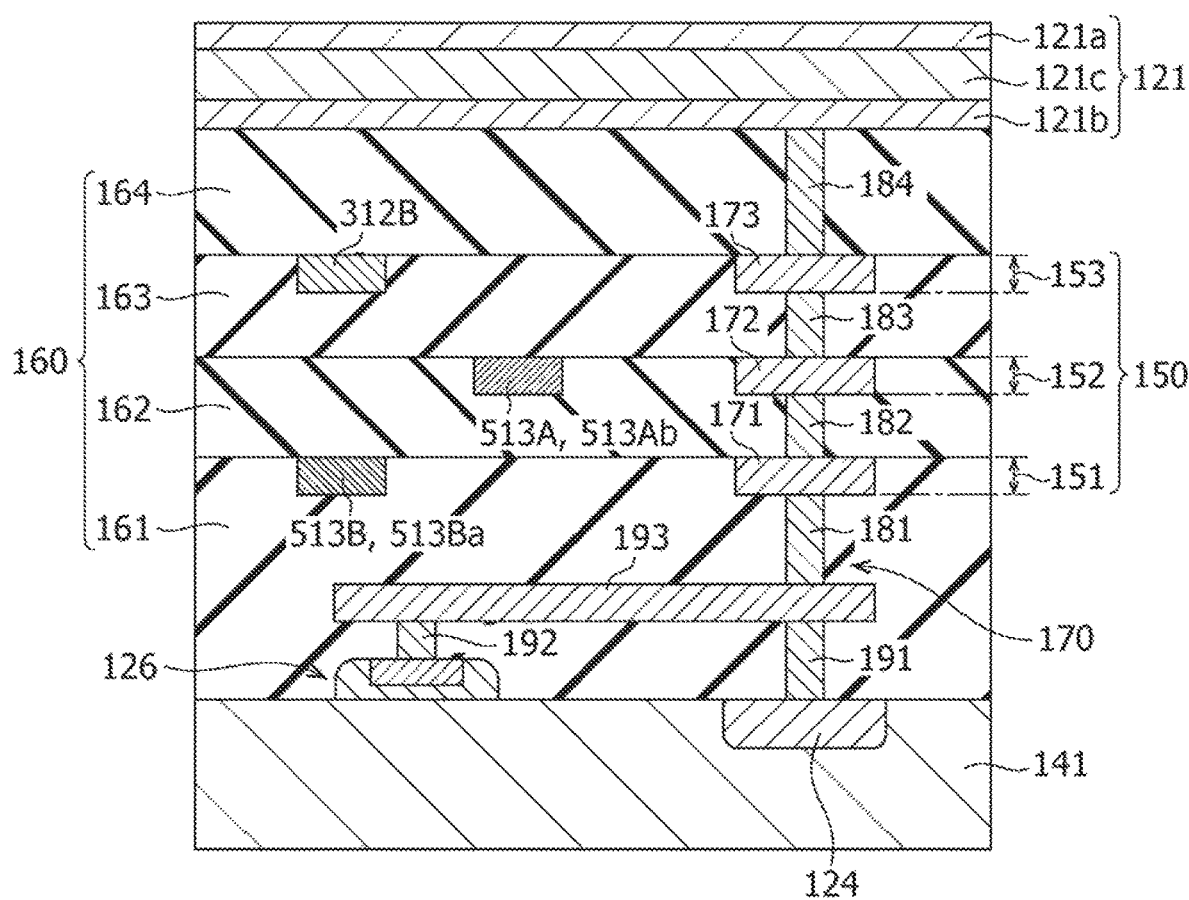
FIG. 26 is a sectional view illustrating an exemplary cross-sectional structure of signal lines, a power-supply line, and FD wires according to the sixth embodiment, taken along line XXVI-XXVI in FIG. 25B.
Figure 27:
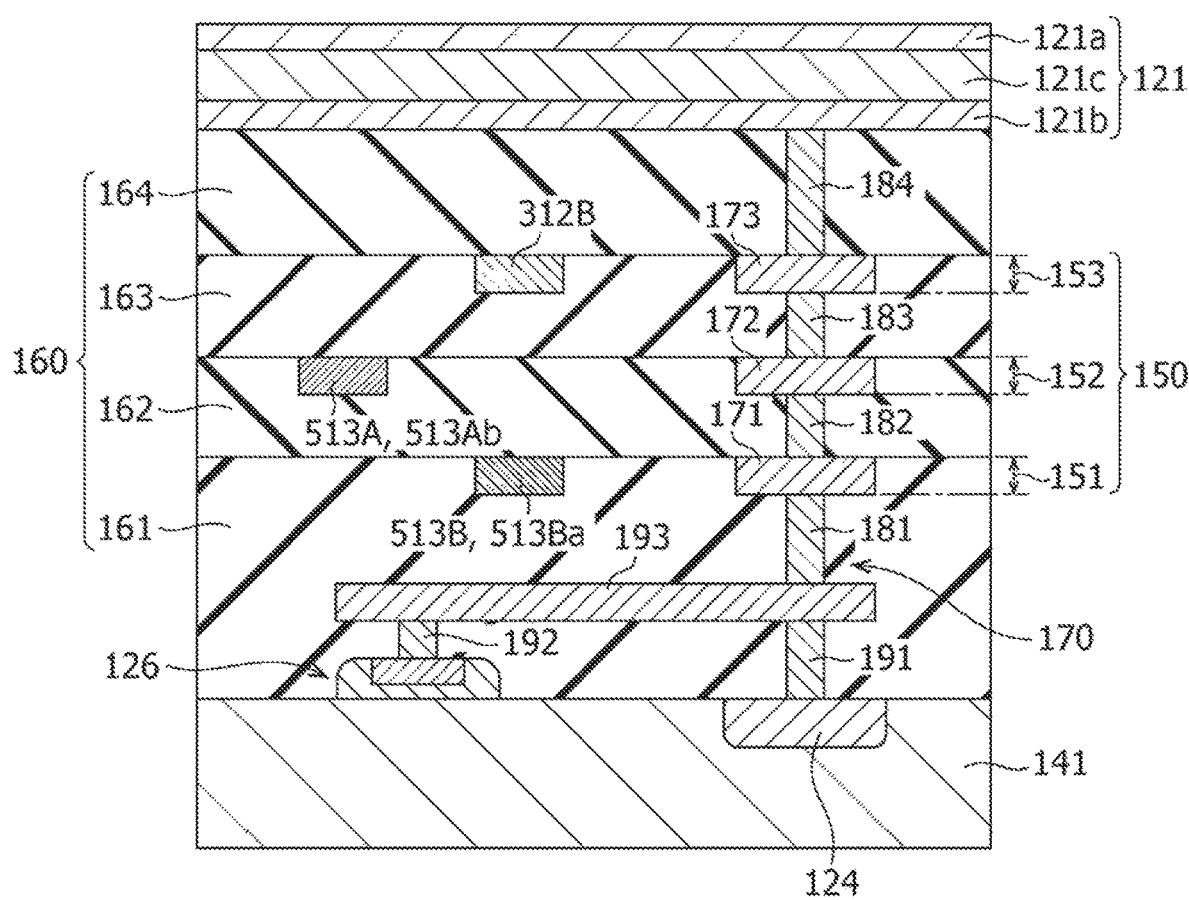
FIG. 27 is a sectional view illustrating an exemplary cross-sectional structure of the signal lines, the power-supply line, and the FD wires according to the sixth embodiment, taken along line XXVII-XXVII in FIG. 25B.

FIG. 25A is a plan view illustrating an exemplary layout structure of the power-supply line 312B according to the present embodiment. FIG. 25B is a plan view illustrating an exemplary layout structure of output signal lines 513A and 513B according to the present embodiment. FIGS. 26 and 27 are sectional views illustrating an exemplary cross-sectional structure of the output signal lines 513A and 513B, the power-supply line 312B, and the FD wires 170 according to the present embodiment. FIG. 26 illustrates a cross-section along line XXVI-XXVI in FIG. 25B. FIG. 27 illustrates a cross-section along line XXVII-XXVII in FIG. 25B.

In the present embodiment, as illustrated in FIGS. 25A and 25B, the power-supply line 312B and the output signal lines 513A and 513B meander in polygonal chain shapes in the wiring layers whose heights from the semiconductor substrate 141 are different from one another. Each of the power-supply lines 312B, 513A, and 513B is included in only one wiring layer, not in a plurality of wiring layers. Specifically, as illustrated in FIGS. 26 and 27, the power-supply line 312B is included in the wiring layer 153. The output signal line 513A is included in the wiring layer 152. The output signal line 513B is included in the wiring layer 151. The periods of the meanders of the power-supply line 312B and the output signal lines 513A and 513B match each other and correspond to, for example, two pixels. The periods of the meanders of the power-supply line 312B and the output signal lines 513A and 513B may differ from each other.

The output signal lines 513A and 513B respectively correspond to the output signal lines 113A and 113B according to the fifth embodiment and are the same in functions and so on except for different shapes. A layout of the output signal lines 513A and 513B in plan view is substantially the same as the layout of the output signal lines 113A and 113B according to the third embodiment.

For example, an extension portion 513A1 and connection portions 513A2 of the output signal line 513A respectively correspond to the extension portion 113A1 and the connection portions 113A2 of the output signal line 113A. For example, an extension portion 513B1 and connection portions 513B2 of the output signal line 513B respectively correspond to the extension portion 113B1 and the connection portions 113B2 of the output signal line 113B.

The output signal lines 513A and 513B intersect each other in plan view. In the present embodiment, the output signal line 513A is located on or above the output signal line 513B, and thus, at all intersection portions 513AB, the output signal line 513A is located on or above the output signal line 513B.

As illustrated in FIG. 25B, the extension portion 513A1 of the output signal line 513A has a plurality of non-overlapping portions 513Ab. The non-overlapping portion 513Ab is one example of a first non-overlapping portion that does not overlap the power-supply line 312B in plan view. The power-supply line 312B and the output signal line 513A intersect each other so that the portion where they overlap each other in plan view becomes small.

The extension portion 513B1 of the output signal line 513B has a plurality of overlapping portions 513Ba. Each of the overlapping portions 513Ba is one example of a second overlapping portion that overlaps the power-supply line 312B in plan view. The power-supply line 312B and the output signal line 513B are provided so that the portion where they overlap each other in plan view becomes small. For example, the plan-view shape of the power-supply line 312B and the plan-view shape of the output signal line 513B may match each other.

Thus, at the position denoted by line XXVI-XXVI in FIG. 25B, the output signal line 513B is located in a direction directly below the power-supply line 312B, as illustrated in FIG. 26. Similarly, at the position denoted by line XXVII-XXVII in FIG. 25B, the output signal line 513B is located in a direction directly below the power-supply line 312B, as illustrated in FIG. 27. As described above, the power-supply line 312B and the output signal line 513B are provided so that they always overlap each other in plan view.

In this case, the output signal line 513B is located at a position farther from the power-supply line 312B than the output signal line 513A. For example, the distance between the output signal line 513B and the power-supply line 312B is equal to the distance between the output signal line 513A and the power-supply line 312B.

This makes it possible to substantially equalize capacitive coupling due to parasitic capacitances between the output signal line 513B and the power-supply line 312B and capacitive coupling due to parasitic capacitances between the output signal line 513A and the power-supply line 312B. As a result, it is possible to substantially equalize the amounts of noise introduced into the output signal lines 513A and 513B by influences of the power-supply line 312B. Accordingly, advantages that are analogous to those in the fifth embodiment are obtained.

Seventh Embodiment

Next, a description will be given of a seventh embodiment. In the seventh embodiment, the number of output signal lines that the power-supply line overlaps differs compared with the first embodiment. Hereinafter, points that differ from the first embodiment will be mainly described, and descriptions of common points will be omitted or briefly given.

Figure 28A:
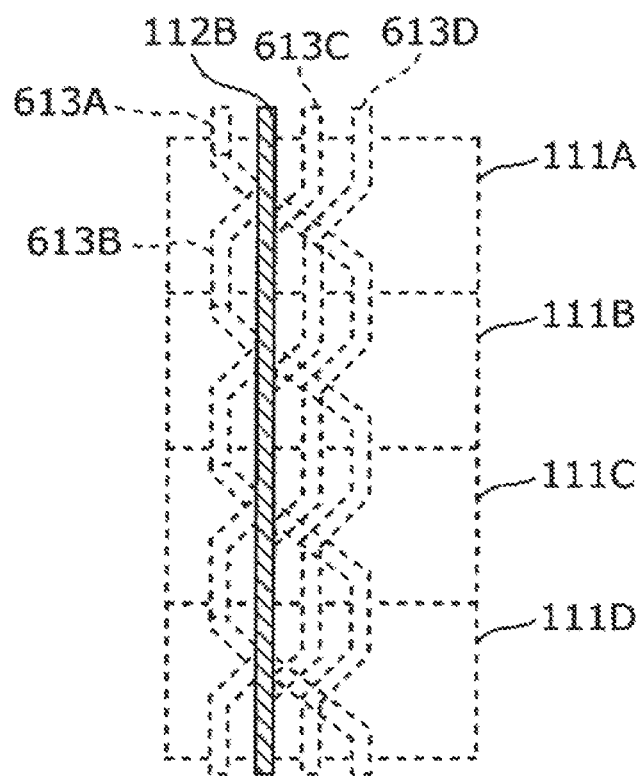
FIG. 28A is a plan view illustrating an exemplary layout structure of a power-supply line according to a seventh embodiment.
Figure 28B:
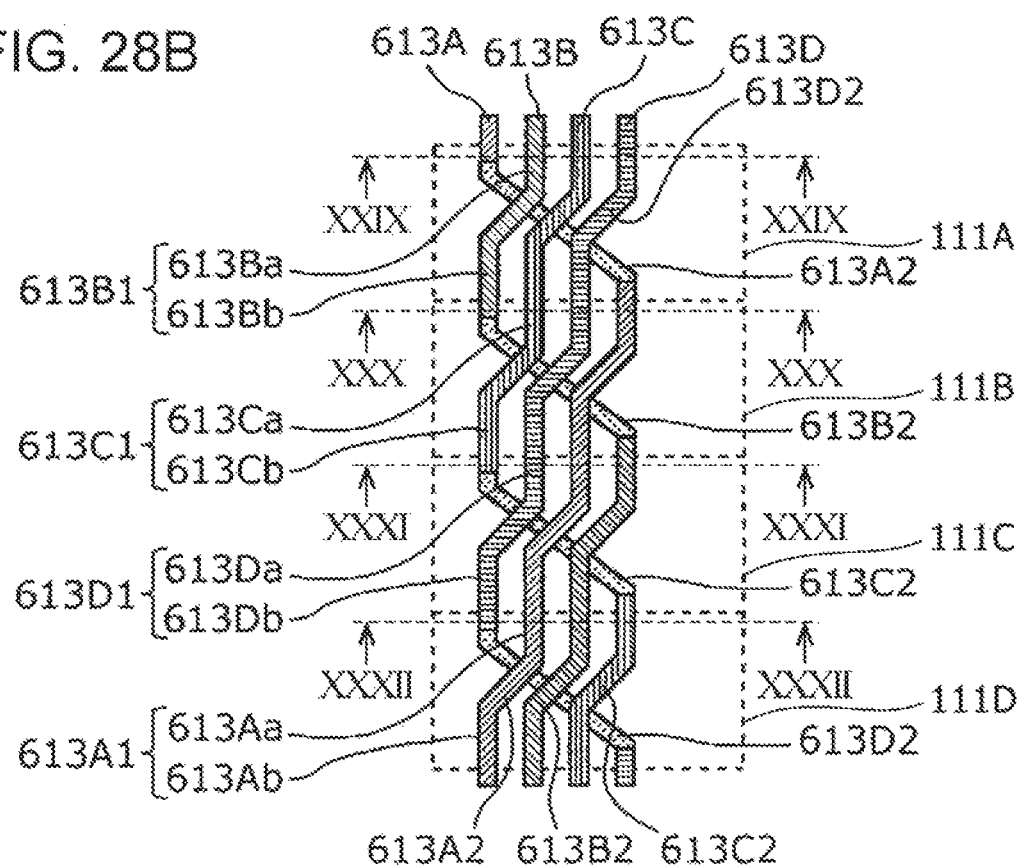
FIG. 28B is a plan view illustrating an exemplary layout structure of signal lines according to the seventh embodiment.
Figure 29:
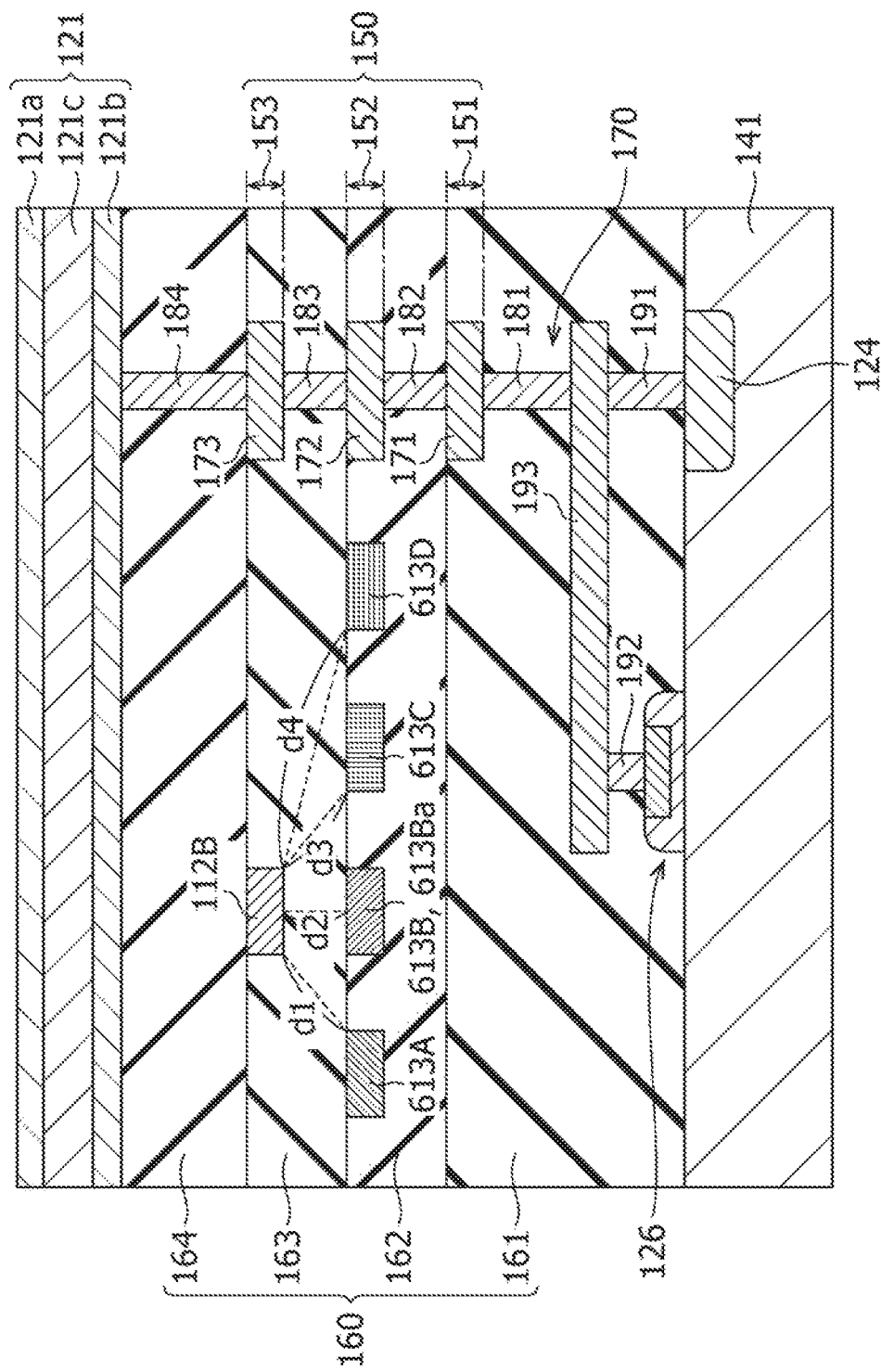
FIG. 29 is a sectional view illustrating an exemplary cross-sectional structure of signal lines, a power-supply line, and FD wires according to the seventh embodiment, taken along line XXIX-XXIX in FIG. 28B.
Figure 30:
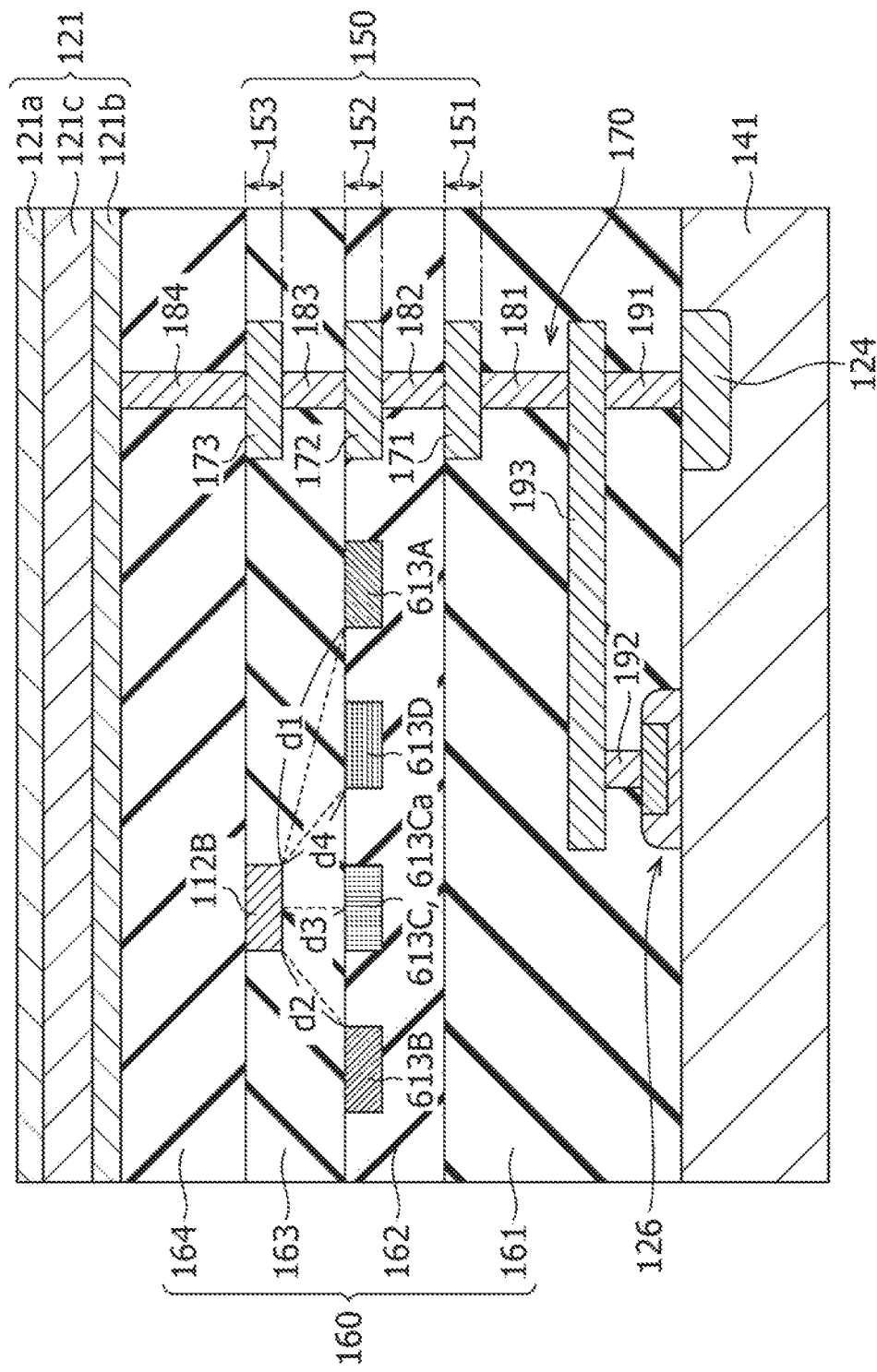
FIG. 30 is a sectional view illustrating an exemplary cross-sectional structure of the signal lines, the power-supply line, and the FD wires according to the seventh embodiment, taken along line XXX-XXX in FIG. 28B.
Figure 31:
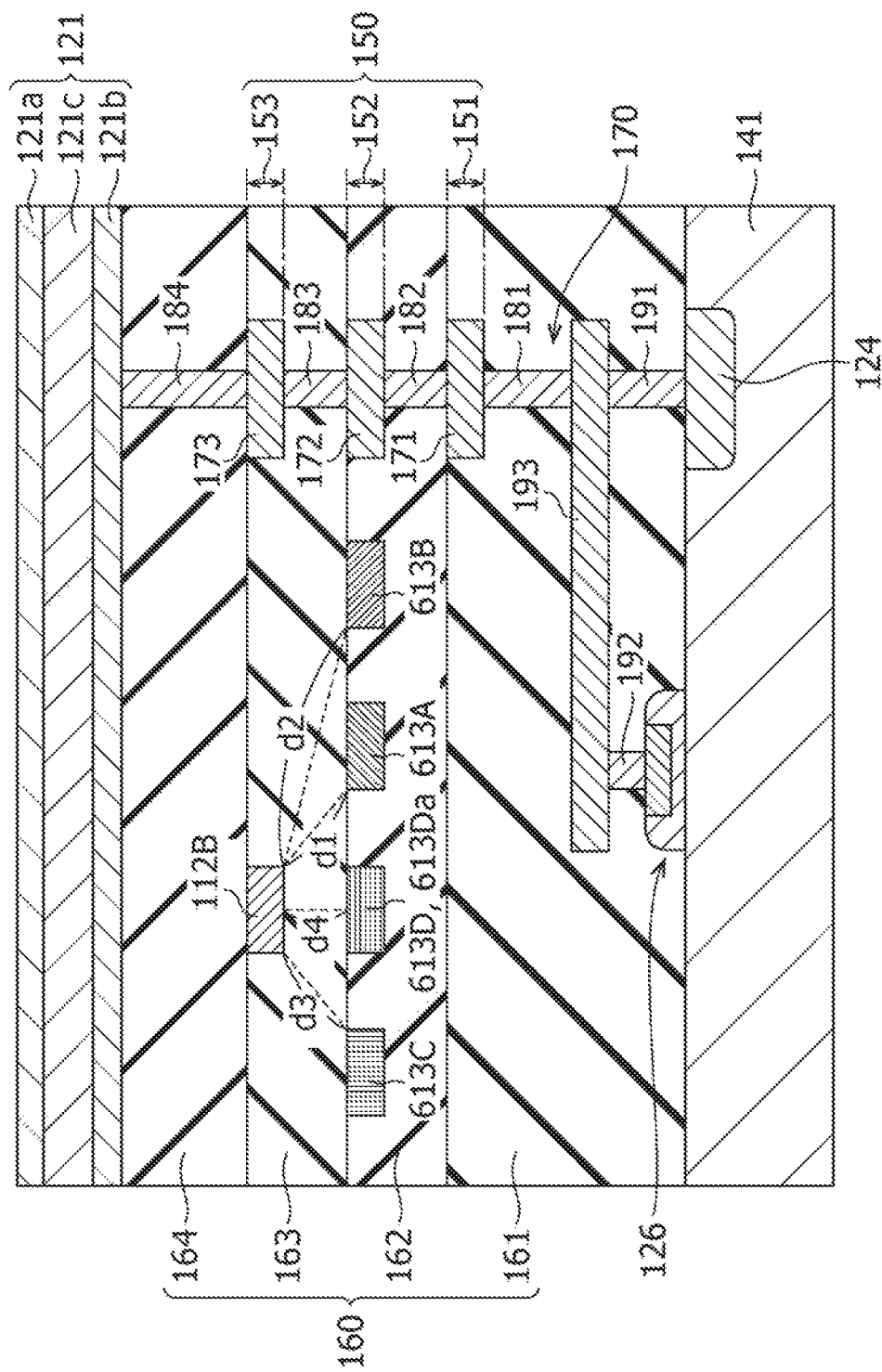
FIG. 31 is a sectional view illustrating an exemplary cross-sectional structure of the signal lines, the power-supply line, and the FD wires according to the seventh embodiment, taken along line XXXI-XXXI in FIG. 28B.
Figure 32:
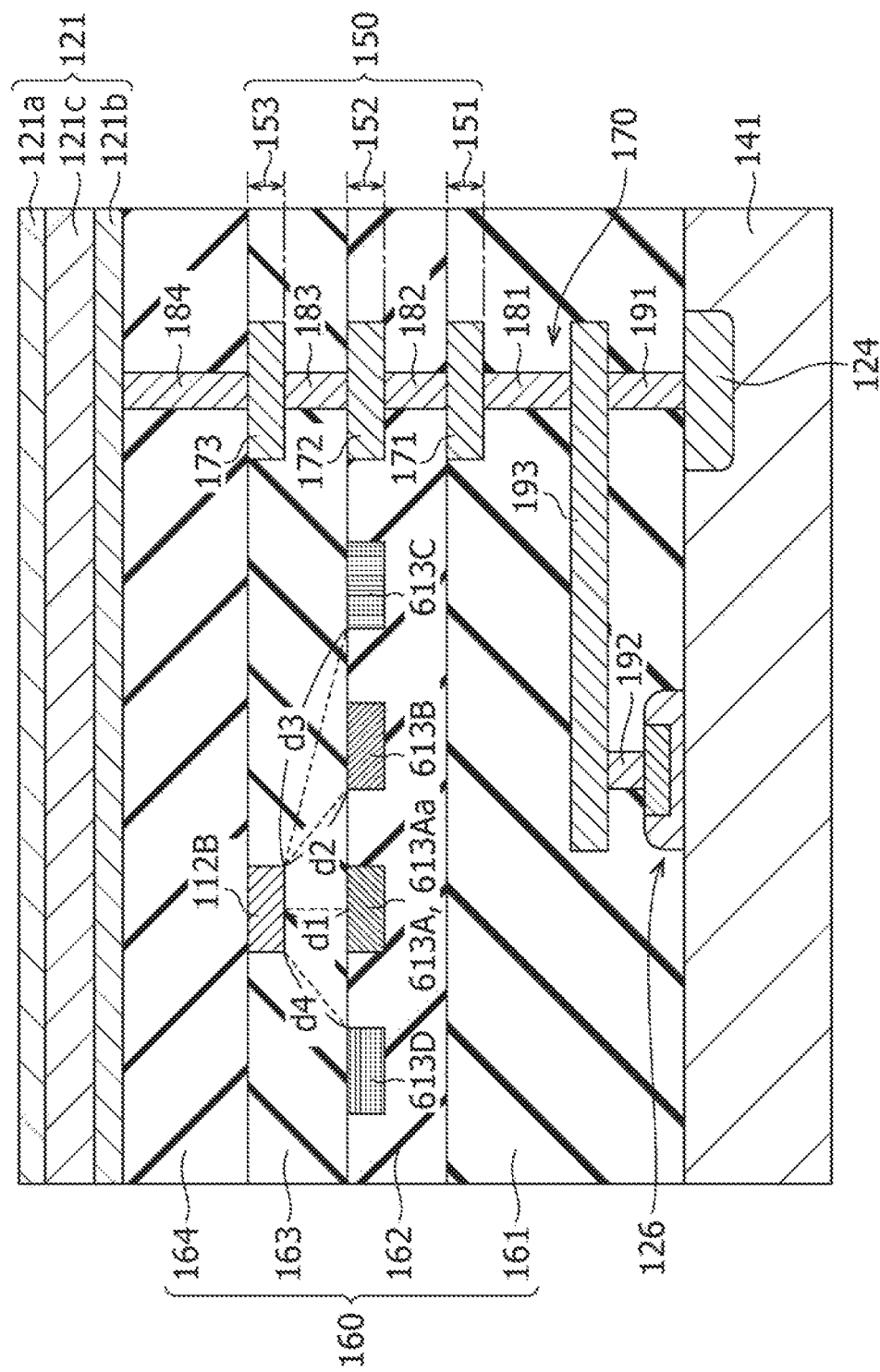
FIG. 32 is a sectional view illustrating an exemplary cross-sectional structure of the signal lines, the power-supply line, and the FD wires according to the seventh embodiment, taken along line XXXII-XXXII in FIG. 28B.

FIG. 28A is a plan view illustrating an exemplary layout structure of the power-supply line 112B according to the present embodiment. FIG. 28B is a plan view illustrating an exemplary layout structure of output signal lines 613A, 613B, 613C, and 613D according to the present embodiment. FIGS. 29, 30, 31, and 32 are sectional views illustrating an exemplary cross-sectional structure of the output signal lines 613A, 613B, 613C, and 613D, the power-supply line 112B, and the FD wires 170 according to the present embodiment. FIG. 29 illustrates a cross-section along line XXIX-XXIX in FIG. 28B. FIG. 30 illustrates a cross-section along line XXX-XXX in FIG. 28B. FIG. 31 illustrates a cross-section along line XXXI-XXXI in FIG. 28B. FIG. 32 illustrates a cross-section along line XXXII-XXXII in FIG. 28B.

The output signal line 613A is one example of a first signal line connected to the pixel 111A. The output signal line 613B is one example of a second signal line connected to the pixel 111B. The output signal line 613C is one example of a third signal line connected to the pixel 111C. The output signal line 613D is one example of a fourth signal line connected to the pixel 111D. Each output signal line is connected to the source or the drain of the amplifying transistor 126 via the selecting transistor 125, the amplifying transistor 126 and the selecting transistor 125 being included in the pixel to which the output signal line is connected.

The power-supply line 112B is substantially the same as the power-supply line 112B according to the first embodiment. The power-supply line 112B extends linearly along the column direction. The power-supply line 112B is located on or above the output signal lines 613A, 613B, 613C, and 613D. Specifically, the power-supply line 112B is included in the wiring layer 153.

The output signal line 613A has an extension portion 613A1 that extends in the column direction and connection portions 613A2 that extend in directions different from the column direction. Both ends of each connection portion 613A2 are connected to the extension portion 613A1. Specifically, the extension portion 613A1 includes a plurality of first portions and a plurality of second portions, and the connection portion 613A2 is arranged between the two portions, that is, the first portion and the second portion, that are adjacent to each other when the output signal line 613A is traced in the direction in which it extends. That is, the connection portion 613A2 is one example of a third portion having one end connected to a first portion that extends in the column direction and another end connected to a second portion that extends in the column direction. As illustrated in FIG. 28B, the angle formed by the extension portion 613A1 and the connection portion 613A2 is an obtuse angle. The angle formed by the extension portion 613A1 and the connection portion 613A2 may be a right angle.

Each of the output signal lines 613B, 613C, and 613D has substantially the same shape as the output signal line 613A. For example, the output signal line 613B has an extension portion 613B1 that extends in the column direction and connection portions 613B2 that extend in directions different from the column direction. The output signal line 613C has an extension portion 613C1 that extends in the column direction and connection portions 613C2 that extend in directions different from the column direction. The output signal line 613D has an extension portion 613D1 that extends in the column direction and connection portions 613D2 that extend in directions different from the column direction.

In the present embodiment, as can be seen from comparison of FIG. 28B with FIGS. 29, 30, 31, and 32, the extension portion 613A1 of the output signal line 613A, the extension portion 613B1 of the output signal line 613B, the extension portion 613C1 of the output signal line 6130, and the extension portion 613D1 of the output signal line 613D are at the same height from the semiconductor substrate 141. Specifically, the output signal lines 613A, 613B, 613C, and 613D are included in the wiring layer 152.

Two arbitrary signal lines selected from the output signal lines 613A, 613B, 613C, and 613D intersect each other in plan view. Specifically, the output signal lines 613A, 613B, 613C, and 613D are provided so as to sequentially interchange their physical positions.

For example, when the output signal line 613A is traced in the column direction, the output signal line 613A moves from the position of the leftmost end of the four output signal lines to the position of the rightmost end thereof and then moves to the left one line after another. When the output signal line 613A moves from the left end to the right end, it sequentially intersects the output signal lines 613B, 6130, and 613D. After arriving at the leftmost end, the output signal line 613A repeats moving from the left end to the right end and moving from the right end to the left end.

In the example illustrated in FIG. 28B, the connection portion 613A2 that extends from the left end to the right end is located at a position that overlaps the pixel 111A. This connection portion 613A2 is located in a layer lower than the output signal lines 613B, 613C, and 613D. For example, the connection portion 613A2 that extends from the left end to the right end is included in the wiring layer 151. The extension portion 613A1 and the connection portion 613A2 that extends from the right to the left are included in the wiring layer 152.

Each of the output signal lines 613B, 613C, and 613D has a configuration that is the same as or similar to that of the output signal line 613A. For example, at the connection portion 613B2 that extends from the left end to the right end, the output signal line 613B intersects the output signal lines 613C, 613D, and 613A in this order. At the connection portion 613C2 that extends from the left end to the right end, the output signal line 613C intersects the output signal lines 613D, 613A, and 613B in this order. At the connection portion 613D2 that extends from the left end to the right end, the output signal line 613D intersects the output signal lines 613A, 613B, and 613C in this order.

In the present embodiment, as illustrated in FIG. 28A, the power-supply line 112B is provided so as to overlap the second output signal line from the left of the four output signal lines and extends linearly along the column direction. Since the output signal lines 613A, 613B, 613C, and 613D interchange their positions while intersecting each other, the power-supply line 112B overlaps each of the output signal lines 613A, 613B, 613C, and 613D in plan view.

The output signal line 613A has an overlapping portion 613Aa that overlaps the power-supply line 112B in plan view and a non-overlapping portion 613Ab that does not overlap the power-supply line 112B in plan view. The output signal line 613B has an overlapping portion 613Ba that overlaps the power-supply line 112B in plan view and a non-overlapping portion 613Bb that does not overlap the power-supply line 112B in plan view. The output signal line 613C has an overlapping portion 613Ca that overlaps the power-supply line 112B in plan view and a non-overlapping portion 613Cb that does not overlap the power-supply line 112B in plan view. The output signal line 613D has an overlapping portion 613Da that overlaps the power-supply line 112B in plan view and a non-overlapping portion 613Db that does not overlap the power-supply line 112B in plan view.

In the above-described configuration, at the position denoted by line XXIX-XXIX in FIG. 28B, the output signal line 613B and the power-supply line 112B overlap each other in plan view, and each of the output signal lines 613A, 613C, and 613D does not overlap the power-supply line 112B in plan view. Specifically, as illustrated in FIG. 29, the output signal line 613B is located at a position closer to the power-supply line 112B than the output signal lines 613A, 613C, and 613D. That is, in the cross-section illustrated in FIG. 29, d1>d2, d3>d2, and d4>d2 are satisfied.

In this case, d1 is the distance between the power-supply line 112B and the output signal line 613A, d2 is the distance between the power-supply line 112B and the output signal line 613B, d3 is the distance between the power-supply line 112B and the output signal line 613C, and d4 is the distance between the power-supply line 112E and the output signal line 613D. The distance d1 is defined as, for example, the distance between a surface of the power-supply line 112B and a surface of the output signal line 613A in the cross-section orthogonal to the column direction. Alternatively, the distance d1 may be the distance between the center of the power-supply line 112B and the center of the output signal line 613A in the cross-section orthogonal to the column direction. The same applies to distances d2, d3, and d4. The same also applies to eighth and ninth embodiments described below.

At the position denoted by line XXX-XXX in FIG. 28B, the output signal line 613C and the power-supply line 112B overlap each other in plan view, and each of the output signal lines 613A, 613B, and 613D does not overlap the power-supply line 112B in plan view. Specifically, as illustrated in FIG. 30, the output signal line 613C is located at a position closer to the power-supply line 112B than the output signal lines 613A, 613B, and 613D. That is, in the cross-section illustrated in FIG. 30, d1>d3, d2>d3, and d4>d3 are satisfied.

Also, at the position denoted by line XXXI-XXXI in FIG. 28B, the output signal line 613D and the power-supply line 112B overlap each other in plan view, and each of the output signal lines 613A, 613B, and 6130 does not overlap the power-supply line 112E in plan view. Specifically, as illustrated in FIG. 31, the output signal line 613D is located at a position closer to the power-supply line 112B than the output signal lines 613A, 613B, and 613C. That is, in the cross-section illustrated in FIG. 31, d1>d4, d2>d4, and d3>d4 are satisfied.

Also, at the position denoted by line XXXII-XXXII in FIG. 28B, the output signal line 613A and the power-supply line 112B overlap each other in plan view, and each of the output signal lines 613B, 613C, and 613D does not overlap the power-supply line 112B in plan view. Specifically, as illustrated in FIG. 32, the output signal line 613A is located at a position closer to the power-supply line 112B than the output signal lines 613B, 613C, and 613D. That is, in the cross-section illustrated in FIG. 32, d1<d2, d1<d3, and d1<d4 are satisfied.

As described above, the output signal lines 613A, 613B, 613C, and 613D repeat approaching and receding from the power-supply line 112B by sequentially interchanging their positions. This makes it possible to substantially equalize capacitive coupling due to parasitic capacitances between the power-supply line 112B and the output signal lines 613A, 613B, 613C, and 613D. As a result, it is possible to substantially equalize the amounts of noise introduced into the output signal lines 613A, 613B, 613C, and 613D by influences of the power-supply line 112B. Accordingly, advantages that are analogous to those in the first embodiment are obtained.

In the present embodiment, the power-supply line 112B does not necessarily have to extend linearly and may meander in a polygonal chain shape. The width of the meander of the power-supply line 112B may be a width of two output signal lines or a width of four output signal lines.

Eighth Embodiment

Next, a description will be given of an eighth embodiment. In the eighth embodiment, the shapes of the output signal lines differ compared with the seventh embodiment. Hereinafter, points that differ from the seventh embodiment will be mainly described, and descriptions of common points will be omitted or briefly given.

Figure 33A:
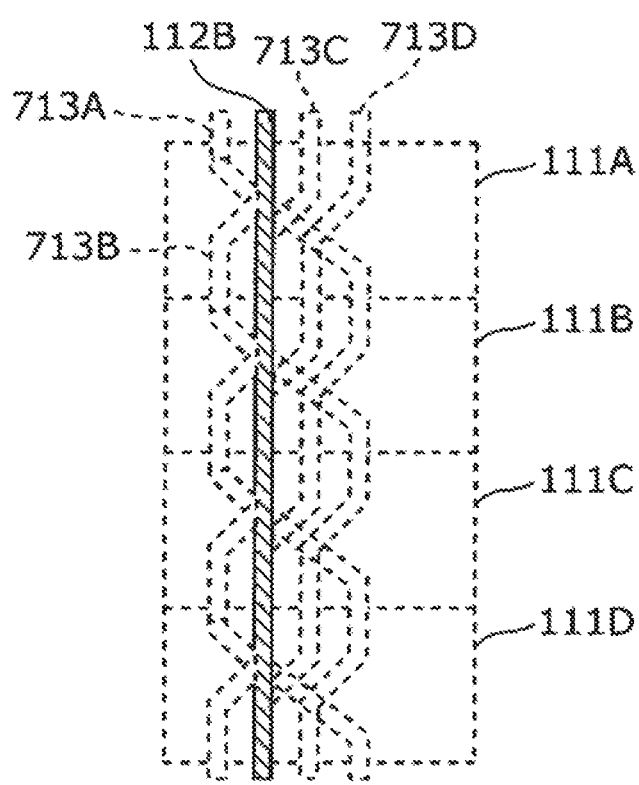
FIG. 33A is a plan view illustrating an exemplary layout structure of a power-supply line according to an eighth embodiment.
Figure 33B:
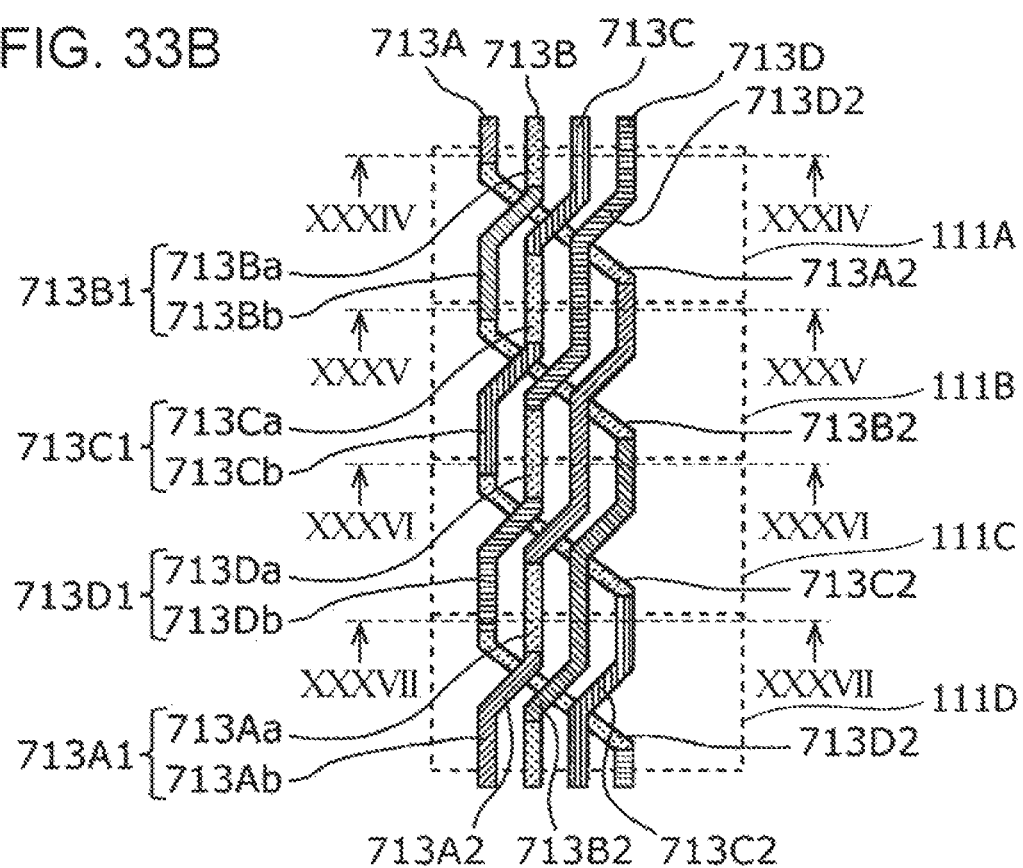
FIG. 33B is a plan view illustrating an exemplary layout structure of signal lines according to the eighth embodiment.
Figure 34:
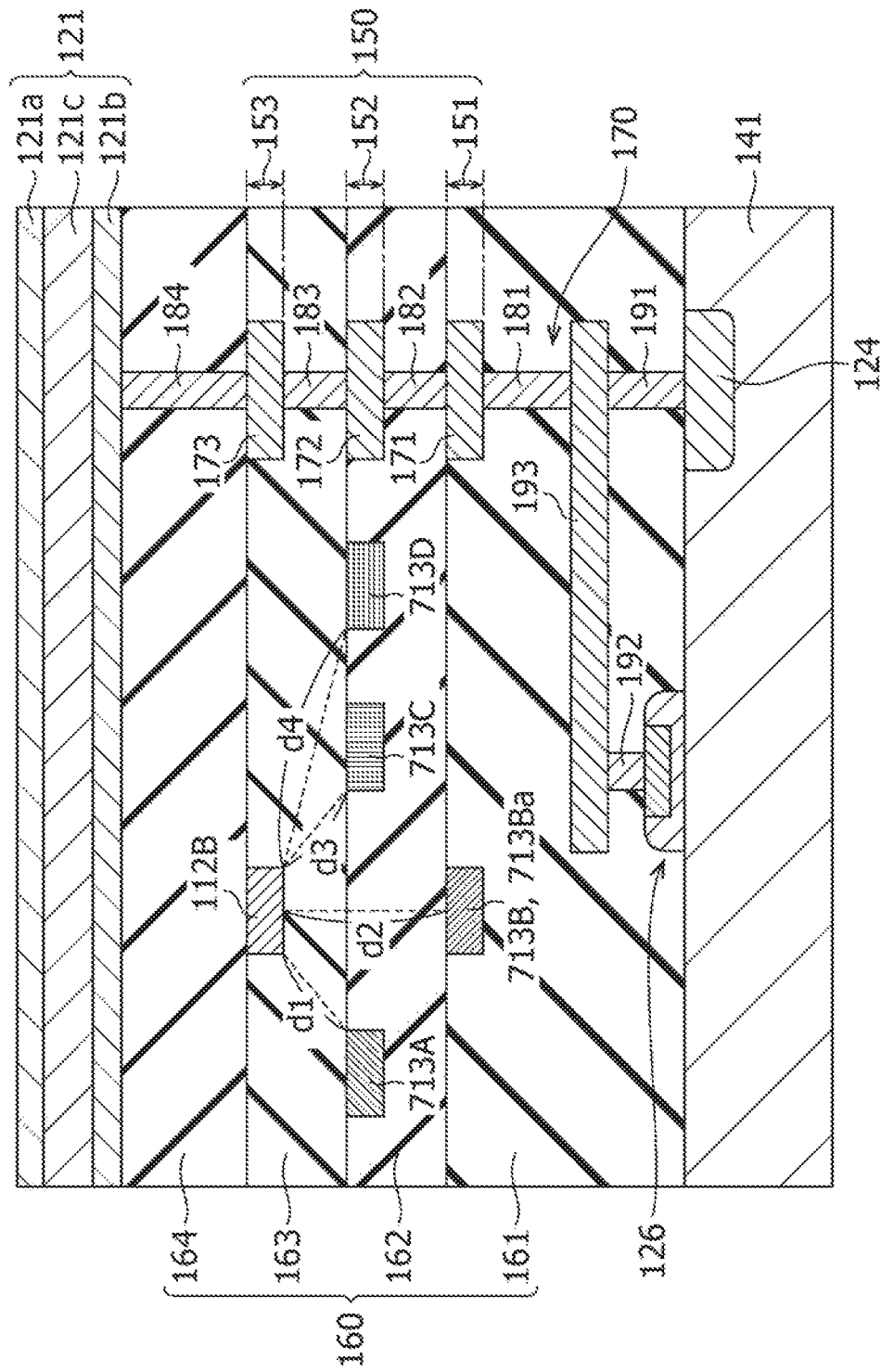
FIG. 34 is a sectional view illustrating an exemplary cross-sectional structure of signal lines, a power-supply line, and FD wires according to the eighth embodiment, taken along line XXXIV-XXXIV in FIG. 33B.
Figure 35:
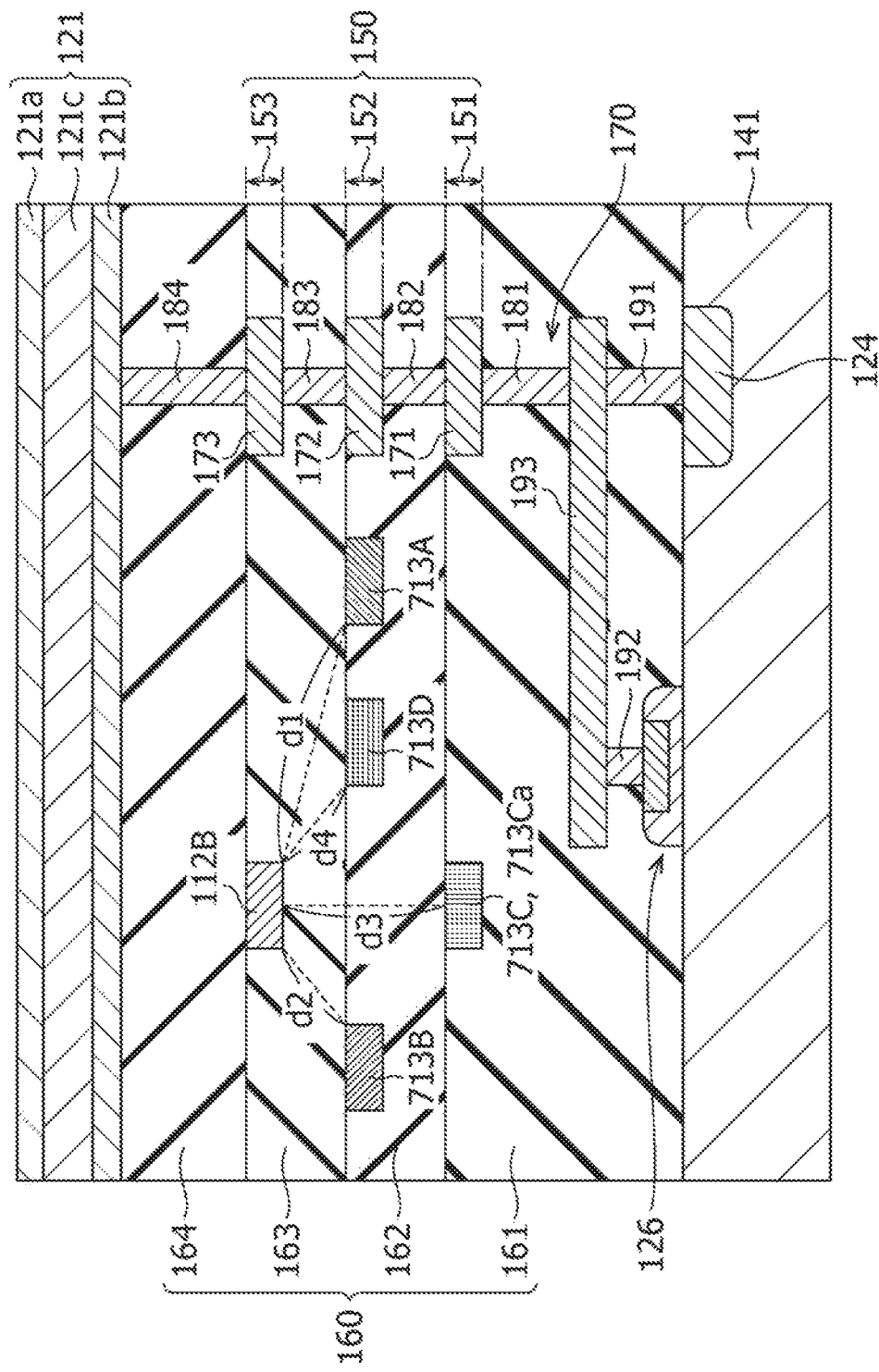
FIG. 35 is a sectional view illustrating an exemplary cross-sectional structure of the signal lines, the power-supply line, and the FD wires according to the eighth embodiment, taken along line XXXV-XXXV in FIG. 33B.
Figure 36:
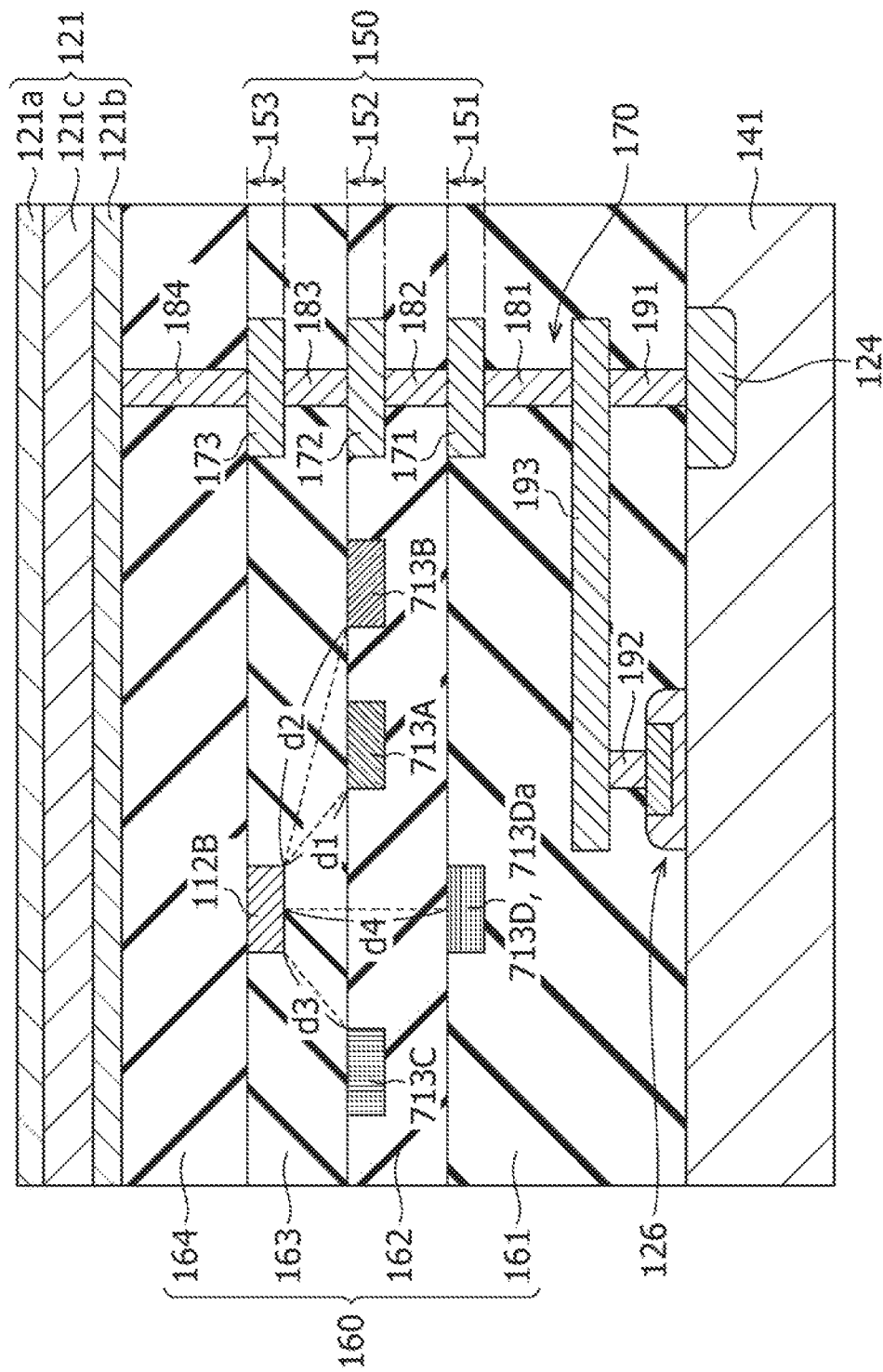
FIG. 36 is a sectional view illustrating an exemplary cross-sectional structure of the signal lines, the power-supply line, and the FD wires according to the eighth embodiment, taken along line XXXVI-XXXVI in FIG. 33B.
Figure 37:
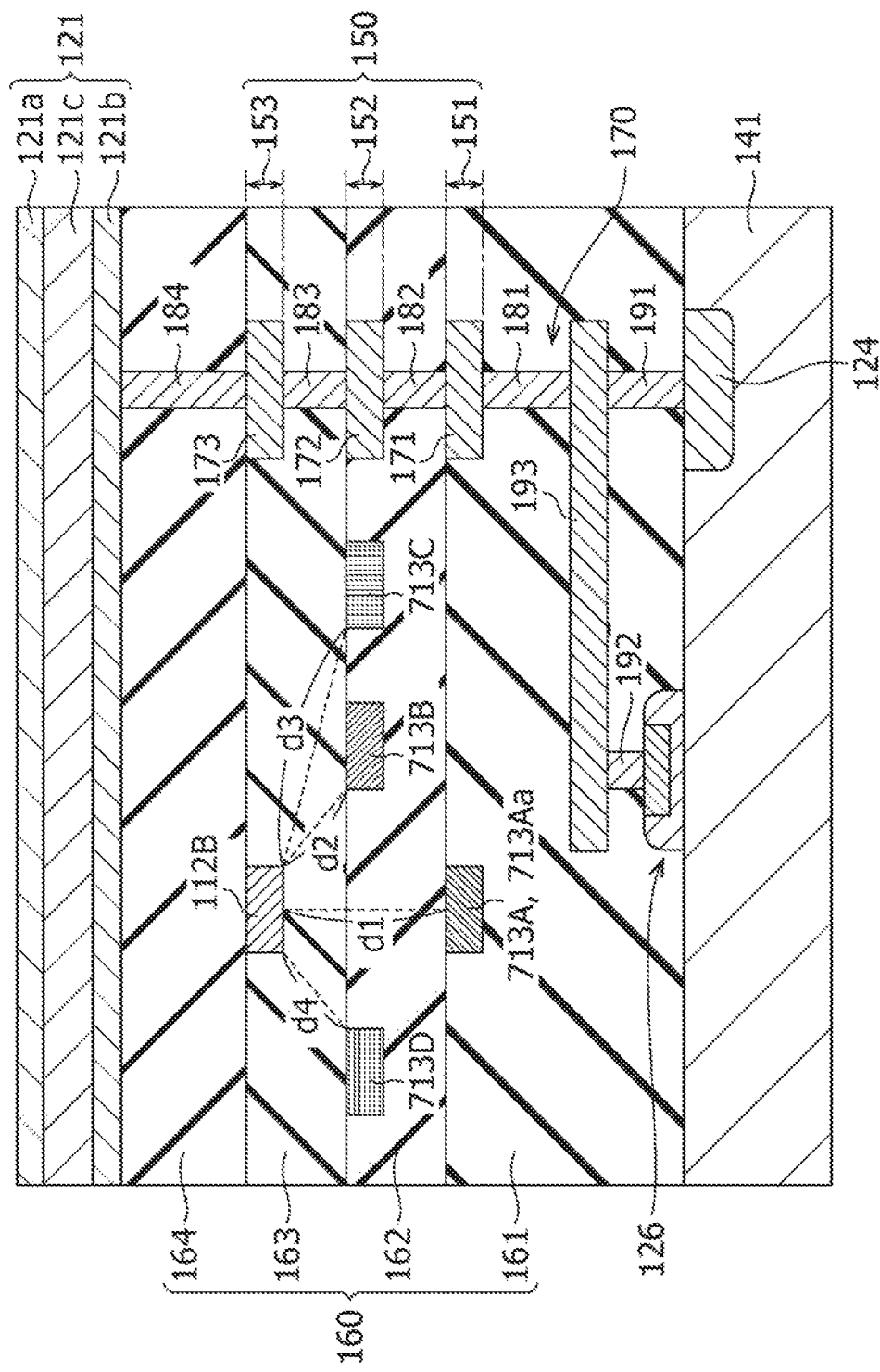
FIG. 37 is a sectional view illustrating an exemplary cross-sectional structure of the signal lines, the power-supply line, and the FD wires according to the eighth embodiment, taken along line XXXVII-XXXVII in FIG. 33B.

FIG. 33A is a plan view illustrating an exemplary layout structure of the power-supply line 112B according to the present embodiment. FIG. 33B is a plan view illustrating an exemplary layout structure of output signal lines 713A, 713B, 713C, and 713D according to the present embodiment. FIGS. 34, 35, 36, and 37 are sectional views illustrating an exemplary cross-sectional structure of the output signal lines 713A, 713B, 713C, and 713D, the power-supply line 112B, and the FD wires 170 according to the present embodiment. FIG. 34 illustrates a cross-section along line XXXIV-XXXIV in FIG. 33B. FIG. 35 illustrates a cross-section along line XXXV-XXXV in FIG. 33B. FIG. 36 illustrates a cross-section along line XXXVI-XXXVI in FIG. 33B. FIG. 37 illustrates a cross-section along line XXXVII-XXXVII in FIG. 33B.

The output signal lines 713A, 713B, 713C, and 713D according to the present embodiment respectively correspond to the output signal lines 613A, 613B, 613C, and 613D according to the seventh embodiment and are the same in functions and so on except for different shapes. A layout of the output signal lines 713A, 713B, 713C, and 713D in plan view is substantially the same as the layout of the output signal lines 613A, 613B, 613C, and 613D according to the seventh embodiment.

For example, an extension portion 713A1 and connection portions 713A2 of the output signal line 713A are substantially the same as the extension portion 613A1 and the connection portions 613A2 of the output signal line 613A according to the seventh embodiment. An extension portion 713B1 and connection portions 713B2 of the output signal line 713B are substantially the same as the extension portion 613B1 and the connection portions 613B2 of the output signal line 613B according to the seventh embodiment. An extension portion 713C1 and connection portions 713C2 of the output signal line 713C are substantially the same as the extension portion 613C1 and the connection portions 613C2 of the output signal line 613C according to the seventh embodiment. An extension portion 713D1 and connection portions 713D2 of the output signal line 713D are substantially the same as the extension portion 613D1 and the connection portions 613D2 of the output signal line 613D according to the seventh embodiment.

Also, an overlapping portion 713Aa and a non-overlapping portion 713Ab of the output signal line 713A respectively correspond to the overlapping portion 613Aa and the non-overlapping portion 613Ab of the output signal line 613A according to the seventh embodiment. An overlapping portion 713Ba and a non-overlapping portion 713Bb of the output signal line 713B respectively correspond to the overlapping portion 613Ba and the non-overlapping portion 613Bb of the output signal line 613B according to the seventh embodiment. An overlapping portion 713Ca and a non-overlapping portion 713Cb of the output signal line 713C respectively correspond to the overlapping portion 613Ca and the non-overlapping portion 613Cb of the output signal line 613C according to the seventh embodiment. An overlapping portion 713Da and a non-overlapping portion 713Db of the output signal line 713D respectively correspond to the overlapping portion 613Da and the non-overlapping portion 613Db of the output signal line 613D according to the seventh embodiment.

In the present embodiment, the heights of the overlapping portions 713Aa, 713Ba, 713Ca, and 713Da from the semiconductor substrate 141 are different from those in the seventh embodiment. Specifically, the overlapping portions 713Ba, 713Ca, 713Da, and 713Aa are included in the wiring layer 151, as respectively illustrated in FIGS. 34, 35, 36, and 37. Thus, each of the overlapping portions 713Aa, 713Ba, 713Ca, and 713Da is arranged in a direction directly below the power-supply line 112B, with one or more wiring layers being interposed therebetween. That is, the distance between the power-supply line 112B and each of the overlapping portions 713Aa, 713Ba, 713Ca, and 713Da is larger than the corresponding distance in the seventh embodiment. Specifically, d2 illustrated in FIG. 34, d3 illustrated in FIG. 35, d4 illustrated in FIG. 36, and d1 illustrated in FIG. 37 are larger than d2 illustrated in FIG. 29, d3 illustrated in FIG. 30, d4 illustrated in FIG. 31, and d1 illustrated in FIG. 32, respectively.

In the present embodiment, in the cross-section illustrated in FIG. 34, $d1<d2$, $d3<d2$, and $d4>d2$ are satisfied. In the cross-section illustrated in FIG. 35, $d1>d3$, $d2<d3$, and $d4<d3$ are satisfied. In the cross-section illustrated in FIG. 36, $d1<d4$, $d2>d4$, and $d3<d4$ are satisfied. In the cross-section illustrated in FIG. 37, $d1>d2$, $d1<d3$, and $d1>d4$ are satisfied.

This makes it possible to further reduce capacitive coupling due to parasitic capacitances between the power-supply line 112B and the output signal lines 713A, 713B, 713C, and 713D. Accordingly, it is possible to reduce the amount of noise that is introduced from the power-supply line 112B to each of the output signal lines 713A, 713B, 713C, and 713D.

In the present embodiment, the power-supply line 112B does not necessarily have to extend linearly and may meander in a polygonal chain shape. The width of the meander of the power-supply line 112B may be a width of two output signal lines or a width of four output signal lines.

Ninth Embodiment

Next, a description will be given of a ninth embodiment. In the ninth embodiment, the shapes of the power-supply line and the output signal lines differ compared with the seventh embodiment. Hereinafter, points that differ from the seventh embodiment will be mainly described, and descriptions of common points will be omitted or briefly given.

Figure 38A:
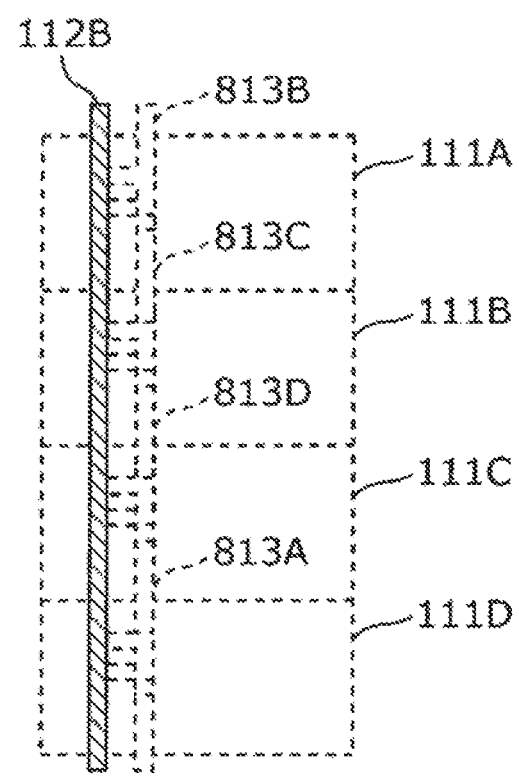
FIG. 38A is a plan view illustrating an exemplary layout structure of a power-supply line according to a ninth embodiment.
Figure 38B:
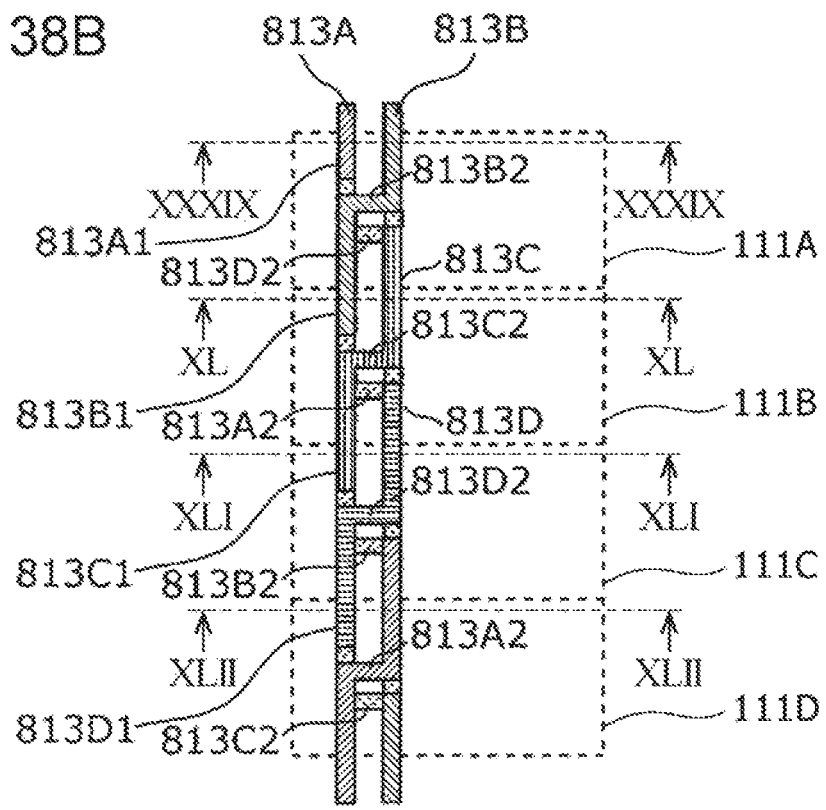
FIG. 38B is a plan view illustrating an exemplary layout structure of signal lines according to the ninth embodiment.
Figure 39:
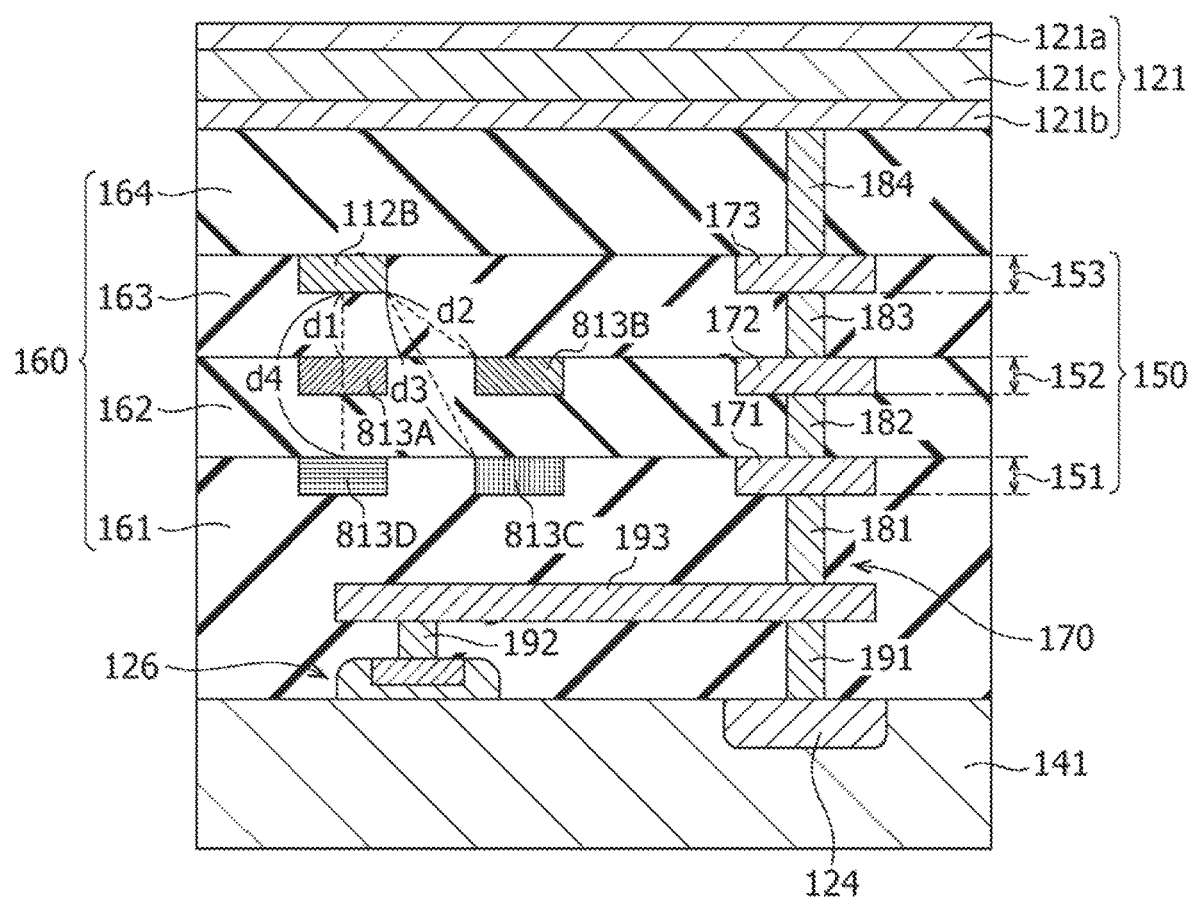
FIG. 39 is a sectional view illustrating an exemplary cross-sectional structure of signal lines, a power-supply line, and FD wires according to the ninth embodiment, taken along line XXXIX-XXXIX in FIG. 38B.
Figure 40:
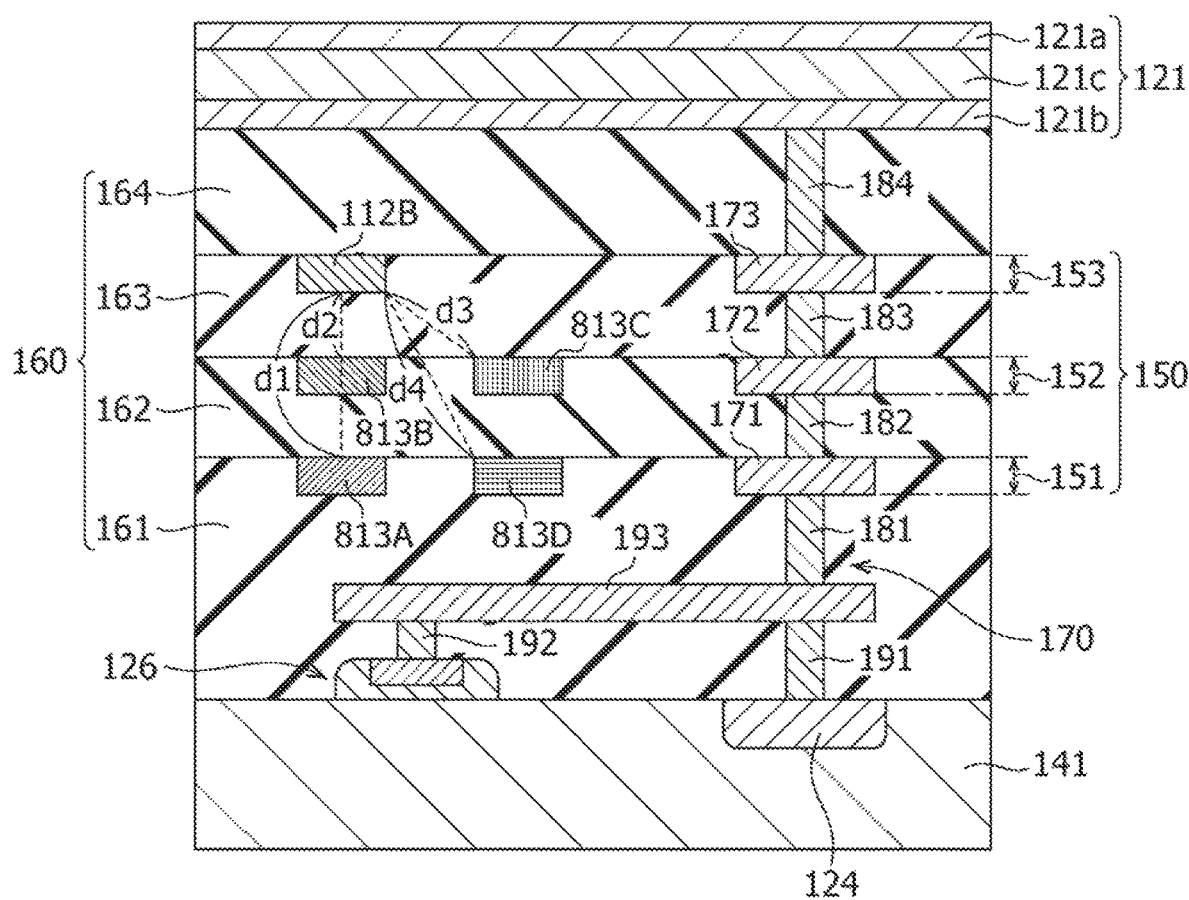
FIG. 40 is a sectional view illustrating an exemplary cross-sectional structure of the signal lines, the power-supply line, and the FD wires according to the ninth embodiment, taken along line XL-XL in FIG. 38B.
Figure 41:
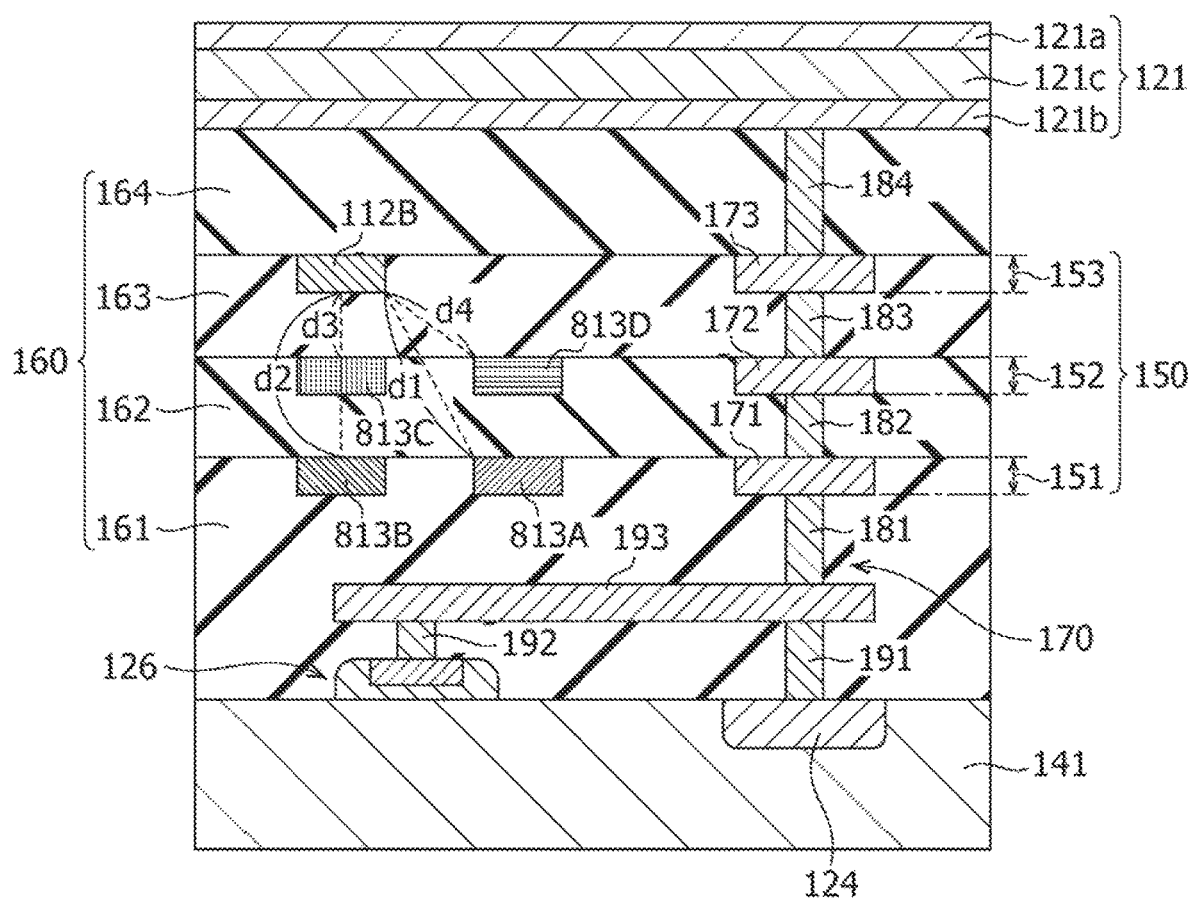
FIG. 41 is a sectional view illustrating an exemplary cross-sectional structure of the signal lines, the power-supply line, and the FD wires according to the ninth embodiment, taken along line XLI-XLI in FIG. 38B.
Figure 42:
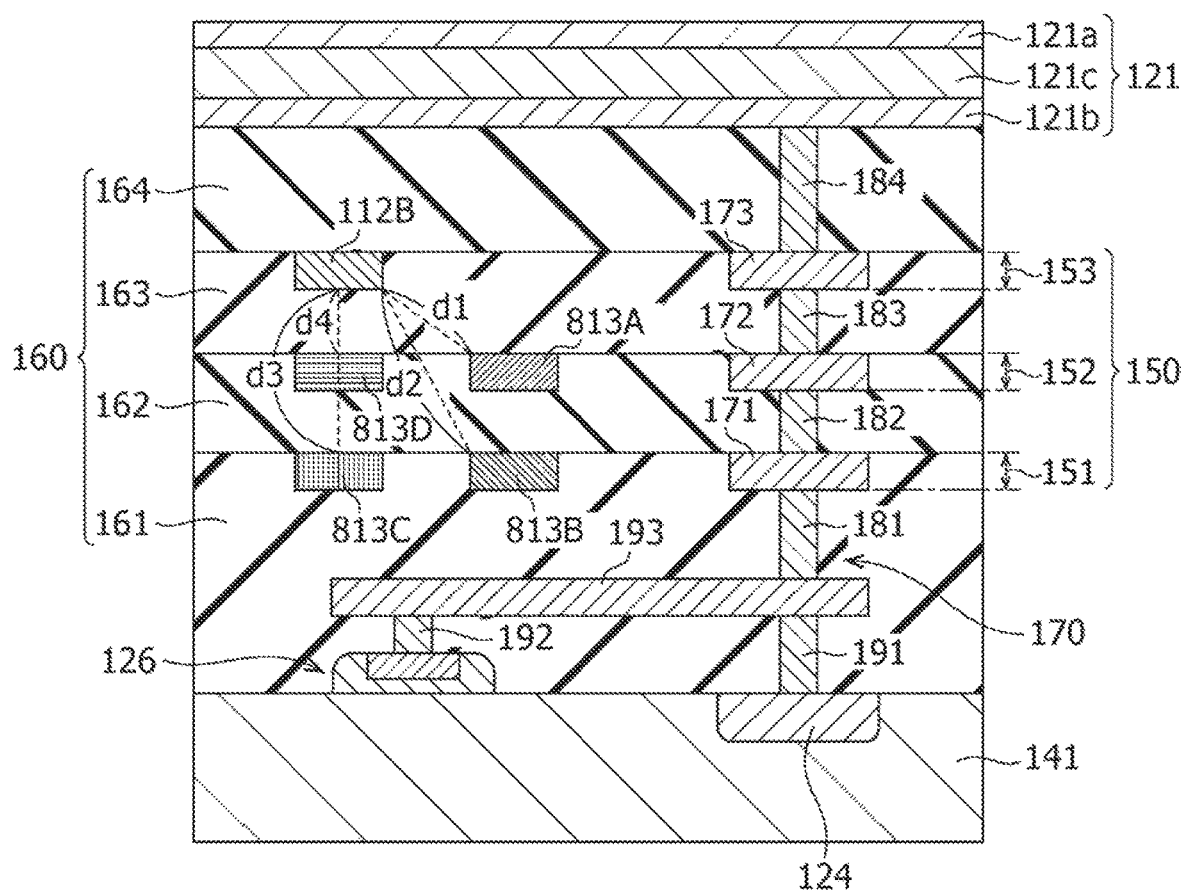
FIG. 42 is a sectional view illustrating an exemplary cross-sectional structure of the signal lines, the power-supply line, and the FD wires according to the ninth embodiment, taken along line XLII-XLII in FIG. 38B.

FIG. 38A is a plan view illustrating an exemplary layout structure of the power-supply line 112B according to the present embodiment. FIG. 38B is a plan view illustrating an exemplary layout structure of output signal lines 813A, 813B, 813C, and 813D according to the present embodiment. FIGS. 39, 40, 41, and 42 are sectional views illustrating an exemplary cross-sectional structure of the output signal lines 813A, 813B, 813C, and 813D, the power-supply line 112B, and the FD wires 170 according to the present embodiment. FIG. 39 illustrates a cross-section along line XXXIX-XXXIX in FIG. 38B. FIG. 40 illustrates a cross-section along line XL-XL in FIG. 38B. FIG. 41 illustrates a cross-section along line XLI-XLI in FIG. 38B. FIG. 42 illustrates a cross-section along line XLII-XLII in FIG. 38B.

The output signal lines 813A, 813B, 813C, and 813D according to the present embodiment respectively correspond to the output signal lines 613A, 613B, 613C, and 613D according to the seventh embodiment and are the same in functions and so on except for different shapes. A layout of the output signal lines 813A, 813B, 813C, and 813D in plan view is similar to the layout of the output signal lines 613A, 613B, 613C, and 613D according to the seventh embodiment.

In the present embodiment, the output signal lines 813A, 813B, 813C, and 813D are provided so as to alternately interchange a total of four positions, that is, two positions in the wiring layer 151 and two positions in the wiring layer 152. Specifically, the output signal lines 813A, 813B, 813C, and 813D are provided so as to helically pass through the four positions. Two positions in the wiring layer 151 and two positions in the wiring layer 152 overlap each other in plan view.

In the example illustrated in FIG. 38B, when the output signal line 813A is traced in the column direction, the output signal line 813A moves from the left side in the wiring layer 152 to the left side in the wiring layer 151 and then moves from the left side in the wiring layer 151 to the right side therein. The output signal line 813A further moves from the right side in the wiring layer 151 to the right side in the wiring layer 152 and then moves from the right side in the wiring layer 152 to the left side in the wiring layer 152. The output signal line 813A has an extension portion 813A1 that extends along the column direction and connection portion 813A2 that extends in directions different from the column direction. In the present embodiment, the angle formed by the extension portion 813A1 and the connection portion 813A2 is a right angle.

In the example illustrated in FIG. 38B, the connection portion 813A2 that extends from the left side to the right side is located at a position that overlaps the pixel 111B and is included in the wiring layer 151. The connection portion 813A2 that extends from the right side to the left side is located at a position that overlaps the pixel 111D and is included in the wiring layer 152.

Each of the output signal lines 813B, 813C, and 813D has a configuration that is the same as or similar to that of the output signal line 813A. For example, the output signal line 813B has an extension portion 813B1 that extends in the column direction and connection portions 813B2 that extend in directions different from the column direction. The output signal line 813C has an extension portion 813C1 that extends in the column direction and connection portions 813C2 that extend in directions different from the column direction. The output signal line 813D has an extension portion 813D1 that extends in the column direction and connection portions 813D2 that extend in directions different from the column direction.

In the present embodiment, as illustrated in FIG. 38A, the power-supply line 112B is provided so as to overlap two signal lines of the four output signal lines and extend linearly along the column direction. Since the four output signal lines 813A, 813B, 813C, and 813D interchange their positions while intersecting each other, the power-supply line 112B overlaps each of the output signal lines 813A, 813B, 813C, and 813D in plan view. That is, in the present embodiment, two arbitrary signal lines selected from the output signal lines 813A, 813B, 813C, and 813D intersect each other in plan view.

In the above-described configuration, at the position denoted by line XXXIX-XXXIX in FIG. 38B, the power-supply line 112B overlaps the output signal lines 813A and 813D in plan view, and each of the output signal lines 813C and 813B does not overlap the power-supply line 112B in plan view, as illustrated in FIG. 39. Specifically, the output signal line 813A is located at a position closer to the power-supply line 112B than the output signal lines 813B, 813C, and 813D. That is, in the cross-section illustrated in FIG. 39, d1<d2, d1<d3, and d1<d4 are satisfied.

Also, at the position denoted by line XL-XL in FIG. 38B, the power-supply line 112B overlaps the output signal lines 813B and 813A in plan view, and each of the output signal lines 813C and 813D does not overlap the power-supply line 112B in plan view, as illustrated in FIG. 40. Specifically, the output signal line 813B is located at a position closer to the power-supply line 112B than the output signal lines 813A, 813C, and 813D. That is, in the cross-section illustrated in FIG. 40, d2<d1, d2<d3, and d2<d4 are satisfied.

Also, at the position denoted by line XLI-XLI in FIG. 38B, the power-supply line 112B overlaps the output signal lines 813C and 813B in plan view, and each of the output signal lines 813D and 813A does not overlap the power-supply line 112B in plan view, as illustrated in FIG. 41. Specifically, the output signal line 813C is located at a position closer to the power-supply line 112B than the output signal lines 813A, 813B, and 813D. That is, in the cross-section illustrated in FIG. 41, d3<d1, d3<d2, and d3<d4 are satisfied.

Also, at the position denoted by line XLII-XLII in FIG. 38B, the power-supply line 112B overlaps the output signal lines 813D and 813C in plan view, and each of the output signal lines 813A and 813B does not overlap the power-supply line 112B in plan view, as illustrated in FIG. 42. Specifically, the output signal line 813D is located at a position closer to the power-supply line 112B than the output signal lines 813A, 813B, and 813C. That is, in the cross-section illustrated in FIG. 42, d4<d1, d4<d2, and d4<d3 are satisfied.

The output signal lines 813A, 813B, 813C, and 813D sequentially interchange their positions, as described above, to thereby repeat approaching and receding from the power-supply line 112B. This makes it possible to substantially equalize capacitive coupling due to parasitic capacitances between the power-supply line 112B and the output signal lines 813A, 813B, 813C, and 813D. As a result, it is possible to substantially equalize the amounts of noise introduced into the output signal lines 813A, 813B, 813C, and 813D by influences of the power-supply line 112B. Accordingly, advantages that are analogous to those in the first embodiment are obtained.

In the present embodiment, the power-supply line 112B may meander in a polygonal chain shape, rather than extending linearly. The width of the meander of the power-supply line 112B may a width of two or four output signal lines.

Tenth Embodiment

Figure 43:
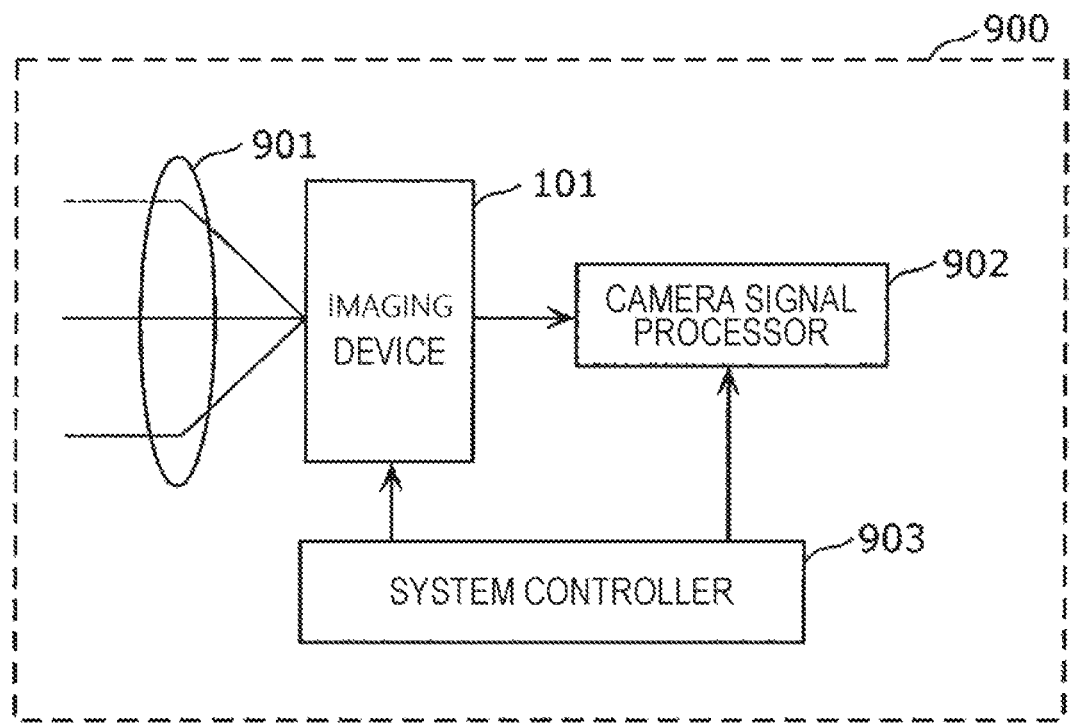
FIG. 43 is a block diagram illustrating a configuration example of a camera system according to a tenth embodiment.

Next, a description will be given of a tenth embodiment. FIG. 43 is a block diagram illustrating one example of the configuration of a camera system 900 according to the tenth embodiment.

The camera system 900 is used for, for example, a smartphone, a video camera, a digital still camera, a surveillance camera, or a vehicle-mounted camera. As illustrated in FIG. 43, the camera system 900 includes an imaging device 101, a lens 901, a camera signal processor 902, and a system controller 903.

The imaging device 101 is the imaging device 101 described above in the first embodiment. The camera system 900 may include the imaging device according to any of the second to ninth embodiments instead of the imaging device 101 according to the first embodiment. The imaging device 101 converts image light, formed on an imaging plane by the lens 901, into electrical signals for respective pixels and outputs the resulting image signals.

The lens 901 is an optical element for introducing incident light into the pixel array 102 included in the imaging device 101.

The camera signal processor 902 is a circuit for performing various types of processing on the image signals generated by the imaging device 101. For example, the camera signal processor 902 performs processing, such as gamma correction, color interpolation processing, spatial interpolation processing, and white balance adjustment. The camera signal processor 902 is realized by, for example, a digital signal processor (DSP) or the like.

The system controller 903 is a control unit for driving the imaging device 101 and the camera signal processor 902. The system controller 903 is realized by, for example, a microcomputer.

Image signals processed by the camera signal processor 902 are recorded to, for example, a recording medium, such as a memory, as a still image or a moving image. Alternatively, the image signals may be displayed on a monitor having a liquid-crystal display as a moving image.

Since the camera system 900 according to the present embodiment employs the imaging device 101 described above, it is possible to obtain an image with less noise.

Other Embodiments

Although the imaging devices according to the embodiments of the present disclosure have been described above based on the embodiments, the present disclosure is not limited to the embodiments. Modes obtained by making various modifications conceived by those skilled in the art to the above-described embodiments and modes constructed by combining the constituent elements in different embodiments are also encompassed in the scope of the present disclosure, as long as such modes do not depart from the spirit of the present disclosure.

Figure 44A:
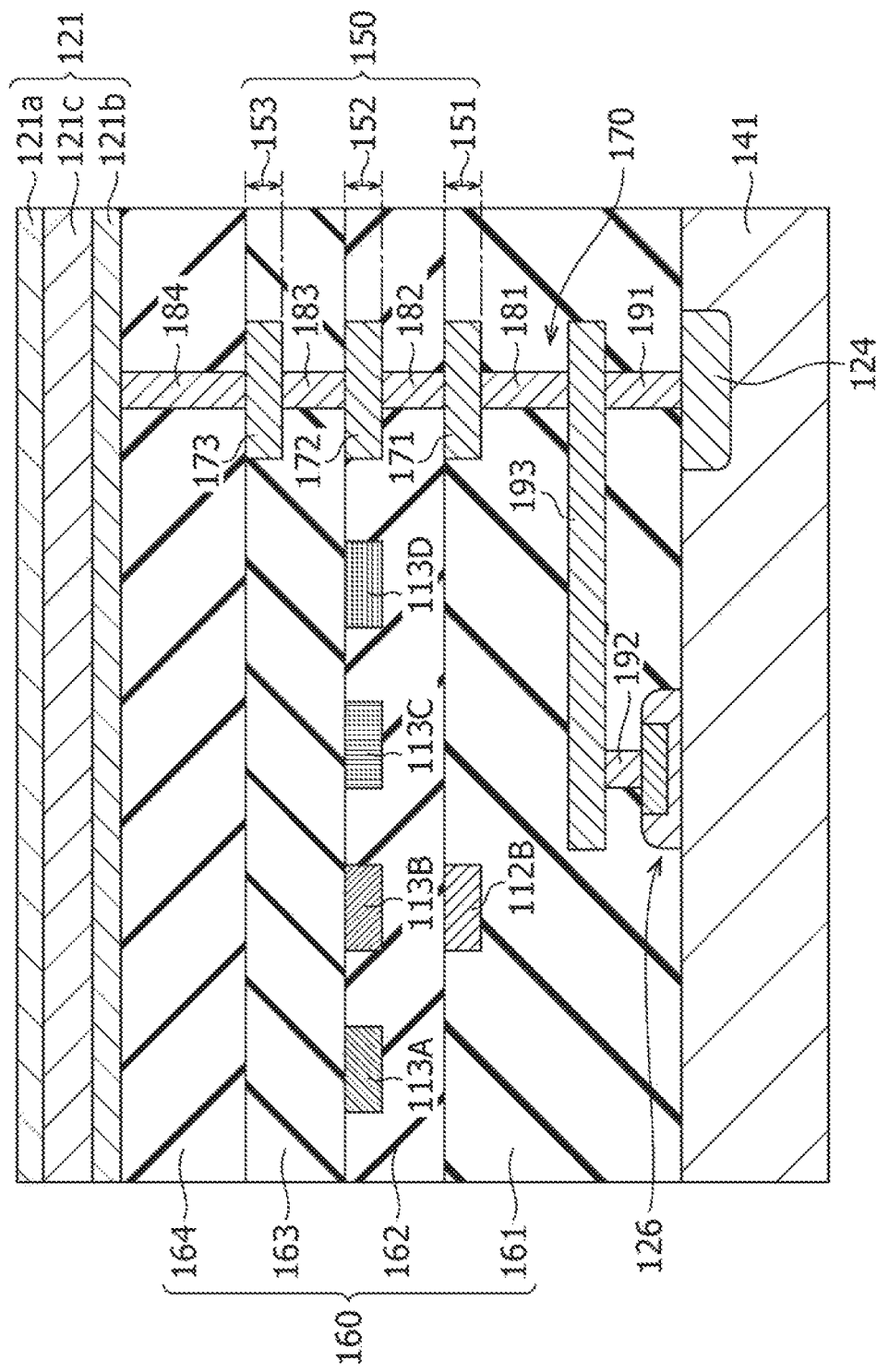
FIG. 44A is a sectional view illustrating an exemplary cross-sectional structure of a power-supply line and signal lines according to a modification of the embodiments.

For example, although examples in which the power-supply line is located on or above the output signal lines have been described in the embodiments above, the present disclosure is not limited thereto. For example, the power-supply line 112B may be located under the output signal lines 113A, 113B, 113C, and 113D, as illustrated in FIG. 44A. Specifically, the power-supply line 112B may be located in the wiring layer 151.

Figure 44B:
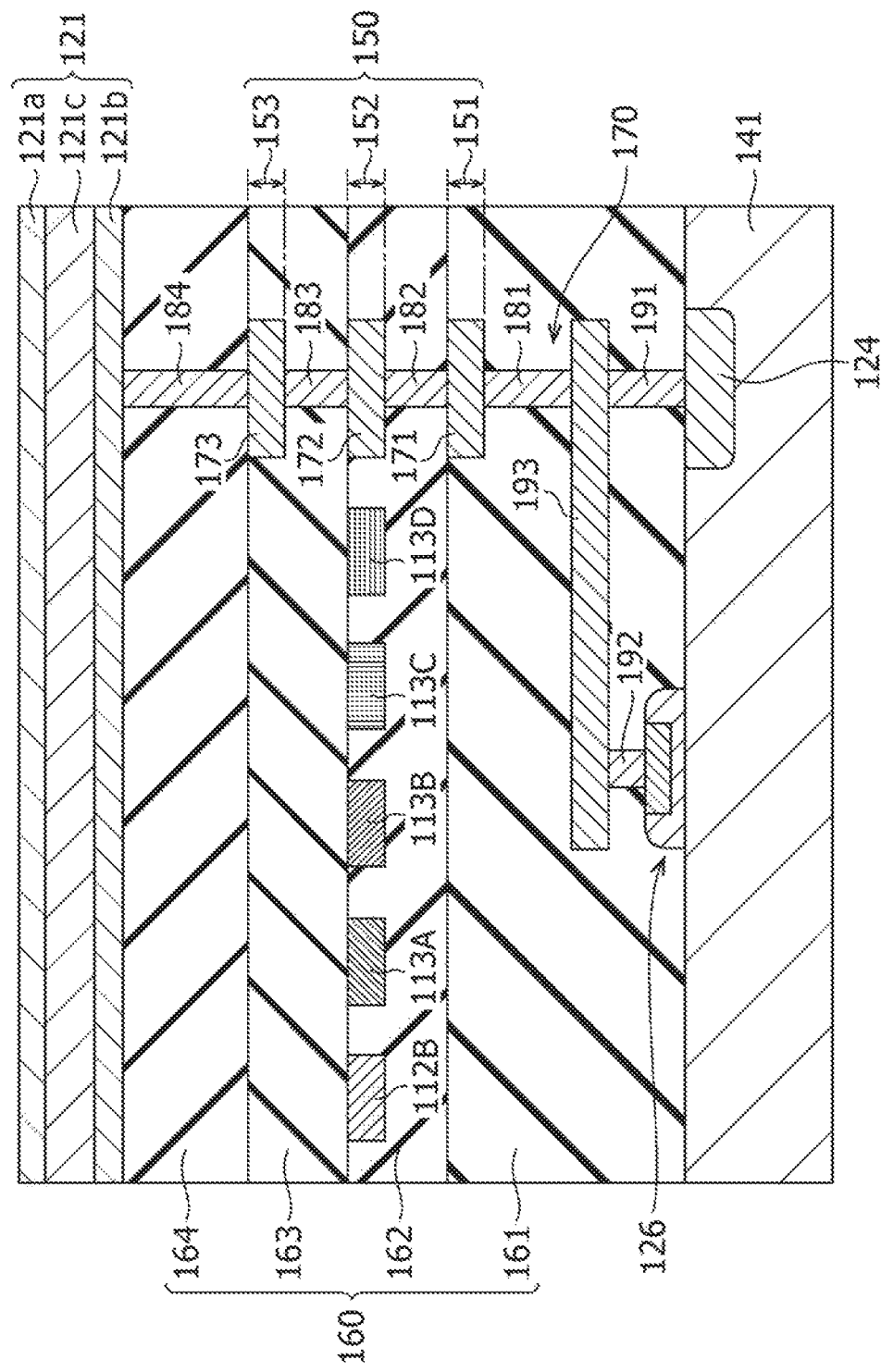
FIG. 44B is a sectional view illustrating an exemplary cross-sectional structure of a power-supply line and signal lines according to a modification of the embodiments.

Alternatively, in a cross-section at a predetermined position in the column direction, the height of the power-supply line from the semiconductor substrate and the height of the output signal lines from the semiconductor substrate may be the same. For example, as illustrated in FIG. 44B, the power-supply line 112B and the output signal lines 113A, 113B, 113C, and 113D may be included in the wiring layer 152. In other words, the power-supply line and the output signal lines may overlap each other when viewed from a direction orthogonal to both the direction in which the power-supply line extends and the direction perpendicular to the semiconductor substrate.

For example, in the example illustrated in FIG. 44B, the power-supply line 112B may extend linearly along the column direction, and the output signal lines 113A, 113B, 113C, and 113D may have a configuration that is the same as or similar to that of the output signal lines 613A, 613B, 6130, and 613D illustrated in FIG. 28B. The output signal lines 113A, 113B, 113C, and 113D may have a configuration that is the same as or similar to that of the output signal lines 713A, 713B, 713C, and 713D illustrated in FIG. 33B.

Also, for example, the number of output signal lines that intersect each other is not limited to two or four. The number of output signal lines that intersect each other may be three or may be five or more. When the power-supply line and the output signal lines are located in the same wiring layer, the power-supply line and the output signal lines may intersect each other.

Also, for example, although a case in which the line width of the power-supply line and the line width of each output signal line are the same has been described in each embodiment, the line widths may differ from each other. For example, the line width of the power-supply line may be larger or smaller than the line width of each output signal line. The line widths of the output signal lines may differ from each other.

Also, the power-supply line and the output signal lines do not necessarily have to overlap each other. For example, in plan view, the power-supply line may also meander between two output signal lines. When power-supply line is traced in the column direction, the power-supply line may alternately repeat approaching and receding from each of the two output signal lines. When the power-supply line and the output signal lines overlap each other, they do not necessarily have to have portions that overlap each other in the column direction. That is, the power-supply line and the output signal lines do not necessarily have to have overlapping portions that extend in the column direction.

For example, although the power-supply line and the signal lines that are provided through four pixels have been described above in each embodiment, the power-supply line and the signal lines have a plan layout structure for four pixels which repeats in the column direction. Although the period of the meander of at least one of the power-supply line and the signal lines is constant, the period of the meander may differ randomly. For example, it is acceptable as long as the area where the power-supply line and one output signal line overlap each other and the area where the power-supply line and another output signal line overlap each other are substantially the same in plan view.

Also, for example, each of the selecting transistor 125, the amplifying transistor 126, the reset transistor 131, and the band control transistor 132 included in the reading circuit 122 may be an N-channel MOSFET or a P-channel MOSFET. All of these transistors do not need to be unified to either N-channel MOSFETs or P-channel MOSFETs. When the transistors in the pixels are implemented by N-channel MOSFETs, and electrons are used as signal charge, the arrangement of the source and the drain of each of the transistors may be interchanged.

For example, the division of the functional blocks in each block diagram is one example, and some of the functional blocks may be realized as one functional block, one of the functional blocks may be divided into a plurality of blocks, or one or more functions may be moved to another functional block.

The processors included in the devices according to the embodiments are typically implemented as large-scale integrated (LSI) circuits. The processors may be individually realized by single chips or some or all of the functional blocks may be realized by a single chip.

The circuit integration is not limited to LSI and may be realized by a dedicated circuit or a general-purpose processor. The present disclosure may also utilize a field programmable gate array (FPGA) that can be programmed after manufacture of an LSI or a reconfigurable processor that allows reconfiguration of connections and settings of circuit cells inside an LSI.

In each embodiment described above, some of the constituent elements may be implemented by executing a software program suitable for the constituent elements. A program executor, such as a central processing unit (CPU) or a processor, may read and execute a software program recorded on/in a storage medium, such as a hard disk or a semiconductor memory, to thereby realize the constituent elements, Various changes, replacements, additions, and omissions can also be made to each of the above-described embodiments within the scope of the present disclosure or a scope equivalent thereto. Although a case in which two or more different voltages are applied to the power-supply line has been described in each embodiment described, one voltage may also be applied to the power-supply line. When one voltage is applied to the power-supply line, for example, there are cases in which external influences may cause noise in the voltage of the power-supply line. In such cases, according to the configuration of the present disclosure, it is possible to substantially equalize influences of noise on the signal lines.

The imaging device according to the present disclosure can be applied to, for example, various sensor systems and camera systems, such as digital still cameras, medical cameras, surveillance cameras, vehicle-mounted cameras, digital single-lens reflex cameras, and digital mirrorless single-lens reflex cameras.

What is claimed is:

1. An imaging device comprising:
    a plurality of pixels arranged in a matrix, the plurality of pixels including a first pixel and a second pixel that are located in a same column;
    a first signal line connected to the first pixel;
    a second signal line connected to the second pixel; and
    a power-supply line connected to at least one of the plurality of pixels, two or more voltages that differ from each other being applied to the power-supply line,
    wherein, when a distance between the power-supply line and the first signal line is denoted by d1 and a distance between the power-supply line and the second signal line is denoted by d2,
        d1<d2 is satisfied in a first cross-section that is orthogonal to a column direction, and
        d1>d2 is satisfied in a second cross-section that is orthogonal to the column direction and that is different from the first cross-section.

2. The imaging device according to claim 1, further comprising:
    a substrate; and
    a first wiring layer, a second wiring layer, and a third wiring layer that are located on the substrate and that are different from each other in distance from the substrate,
    wherein the plurality of pixels is arranged on the substrate in the matrix, and
    in the first cross-section or the second cross-section,
        the power-supply line is located in the first wiring layer,
        the first signal line is located in the second wiring layer or the third wiring layer, and
        the second signal line is located in the second wiring layer or the third wiring layer.

3. The imaging device according to claim 1,
    wherein the power-supply line extends linearly in the column direction; and
    each of the first signal line and the second signal line has a first portion and a second portion that extend in the column direction and a third portion that extends in a direction different from the column direction, the third portion having one end connected to the first portion and another end connected to the second portion.

4. The imaging device according to claim 2,
    wherein the power-supply line extends linearly in the first wiring layer in the column direction; and
    a portion of each of the first signal line and the second signal line is located in the second wiring layer, and another portion of each of the first signal line and the second signal line is located in the third wiring layer.

5. The imaging device according to claim 1,
    wherein the plurality of pixels includes a third pixel and a fourth pixel that are located in the same column as the column of the first pixel and the second pixel;
    the imaging device includes
        a third signal line connected to the third pixel, and
        a fourth signal line connected to the fourth pixel;
    the power-supply line extends linearly in the column direction; and
    each of the first signal line, the second signal line, the third signal line, and the fourth signal line has a first portion and a second portion that extend in the column direction and a third portion that extends in a direction different from the column direction, the third portion having one end connected to the first portion and another end connected to the second portion.

6. The imaging device according to claim 2,
    wherein the plurality of pixels includes a third pixel and a fourth pixel that are located in the same column as the column of the first pixel and the second pixel;
    the imaging device includes
        a third signal line connected to the third pixel, and
        a fourth signal line connected to the fourth pixel;
    the power-supply line extends linearly in the first wiring layer in the column direction; and
    a portion of each of the first signal line, the second signal line, the third signal line, and the fourth signal line is located in the second wiring layer, and another portion of each of the first signal line, the second signal line, the third signal line, and the fourth signal line is located in the third wiring layer.

7. The imaging device according to claim 1,
    wherein each of the power-supply line, the first signal line, and the second signal line has a first portion and a second portion that extend in the column direction and a third portion that extends in a direction different from the column direction, the third portion having one end connected to the first portion and another end connected to the second portion.

8. The imaging device according to claim 1,
    wherein the power-supply line has a first portion and a second portion that extend in the column direction and a third portion that extends in a direction different from the column direction, the third portion having one end connected to the first portion and another end connected to the second portion; and
    each of the first signal line and the second signal line extends linearly in the column direction.

9. The imaging device according to claim 2,
    wherein the power-supply line extends linearly in the first wiring layer in the column direction; and
    each of the first signal line and the second signal line is located in the second wiring layer and meanders along the column direction.

10. The imaging device according to claim 1,
    wherein at least one of the power-supply line, the first signal line, and the second signal line has a plurality of portions each including a first portion, a second portion, and a third portion, and
    in each of the plurality of portions, the first and second portions extend in the column direction, the third portion extends in a direction different from the column direction, and the third portion has one end connected to the first portion and another end connected to the second portion.

11. The imaging device according to claim 3,
wherein an angle formed by the first portion and the third portion is a right angle or an obtuse angle; and
an angle formed by the second portion and the third portion is a right angle or an obtuse angle.

12. The imaging device according to claim 1,
wherein the power-supply line overlaps the first signal line and the second signal line in plan view.

13. The imaging device according to claim 1,
wherein each of the first pixel and the second pixel includes
a photoelectric converter that converts light into charge, and
a transistor having a gate connected to the photoelectric converter;
the first signal line is connected to a source or a drain of the transistor in the first pixel; and
the second signal line is connected to a source or a drain of the transistor in the second pixel.

14. The imaging device according to claim 1, further comprising:
a power supply circuit that applies the two or more voltages to the power-supply line, a power-source switching circuit that switches between the two or more voltages, and a plurality of input terminals to which the two or more voltages are input.

15. An imaging device comprising:
a substrate;
a plurality of wiring layers located on the substrate, distances from the substrate to the wiring layers being different from each other;
a plurality of pixels arranged on the substrate in a matrix, the plurality of pixels including a first pixel and a second pixel that are located in a same column;
a first signal line connected to the first pixel;
a second signal line connected to the second pixel; and
a power-supply line connected to at least one of the plurality of pixels,
wherein, when a distance between the power-supply line and the first signal line is denoted by d1, and a distance between the power-supply line and the second signal line is denoted by d2,
d1<d2 is satisfied in a first cross-section that is orthogonal to a column direction, and
d1>d2 is satisfied in a second cross-section that is orthogonal to the column direction and that is different from the first cross-section; and
in the first cross-section or the second cross-section, the wiring layer in which the power-supply line is located differs from any of the wiring layer in which the first signal line is located and the wiring layer in which the second signal line is located.

* * * * *